(12) United States Patent
Yoneda

(10) Patent No.: US 7,250,631 B2
(45) Date of Patent: Jul. 31, 2007

(54) SEMICONDUCTOR LASER HAVING PROTRUDING PORTION

(75) Inventor: Akinori Yoneda, Anan (JP)

(73) Assignee: Nichia Corporation, Tokushima (JP)

( * ) Notice: Subject to any disclaimer, the term of this patent is extended or adjusted under 35 U.S.C. 154(b) by 48 days.

(21) Appl. No.: 10/962,996

(22) Filed: Oct. 13, 2004

(65) Prior Publication Data

US 2005/0190416 A1  Sep. 1, 2005

(30) Foreign Application Priority Data

Oct. 14, 2003  (JP)  ............ P 2003-354220
Oct. 13, 2004  (JP)  ............ P 2004-299092

(51) Int. Cl.
*H01L 29/26*  (2006.01)
*H01L 29/22*  (2006.01)

(52) U.S. Cl. ............ 257/79; 257/94; 257/99; 257/103

(58) Field of Classification Search ............ 257/79, 257/82, 94, 99, 103
See application file for complete search history.

(56) References Cited

U.S. PATENT DOCUMENTS 6,583,510 B2 *  6/2003  Hanamaki et al. ......... 257/775
6,683,324 B2 *  1/2004  Hayakawa ............... 257/79
6,707,071 B2 *  3/2004  Hashimoto et al. ........ 257/94

FOREIGN PATENT DOCUMENTS

JP  2001-332796  11/2001

\* cited by examiner

*Primary Examiner*—Hung Vu
(74) *Attorney, Agent, or Firm*—Hunton & Williams LLP

(57) ABSTRACT

A semiconductor laser device including: semiconductor layers including an n-type semiconductor layer, an active layer and a p-type semiconductor layer, the semiconductor layers having a stripe-shaped waveguide region formed therein; end face protective film formed on the end face of the semiconductor layer that is substantially perpendicular to the waveguide region; wherein a p-side protruding portion is formed in the vicinity of the end portion of a p-electrode or n-electrode.

4 Claims, 54 Drawing Sheets

SEMICONDUCTOR LASER HAVING PROTRUDING PORTION

BACKGROUND OF THE INVENTION

1. Field of the Invention

The present invention relates to a semiconductor laser device and method of manufacturing the same, and particularly to a semiconductor laser device of high reliability and high output power obtained by improving a process of etching a semiconductor layer made of nitride semiconductor, and method of manufacturing the same, Specific composition of the nitride semiconductor element may be, for example, GaN, AlN, InN, AlGaN that is a mixture of the former, InGaN, AlInGaN and other semiconductors based on nitride of III-V group elements.

2. Description of the Related Art

Nitride semiconductor is capable of emitting light in a wide spectrum from ultraviolet region of relatively short wavelength to visible region including red, and is widely used as the material to manufacture semiconductor laser diodes (LD) and light emitting diodes (LED). Semiconductor laser devices made of nitride semiconductor, in particular, have been improved in compactness, long service life, reliability and output power, so as to be used as the light source for personal computers, electronic apparatuses such as DVD, medical equipment, industrial process machinery and optical communications.

The semiconductor laser device made of nitride semiconductor has such a constitution as an n-type contact layer, a crack preventive layer, n-type cladding layer, an n-type optical guide layer, an active layer, a p-type electron confinement layer, a p-type optical guide layer, a p-type cladding layer, a p-type contact layer and the like stacked one on another on a substrate usually made of sapphire (stacked structure). A stripe-shaped waveguide region is formed by forming a stripe-shaped ridge by etching or forming a current pinching layer. Resonator surfaces are formed on both sides of the waveguide region. Laser beam can be emitted by reflecting the light emitted in the active layer and causing resonation thereof (refer to, for example, to Japanese Unexamined Patent Publication (Kokai) No. 2001-332796). The portion that has the function to confine light and/or electrons in a striped configuration such as the ridge and current pinching layer and the resonator surface that contributes to stimulated emission have direct influence on the characteristics of the laser device. Therefore these portions require processing with extremely precise control.

In the process of manufacturing the semiconductor laser device, in addition to the processing of the stacked structure as described above, functional films such as electrodes and protective films are provided at predetermined positions. These functional films must be formed with the position and thickness being carefully controlled, so as to make the semiconductor laser of high output power with a satisfactory yield. An end face protective film formed on the end face from which laser beam emerges, in particular, must have high quality since the increasing output power imposes stricter demand on the end face. An end face protective film having uniform quality can be made, for example, by forming the protective film on the end face after processing the semiconductor layer in bar shape (laser bar), instead of forming the protective film before dividing the wafer.

In case the end face protective film is formed in the state of laser bar, however, if the component of the end face protective film spreads to the top surface and bottom surface of the laser bar when forming the film, the end face protective film (insulating film) is deposited also on metal layers such as electrode, resulting in an adverse effect on the operation of the device. For this reason, it is necessary to prevent the component of the end face protective film from spreading to the top surface and bottom surface of the laser bar so as to avoid the adverse effect on the operation of the device. The end face protective film may be prevented from spreading to undesirable portions by, for example, using a tray having a groove formed thereon and placing the laser bar in the groove. The laser bar is made to a length that corresponds to the length of a resonator, which is substantially constant. Therefore, it may be hoped that the end face protective film can be formed on the laser bar in satisfactorily controlled manner by forming the groove of a specified shape in advance. In order to provide a semiconductor laser device having excellent characteristics, it is important to carry out the processing of the stacked structure as well as the formation of the functional films on the stacked structure in satisfactorily controlled manner.

SUMMARY OF THE INVENTION

In practice, however, it is rather difficult to maintain a constant clearance between the side wall of the groove and the laser bar when placing the laser bar on the tray that has the groove formed therein in advance. There may occur such cases as the laser bar comes into contact with one of the side walls or the distance between the side wall of the groove and the laser bar becomes unstable. Such troubles occur as the groove is formed with a width larger than the width of the semiconductor laser bar. As a result, the position where the end face protective film is formed becomes unstable, thus occasionally resulting in the formation of the insulating film over a wide area of the top surface of the electrode. When the insulating film is formed over the top surface of the electrode, such troubles occur as contact failure during wire bonding. When the groove is formed with a width equal to the width of the laser bar so as to eliminate the clearance, on the other hand, the laser bar cannot be disposed in the groove. In the case of the semiconductor laser device of ridge waveguide type, in particular, smaller clearance between the laser bar and the groove results in such a trouble as the laser bar hits the side wall of the groove when being disposed in the groove, leading to breakage of the ridge and/or other problem. The ridge is also not yet formed with sufficient microscopic etching technology. In order to improve the manufacture of the laser, it is not sufficient to improve the laser characteristic but it is necessary to take mass productivity into consideration. Accordingly, it is an object of the present invention to solve the problems described above and achieve a semiconductor laser device having high reliability even during operation at a high output power.

The semiconductor laser device of the present invention has protruding portion in the vicinity of the end portion of the p electrode and/or the n electrode of the semiconductor laser device that has the p electrode and the n electrode formed on different sides or on a same side thereof. In this specification, a protruding portion formed on the p-type semiconductor layer at an end of the p electrode or in the vicinity of the end face of the p-type semiconductor layer will be called the p-side protruding portion, and a protruding portion formed on the n-type semiconductor layer at an end of the n electrode or in the vicinity of the end face of the n-type semiconductor layer will be called the n-side protruding portion.

Forming the p-side and n-side protruding portions solves at least one of the problems described above depending on the configuration and manufacturing method of the semiconductor laser.

By forming the p-side and n-side protruding portion, for example, it is made possible to suppress the deposition of the end face protective film made of an insulating material or the like on the electrodes. That is, the protruding portion functions as a shield when forming the end face protective film so as to reduce the possibility of a bonding wire coming off and provide the semiconductor laser device of higher reliability.

In order to achieve such a shielding effect, it is desirable to form the p-side and n-side protruding portion before forming the end face protective film. The p-side and n-side protruding portion may be formed in any stage as long as it is before forming the end face protective film. In case the protruding portion is formed from a member that includes a part of the stacked semiconductor layer, for example, the protruding portion can be formed easily without providing an additional process by forming the protruding portion at the same time as the ridge is formed or a mesa is formed. If simultaneous forming leads to a problem such as the shape becoming unstable, the process may be separated. Thus the protruding portion may be either formed by leaving the semiconductor layer in the shape of the protruding portion when forming the ridge or the mesa, or causing the material of a protective film or an electrode to be deposited on the semiconductor layer of protruding shape as the protective film or the electrode are formed. In other words, the protruding portion may be made of a composite material formed by stacking the insulating material and/or the electrically conductive material on the semiconductor layer. The protruding portion may be made of an electrically conductive material which does not affect the characteristic since it is not connected with means of electrical conductor such as wire.

In the case of a semiconductor laser having a ridge, height difference between the ridge and the surrounding portion can be reduced by means of the p-side protruding portion, and therefore stable packaging can be achieved during junction down mounting. In case the p electrode and the n electrode are formed on the same side and there is a difference in height between the p electrode and the n electrode, the height difference can be reduced by means of the n-side protruding portion, and therefore stable packaging can be achieved during junction down mounting.

The process of a portion such as the ridge or the resonator surface that significantly affects the laser characteristic can also be taken into consideration when forming the protruding portion. For example, it is preferable to form the p-side or n-side protruding portion in such a method and form as the accuracy of forming the ridge can be improved. It is also preferable to form the p-side or n-side protruding portion in such a method and form as the flatness of the resonator surface can be improved. This enables it to achieve better device characteristic. When forming the ridge over the mesa while a plurality of elements are disposed on a wafer, the ridge is formed so that the end of the ridge that is difficult to control the width is located outside of the element and the end of the ridge becomes the protruding portion of the adjacent element. Since the end of ridge that has unstable width is cut off when separating the element, the ridge width can be stabilized and good element characteristic can be obtained. The end portion of the ridge that has been cut off when separating the elements becomes the protruding portion of the element that was located adjacent thereto before dividing the wafer.

The semiconductor laser device according to one aspect of the present invention comprises semiconductor layers consisting of an n-type semiconductor layer, an active layer and a p-type semiconductor layer, a stripe-shaped waveguide region formed in the semiconductor layer, an end face protective film formed on an end face of the semiconductor layer substantially perpendicular to the waveguide region, and a p electrode formed on the p-type semiconductor layer, wherein the p electrode is formed at least on the waveguide region, and wherein the p-side protruding portion is formed in the vicinity of the end portion of the p electrode, the p-side protruding portion being higher than the central portion of the p electrode.

With the constitution described above, since the surface of the p-side protruding portion is located higher than the surface of the central portion of the p electrode (which becomes the uppermost layer), troubles such as breakage of the current flowing region can be avoided during junction down mounting, thus providing a semiconductor laser device having high reliability.

A nitride semiconductor laser that has a waveguide formed by forming a ridge in the p-type semiconductor layer preferably has such a constitution as described below.

The semiconductor laser device comprises semiconductor layers that consist of an n-type semiconductor layer, an active layer and a p-type semiconductor layer, a stripe-shaped waveguide region made by forming a ridge in the p-type semiconductor layer, an end face protective film formed on an end face of the semiconductor layer substantially perpendicular to the waveguide region, and a p electrode formed on the p-type semiconductor layer, wherein the p electrode is formed at least on the waveguide region, and wherein the p-side protruding portion is formed from the p-type semiconductor layer in the vicinity of the end portion of the p electrode, and height of the p-side protruding portion is substantially the same as height of the ridge.

Forming the p-side protruding portion in such a constitution as described above enables it to form the p-side protruding portion and the ridge at the same time. In the case of junction down mounting, there is also such an effect that stable mounting can be achieved. In addition, spreading of the component of the end face protective film onto the p electrode can be suppressed when forming the end face protective film. In order to suppress the spreading of the component of the end face protective film onto the p electrode, it is desirable to deposit a protective film and electrode further on the p-side protruding portion that has been formed from the p-type semiconductor layer, so that the final height of the p-side protruding portion becomes higher than the central region of the p electrode. In case the end portion of the p electrode is located at a large distance from one of the end face of the p-type semiconductor layer (for example, 20 µm or larger), the p-side protruding portion may be formed in the vicinity of the end face of the p-type semiconductor layer.

The semiconductor laser device according to another aspect of the present invention comprises semiconductor layers consisting of an n-type semiconductor layer, an active layer and a p-type semiconductor layer, wherein a mesa is formed so as to protrude in stripe shape from the n-type semiconductor layer by shaping the active layer and the p-type semiconductor layer to be narrower than the n-type semiconductor layer, a stripe-shaped waveguide region formed in the mesa of the semiconductor layer, an end face protective film formed on an end face of the semiconductor layer substantially perpendicular to the waveguide region, and an n electrode formed on the n-type semiconductor layer that is exposed on the side of the mesa, wherein a n-side protruding portion is formed in the vicinity of the end portion of the n electrode and height of the n-side protruding portion is higher than the central region of the n electrode.

In case the p electrode and the n electrode are formed on the same side, the n electrode is formed at a lower position than the p electrode due to the height difference corresponding to the height of the mesa. As a result, the end face protective film is likely to deposit on the n electrode when forming the end face protective film. By forming the n-side protruding portion in the vicinity of the end face of the n electrode so as to be higher than the n electrode, deposition of the end face protective film can be suppressed. In case the end portion of the n electrode is located at a large distance from one of the end face of the n-type semiconductor layer (for example, 20 μm or larger), the n-side protruding portion may be formed in the vicinity of the end face of the n-type semiconductor layer.

It is preferable that the n-side protruding portion is made of the semiconductor layer and the height of the n-side protruding portion is substantially the same as height of the mesa. This enables it to form the n-side protruding portion and the mesa at the same time. In the case of junction down mounting in which the substrate faces upward, there is also such an effect that stable mounting can be achieved. In addition, spreading of the component of the end face protective film onto the n electrode can be suppressed more effectively when forming the end face protective film.

A semiconductor laser device according to further aspect of the present invention has a p-side protruding portion that is higher than the central region of the p electrode being formed also in the vicinity of the p electrode in addition to the n-side protruding portion. Forming the protruding portions on both the n side and p side not only prevents resistance from increasing but also reduces mounting defects during junction down mounting.

A method of manufacturing the semiconductor laser device according to one aspect of the present invention comprises the steps of forming the stripe-shaped waveguide region and an end face that is substantially perpendicular to the waveguide region on the semiconductor layer consisting of the n-type semiconductor layer, the active layer and the p-type semiconductor layer; forming the p electrode on the p-type semiconductor layer; separating the semiconductor layer into bar-shaped laser elements; and forming the end face protective film on the end face of the bar-shaped laser element, wherein the p-side protruding portion is formed in the vicinity of the end face of the p electrode so as to be higher than the central region of the p electrode, before forming the end face protective film on the end face of the bar-shaped laser element.

A method of manufacturing the semiconductor laser device according to another aspect of the present invention comprises the steps of forming the semiconductor layer consisting of the n-type semiconductor layer, the active layer and the p-type semiconductor layer; forming a mesa by removing part of the p-type semiconductor layer and the active layer by etching on the p-type semiconductor layer till at least a part of the n-type semiconductor layer is exposed; forming the stripe-shaped waveguide region in the mesa; forming the n electrode on the exposed surface of the n-type semiconductor layer adjacent to the mesa; separating the semiconductor layer into bar-shaped laser elements; and forming the end face protective film on the end face of the bar-shaped laser element, wherein the n-side protruding portion is formed in the vicinity of the end face of the n electrode so as to be higher than the central region of the n electrode, before forming the end face protective film on the end face of the bar-shaped laser element.

The n-side protruding portion is preferably formed so as to be substantially the same as the mesa in height.

In case the p electrode and the n electrode are formed on the same side, the n-type semiconductor layer (the n-type contact layer) is exposed by etching on the p-type semiconductor layer, and the n electrode is formed on the exposed surface. The p electrode is formed on the p-type semiconductor layer of the mesa that is left adjacent to the exposed surface of the n-type semiconductor layer. As a result, the p electrode and the n electrode have surfaces of different heights on the wafer, thus causing a step between the surfaces of the electrodes. When the wafer is separated, in a direction perpendicular to the electrodes having such a height difference, into bar-shaped laser elements, the laser bar 2 having uneven end face is obtained as shown in FIG. 21B. The mesa has an end face that includes the resonator surface of the laser element. The end face protective film is formed on the end face of the mesa for the purpose of adjusting the reflectivity of the laser resonator surface, protecting the laser resonator surface from the environment or other purpose. When the end face protective film is formed on the uneven end face of the bar-shaped laser element, while the laser bar 2 is held by a fixture (spacer) D so that the end face of the laser bar 2 opposes a sputtering source as shown in FIG. 21A and FIG. 21B. However, the exposed surface of the n-type semiconductor layer that is adjacent to the mesa tends to be positioned away from the spacer D as shown in FIG. 21B. As a result, such a space is formed in the vicinity of the exposed surface of the n-type semiconductor layer that the end face protective film is likely to infiltrate. Such a space can be restricted by forming an n-side protruding portion A as shown in FIG. 22. That is, the space can be shaded by forming the n-side protruding portion higher than at least the n electrode on the end face of the bar that is the uppermost layer during the formation of the end face protective film. The n electrode is placed behind the n-side protruding portion when forming the end face protective film, thereby suppressing the deposition of the end face protective film on top of the n electrode. As a result, current supply to the n electrode is less likely to be hindered by the end face protective film, so that satisfactory laser characteristic is obtained.

In addition, undesirable spreading of the end face protective film can be prevented more effectively by making the n-side protruding portion higher to have substantially the same height with the mesa. In this case, the n-side protruding portion preferably includes the same semiconductor as the mesa and is formed at the same time as the mesa is formed by etching. The n-side protruding portion can be made easily, simply by adjusting the mask pattern used for the etching operation for exposing the n electrode forming surface by etching. The n-side protruding portion thus formed has less positional deviation than in the case of adjusting the clearance by means of a spacer or the like, and does not obstruct the formation of the end face protective film (multi-layer dielectric film such as reflector film, transmission film, etc.) on the resonator surface. Moreover, since the surface of the n electrode is shielded at a position nearer to the n electrode, undesirable spreading can be prevented.

The n-side protruding portion that has at least the same semiconductor layer as the mesa may also be formed in a process separately from the mesa forming process. This enables it to freely set the amount of etching (etching depth) for forming the n-side protruding portion. That is, when the n-side protruding portion is formed at the same time the mesa is etched, etching reaches substantially the same plane as the mesa, while the shape of the n-side protruding portion can be freely selected when it is formed in a different process to the mesa forming process.

In case a stripe-shaped ridge is formed on the mesa, the n-side protruding portion preferably reaches substantially the same height as that of the ridge. With this constitution, deposition of the component of the end face protective film onto the n electrode can be suppressed more efficiently.

It is also preferable that at least one of the end faces of the mesa is formed by cleaving and the end face is used as the resonator surface. The mesa has a waveguide region formed therein and the resonator surface is formed on the end face thereof. After forming the electrode, the wafer is separates into bars by cleaving, thereby forming the cleaved end face of the mesa. When the end faces of the mesa is formed by cleaving, the end face can be turned into a resonator surface of high flatness.

Alternatively, at least one of the end faces of the mesa may be formed by etching so as to use the end face as the resonator surface. The n electrode forming surface and the resonator surface can be formed at the same time by etching and exposing the n electrode forming surface of the n-type semiconductor layer in such a manner that the surface of the n-type semiconductor layer that is perpendicular to the stripe-shaped waveguide region is also exposed. Forming the resonator surface by etching as described above allows for higher productivity since it is not necessary to take the cleaving property of the substrate into consideration.

The end face parallel to the resonator surface of the p-side or n-side protruding portion may be formed either by cleaving or by etching. For example, similarly to the end face of the mesa that can be formed by either cleaving or etching, the n-side protruding portion that is formed in the n-type semiconductor layer adjacent to the mesa can also be cleaved or etched. Both of the mesa and the protruding portion may be formed by cleaving or etching, or one of these portions may be formed by cleaving while the other is formed by etching.

The stripe-shaped ridge may be formed either by etching on the mesa after the mesa has been formed, or the mesa may be formed by etching after forming the stripe-shaped ridge.

When the lateral surfaces of the semiconductor layer is referred to in this specification, the surface parallel to the electrode, the waveguide, a current injecting region or the like that is formed in substantially stripe shape will be called the side face and the surface perpendicular to the stripe will be called the end face. The phrase "substantially stripe-shaped" means such shapes that include those having protrusion or recess formed in part thereof or regions of different widths formed therein. In other words, "substantially stripe-shaped" is a shape that extends from one end to the other end. Such a case where the feature does not reach the end face is also included in "substantially stripe-shaped".

When an ohmic electrode that is formed in direct contact with the semiconductor and a pad electrode for drawing current are formed separately, the p electrode and the n electrode refer to both electrodes. That is, the entire member used in injecting current into the semiconductor layer is called the electrode. When the pad electrode is formed to cover the entire ohmic electrode, for example, deposition of the component of the end face protective film on the surface of the pad electrode is suppressed. When the pad electrode is formed so as to expose a part of the ohmic electrode, it is preferable to suppress the deposition on the surface of the ohmic electrode, too.

Phrases such as "in the vicinity of the p electrode", "in the vicinity of the n electrode", "in the vicinity of the p-type semiconductor layer" or "in the vicinity of the n-type semiconductor layer" in this specification refers to a location at a small distance from the end face which is preferably 20 µm or less.

The semiconductor laser device of the present invention achieves various effects depending on the constitution and manufacturing method of the laser element, by providing the p-side protruding portion and/or the n-side protruding portion in the vicinity of the end face of the p electrode and/or n electrode. For example, electrical conductivity and reliability can be prevented from decreasing due to deposition of the component of the end face protective film that spreads onto the electrode, when forming the end face protective film. When packaging the substrate facing upward in junction down mounting, more stable placing on the mounting surface can be achieved. Moreover, breakage of the current flowing portion can be suppressed since external force applied to the current flowing portion including the electrode during mounting can be absorbed by the p-side or n-side protruding portion.

DESCRIPTION OF THE PREFERRED EMBODIMENTS

Now preferred embodiments of the present invention will be described below. The semiconductor laser device of the present invention is not limited to the element structure and electrode material shown in the embodiments. The protruding portion may have various forms as will be described later. In addition to suppressing the deposition of the component of the end face protective film on the electrode, characteristics of portions that have influence on the element characteristic such as resonator surface and the ridge can also be improved depending on the form.

Embodiment 1

Figure 1A:
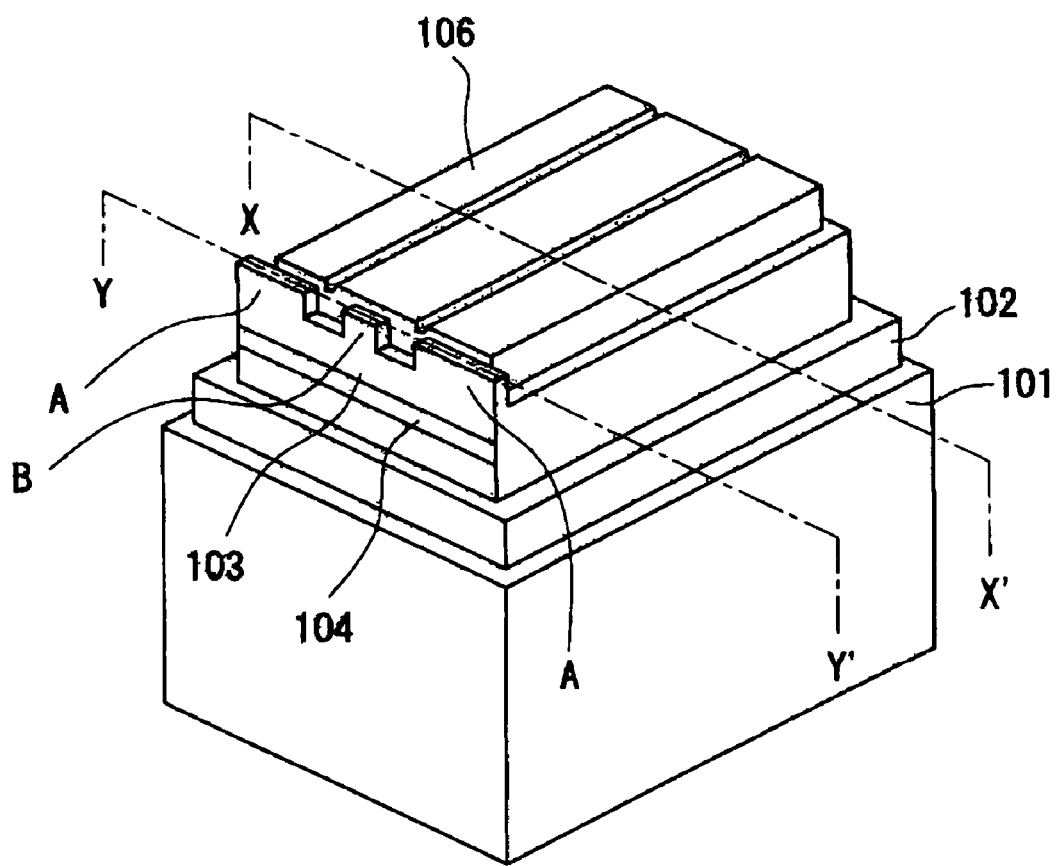
FIG. 1A is a schematic perspective view of a semiconductor laser device according to a first embodiment of the present invention.
Figure 1B:
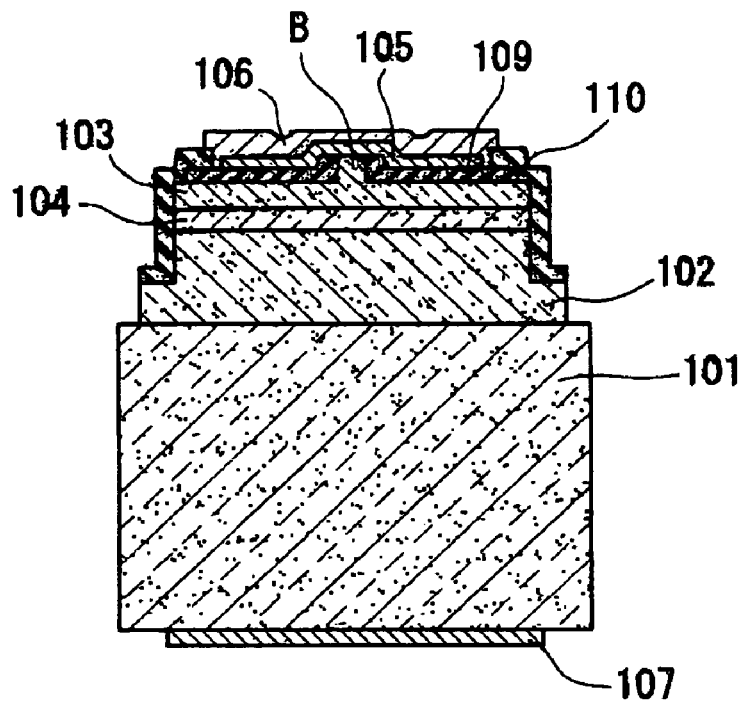
FIG. 1B is a sectional view taken along lines XX' in FIG. 1A.
Figure 1C:
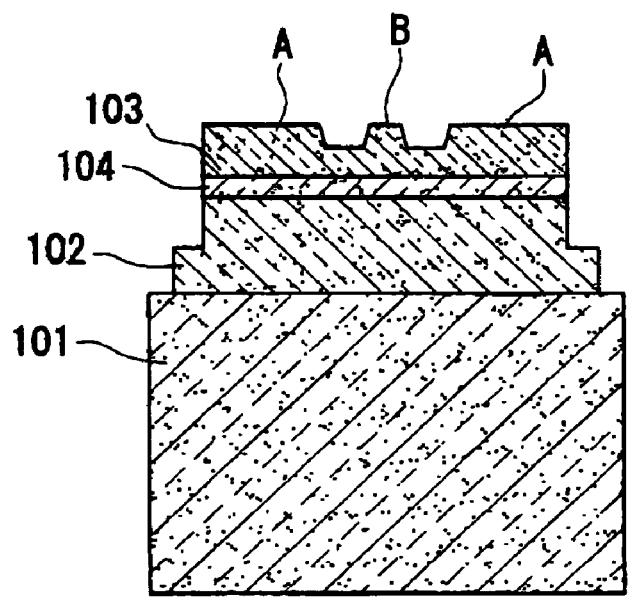
FIG. 1C is a sectional view taken along lines YY' in FIG. 1A.

An example of forming a p-side protruding portion on a p-type semiconductor layer in this embodiment will be described. FIG. 1A is a schematic view showing the semiconductor laser device of this embodiment. FIG. 1B is a sectional view taken along lines XX' in FIG. 1A. FIG. 1C is a sectional view taken along lines YY' in FIG. 1A. The semiconductor laser device has an n-type semiconductor layer 102, an active layer 104 and a p-type semiconductor layer 103 stacked on a substrate 101, with a ridge B having stripe shape formed by etching a part of the p-type semiconductor layer. A first insulating film 109 is formed to extend from the side face of the ridge B onto the surface of the p-type semiconductor layer 103 on both sides of the ridge. A p-side ohmic electrode 105 is formed to extend from the surface of the ridge B onto the first insulating film 109. A p-side pad electrode 106 is formed on the p-side ohmic electrode 105. Portions of the surfaces of the p electrodes 105 and 106 are exposed so as to be capable of making direct contact with wire, electrically conductive adhesive, etc. A second insulating film 110 is formed on the side face of the element. In case the substrate 101 is electrically conductive, an n electrode 107 can be formed on the back surface (the surface opposite to the surface where the semiconductor layer is stacked) of the substrate 101 as shown in FIG. 1B.

Since the ridge B is formed and the p electrodes 105 and 106 make contact only with the top surface of the ridge B as described above, current is injected into a striped region that corresponds to the ridge thereby forming a waveguide region. A dielectric protective film (not shown) is formed on a resonator surface that is an end face of the waveguide region, so as to control the reflectivity and transmissivity, as well as to protect the end face from the environment. Height of the ridge B is preferably in a range from 0.2 to 3.0 μm, more preferably from 0.2 to 1.0 μm, and most preferably from 0.3 to 0.6 μm.

Figure 1D:
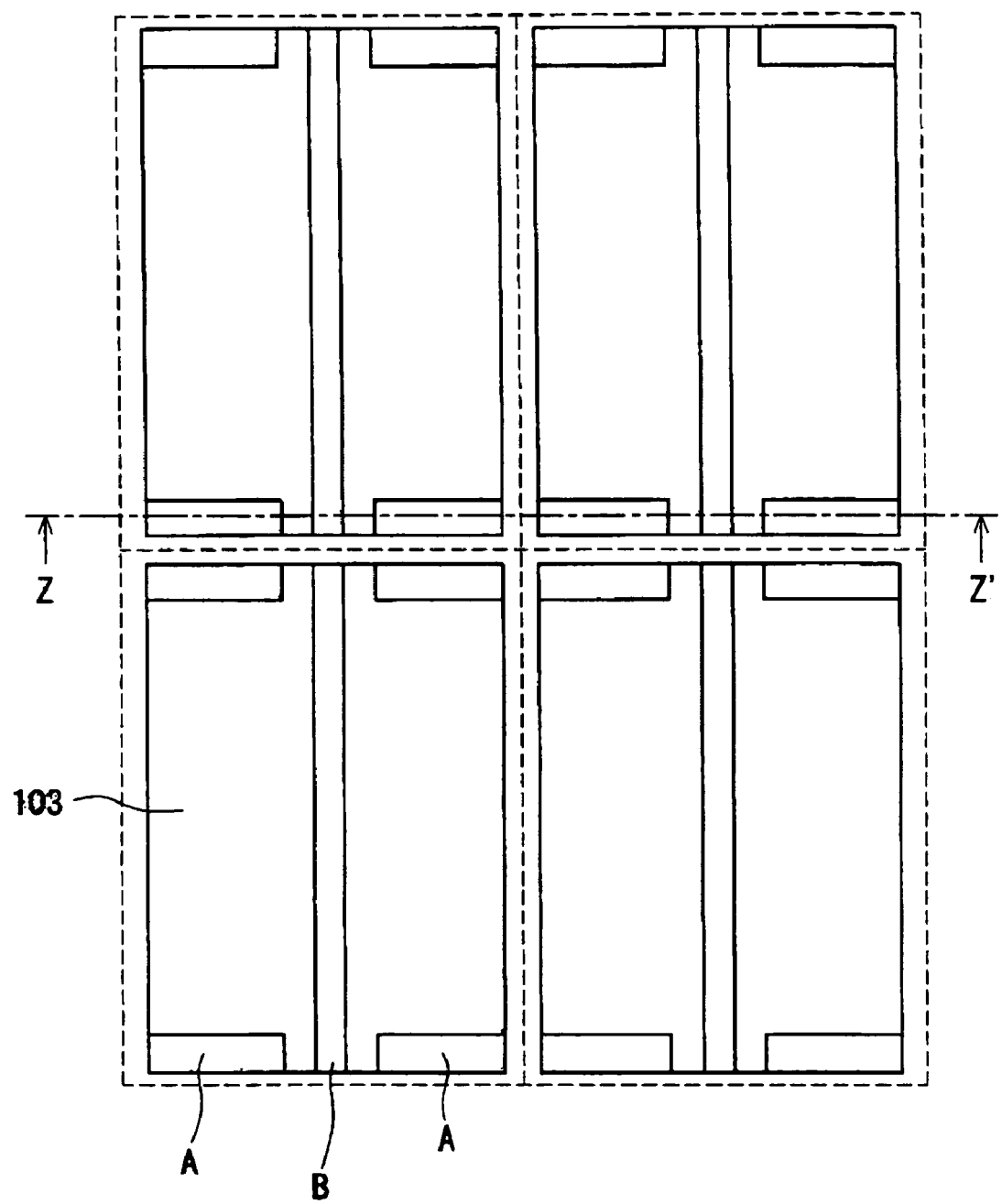
FIG. 1D is a schematic view explanatory of a method of manufacturing the device shown in FIG. 1A.

In this embodiment, a p-side protruding portion A is formed in the vicinity of the end of the p electrodes 105 and 106. The p-side protruding portion A of this embodiment can be formed simultaneously with the ridge B. The p-side protruding portion A can be formed simultaneously with the ridge by adjusting a mask pattern used in forming the ridge B so that the p-type semiconductor layer of substantially the same height as the ridge remains at a position apart from the ridge B in the vicinity of the end of the semiconductor layer in the state of being formed as a chip as shown in FIG. 1D. In case the p-side protruding portion A and the p-type semiconductor layer 103 are made of the same semiconductor material as in this embodiment, it is preferably formed apart from the ridge B. Since refractive index of light is controlled by the width of the ridge B and so as to regulate the confinement of light in the longitudinal and lateral directions in the waveguide region, forming the ridge B and the p-side protruding portion A too close to each other may cause local unevenness in the light confinement. Therefore, it is preferable to form the p-side protruding portion A apart from the ridge B to such an extent as the optical property of the waveguide region will not be affected. While FIG. 1D shows an example of forming p-side protruding portions A at four corners of the chip, the p-side protruding portions A may be formed only on both sides of the ridge at the end face where light emerges.

Figure 1E:
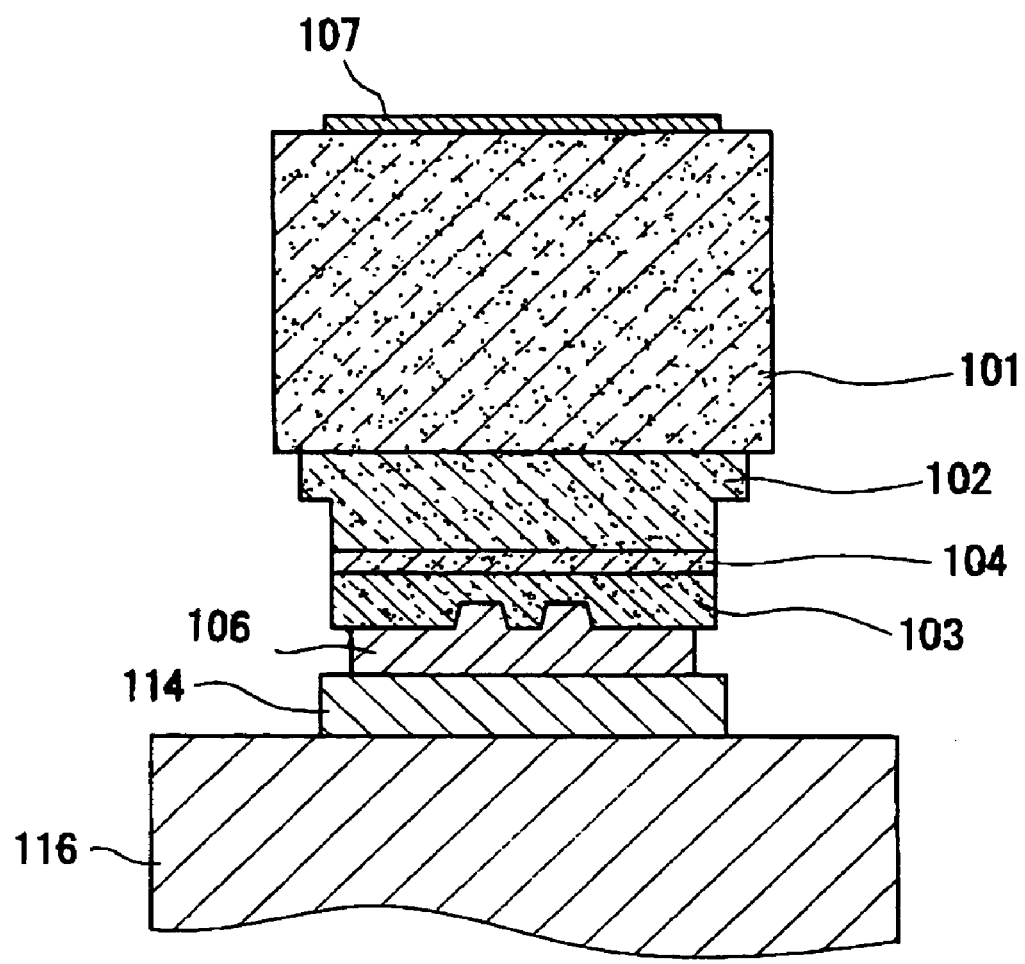
FIG. 1E is a sectional view showing a case where the device shown in FIG. 1A is mounted by junction down mounting.

By forming the p-side protruding portion A separately from the ridge B in the end region of the p electrodes 105 and 106 as described above, deposition of the end face protective film made of an insulating material on the p electrodes 105 and 106 can be suppressed when forming the end face protective film on the laser bar. Also, when packaging the substrate facing upward in junction down mounting, stable mounting can be achieved. In junction down mounting as shown in FIG. 1E, the laser element is mounted on a sub-mount 116 so that the substrate 101 faces upward. Then the pad electrode 106 of the laser element and the sub-mount 116 are bonded together with a bonding agent such as Au—Sn eutectic layer 114. At this time, since the p-side protruding portions A having the same height as the ridge B are formed on both sides of the ridge at the end face where light emerges, preferably at four corners of the chip, stable mounting can be achieved. Preferred embodiments of the p-side protruding portion A will now be described in detail below.

Height of the p-side protruding portion is preferably such that can suppress the deposition of the component of the end face protective film. For example, it is preferable that the p-side protruding portion is formed so that the p-side protruding portion is located above the central regions of the p electrode 105 and 106. In case the p-side protruding portion A is formed simultaneously with the ridge B by etching the p-type semiconductor layer 103 as in this embodiment, height of the protruding portion A becomes substantially the same as that of the ridge B. As a result, the protruding portion becomes lower than the central regions of the p electrodes 105 and 106. When this is the case, it is preferable to form the p electrode 105 or the protective film 109 on the p-side protruding portion that is formed from the p-type semiconductor layer 103. Or, alternatively, a protective film or the like may be formed of which height is adjusted in another process. Forming of the protective film 109 and the electrode material 105 on the p-side protruding portion A may be omitted in case the effect of blocking the component of the end face protective film can be provided by the p-side protruding portion made only of the p-type semiconductor layer 103, or spreading of the end face protective film does not cause significant trouble.

When the p electrode 105 or the protective film 109 is thick, it is preferable to form the protruding portion A to have a larger height accordingly. In this case, the p-side protruding portion A that is higher than the surfaces of the p electrode 105 and 106 may be formed only from the p-type semiconductor layer. Or, alternatively, the p-type semiconductor layer may make up a protruding portion lower than the p electrodes 105 and 106, with the protective film 109 and the p electrodes 105 and 106 being formed on the protruding portion, so that the portion becomes higher than surroundings by the thickness of the protruded portion of the p-type semiconductor layer.

The width of the p-side protruding portion is preferably roughly in a range from 50 to 120% of the width of the p electrode. When the ridge B is formed as in this embodiment, it is preferable to form the p-side protruding portion A on both sides of the ridge. In this case, a plurality of the p-side protruding portions A are formed of which total width is preferably within the range described above.

The p-side protruding portion lies on an extension line of the stripe-shaped p-electrodes (end portions). However, the p-side protruding portion may extend in a direction parallel to the waveguide region. Spreading of the end face protective film can be suppressed more effectively by combining the protruding portion in the vicinity of the end face of the semiconductor layer and the protruding portion in the vicinity of the side face. While the p-side protruding portion is preferably formed at a position as near as possible to the end of the p electrode, it may be positioned at some distance from the end of the p electrode as long as it is so located as is capable of blocking the spread of the end face protective film when forming the end face protective film. The p-side protruding portion A may be formed either on the p-type semiconductor layer 103 only, or over the p electrode 105 and 106 and the p-type semiconductor layer 103. It may also be formed only on the p electrode 105 and 106. In other words, there is no restriction on the forming area as long as it is capable of blocking the spread of the end face protective film to a region of interest.

The p-side protruding portion A is preferably formed in the vicinity of the end on both sides, rather than in the vicinity of the end on one side of the p electrodes 105 and 106. This makes it possible to prevent the component of the end face protective film onto the p electrodes 105 and 106 both at the time of forming the end face protective film on the resonator surface on the beam exit side and at the time of forming the end face protective film on the resonator surface on the monitor side. The element can be mounted stably while suppressing the inclination of the element more effectively during junction down mounting, by forming the p-side protruding portion A on both sides in the vicinity of the end on one side of the p electrodes 105 and 106. Moreover, breakage of the current flowing portion of the laser element can be suppressed since external force applied to the current flowing portion including the electrode during mounting can be absorbed by the p-side protruding portion A.

The length of the p electrodes 105 and 106 of the laser element in the direction of stripe is preferably in a range approximately from 60 to 100% of the waveguide region, more preferably from 80 to 100%. Among the p electrodes, the p electrode 105 that is intended for ohmic contact may be formed with a width substantially the same as the waveguide region, or wider than the waveguide region by restricting the current path with the insulating film 109 or the like. In the case of the laser element that has the ridge B as in this embodiment, it is preferable that the semiconductor layer 103 on the side face of the ridge B and on both sides of the ridge B is covered by the insulating film 109 on the surface thereof, and that the p-electrode covers the insulating film 109 and the top surface of the ridge B. The ridge B may also be formed by etching with the p electrode being used as a mask.

(Variation)

Figure 5A:
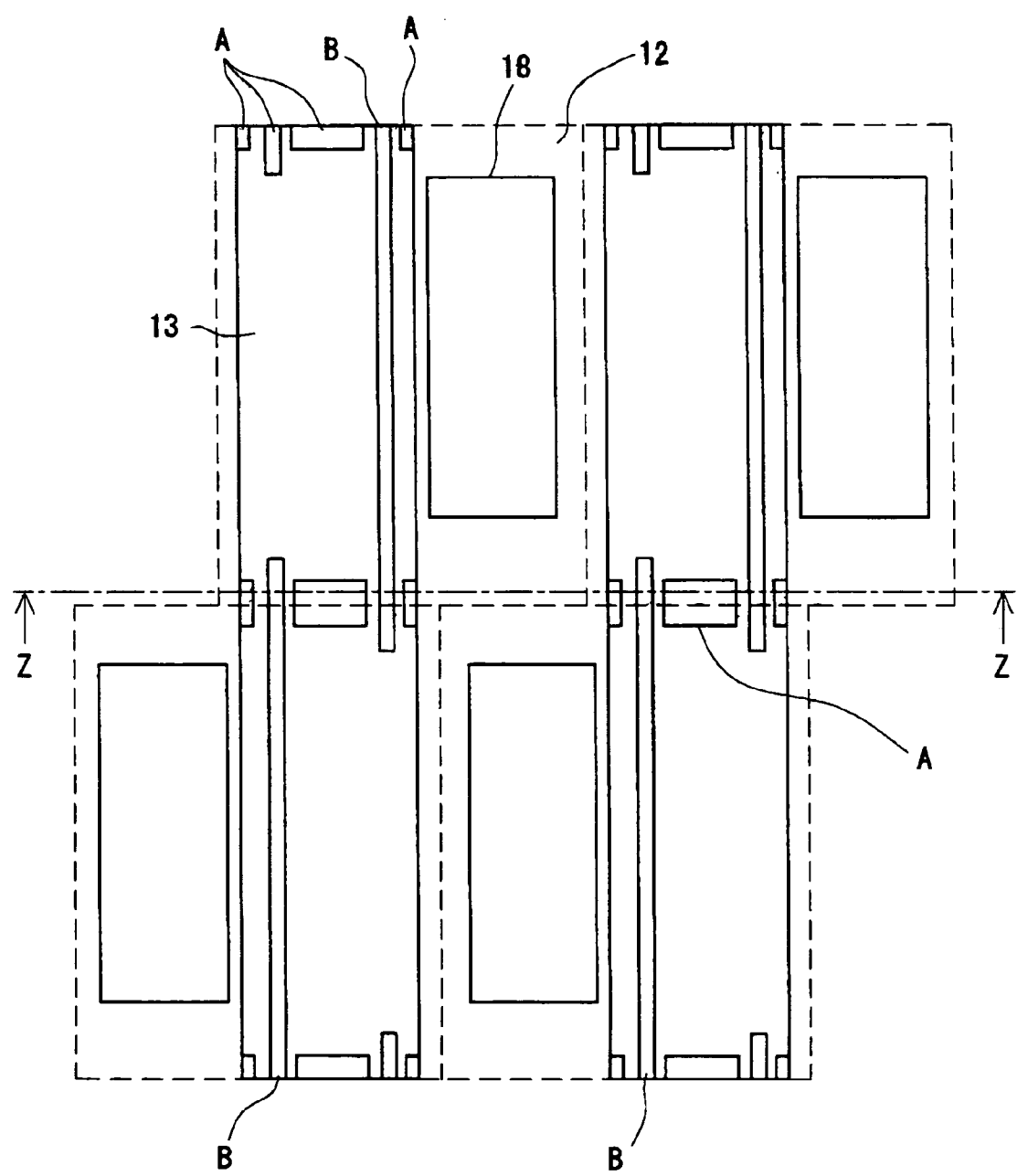
FIG. 5A is a schematic diagram explanatory of a variation of the method of manufacturing semiconductor laser device according to the first embodiment of the present invention.
Figure 5B:
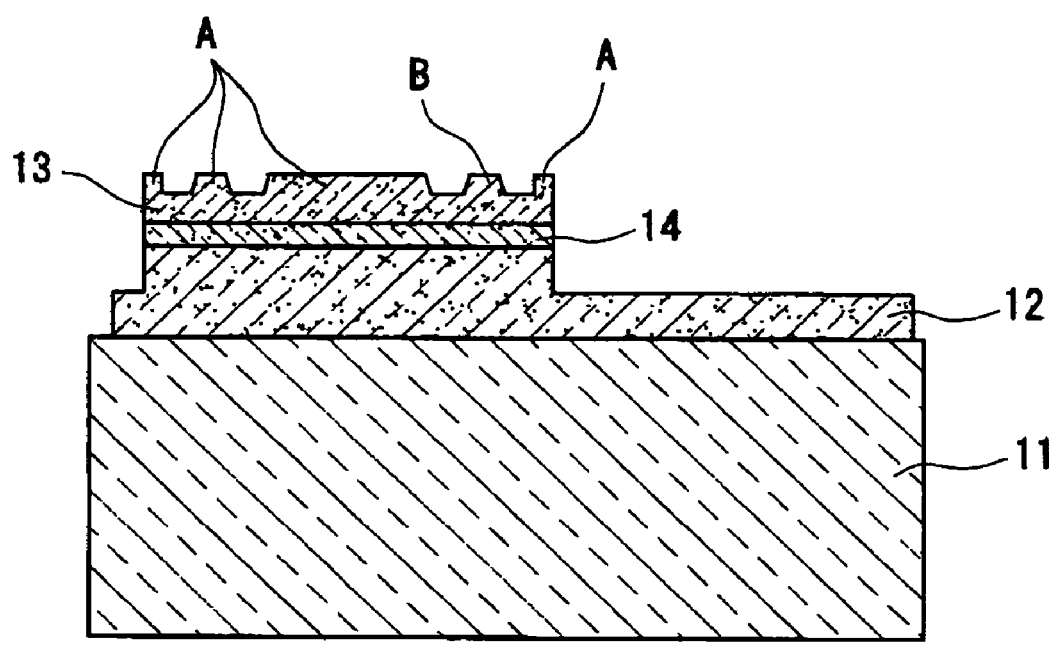
FIG. 5B is a sectional view taken along lines ZZ' in FIG. 5A.

Now a variation of the p-side protruding portion A will be described. FIG. 5A shows an example of pattern of disposing the protruding portions A and the ridges B arranged on a wafer, viewed from above the top surface of the wafer (p-type semiconductor layer side). In FIG. 5A, letter B indicates the waveguide region formed from the ridge, and letter A indicates the p-side protruding portion. In FIG. 5A, the p-type semiconductor layer 13 corresponds to the mesa. An n electrode 18 is formed on an n-type semiconductor layer 12 that is adjacent to the mesa. The n electrode 18 of substantially rectangular shape is formed in a region that is sandwiched by the n-side protruding portion A. Dashed line in FIG. 5A shows the position where the chips are divided. Dashed line perpendicular to the ridge B is where the wafer is divided into bars, and dashed line parallel to the ridge B is where the bars are divided into chips. FIG. 5B is a schematic sectional view of one chip along line ZZ' of FIG. 5A. The n-type layer 12, the active layer 14 and the p-type layer 13 are stacked one on another on the substrate 11.

FIGS. 5A and 5B show a variation where only the p-side protruding portion A is formed. While the n electrode 18 is formed on the same side as the p electrode (not shown), the effect of suppressing the deposition of the component of the end face protective film on the p electrode can be achieved also in this case by providing the p-side protruding portion A. In the variation shown in FIG. 5A, the ridges B are disposed in a staggered arrangement between adjacent chips in the longitudinal direction of the waveguide. The end portion of the ridge B extends into an adjacent chip, so as to form the p-side protruding portion A in the chip. FIG. 5B is a sectional view of the semiconductor laser shown in FIG. 5A. This arrangement has advantages with respect to the manufacturing process such as the ease of forming the ridge with uniform width.

Embodiment 2

Figure 2A:
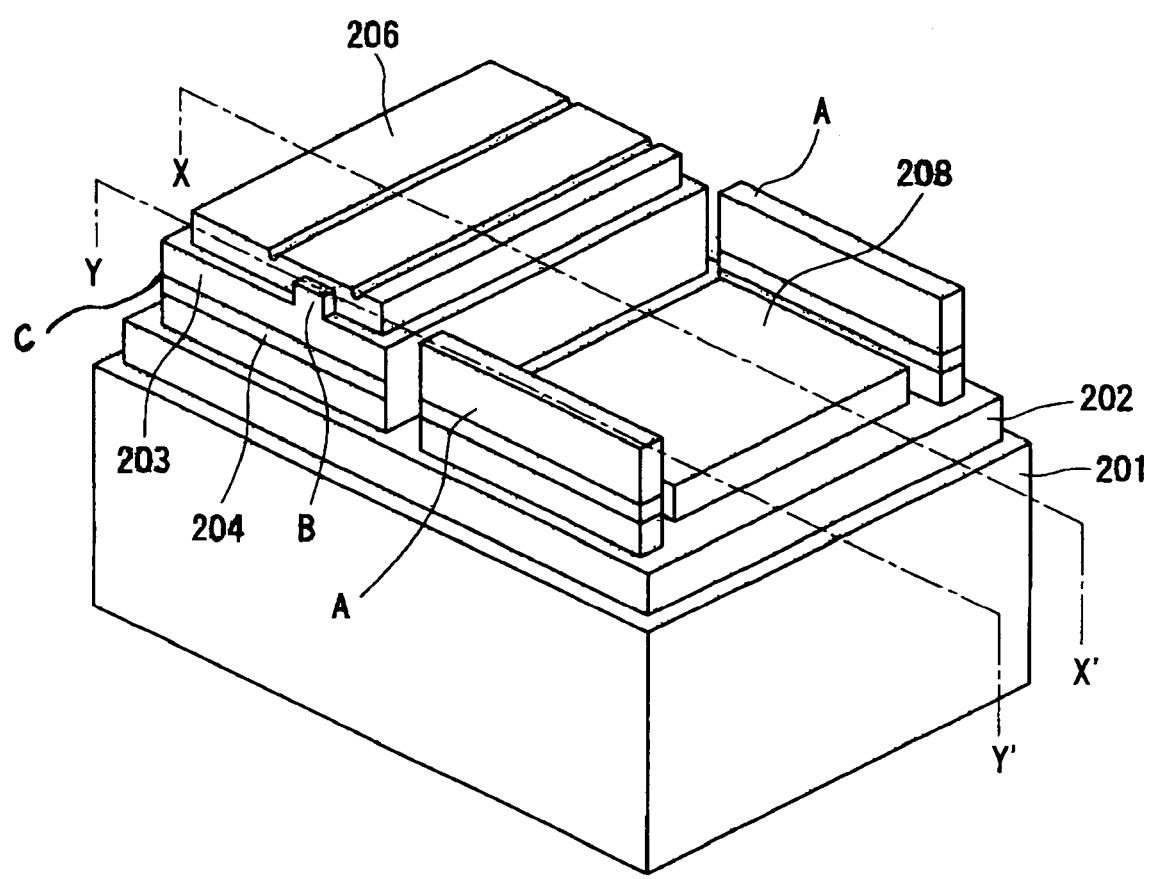
FIG. 2A is a schematic perspective view of a semiconductor laser device according to a second embodiment of the present invention.
Figure 2B:
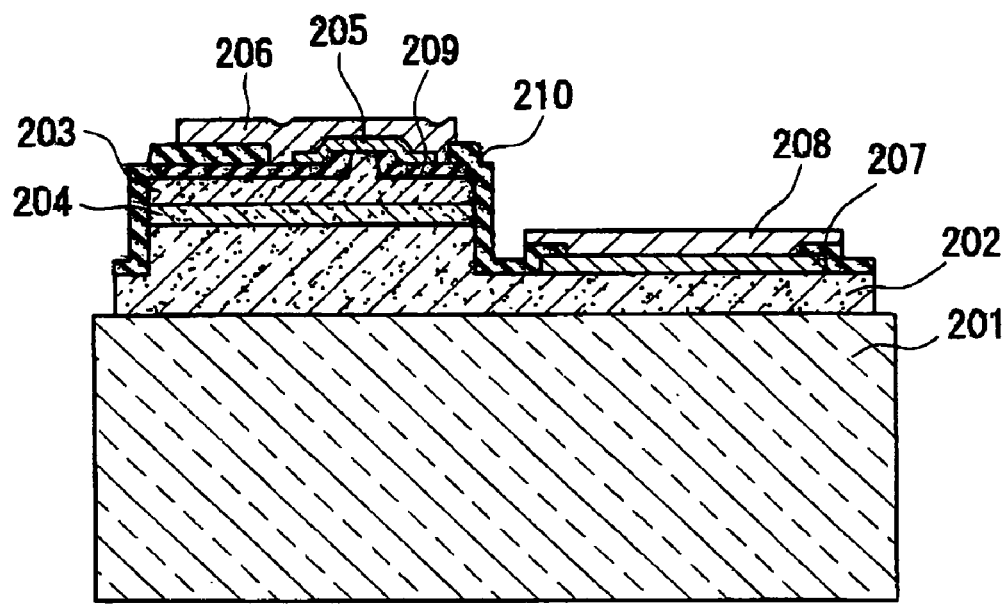
FIG. 2B is a sectional view taken along lines XX' in FIG. 2A.
Figure 2C:
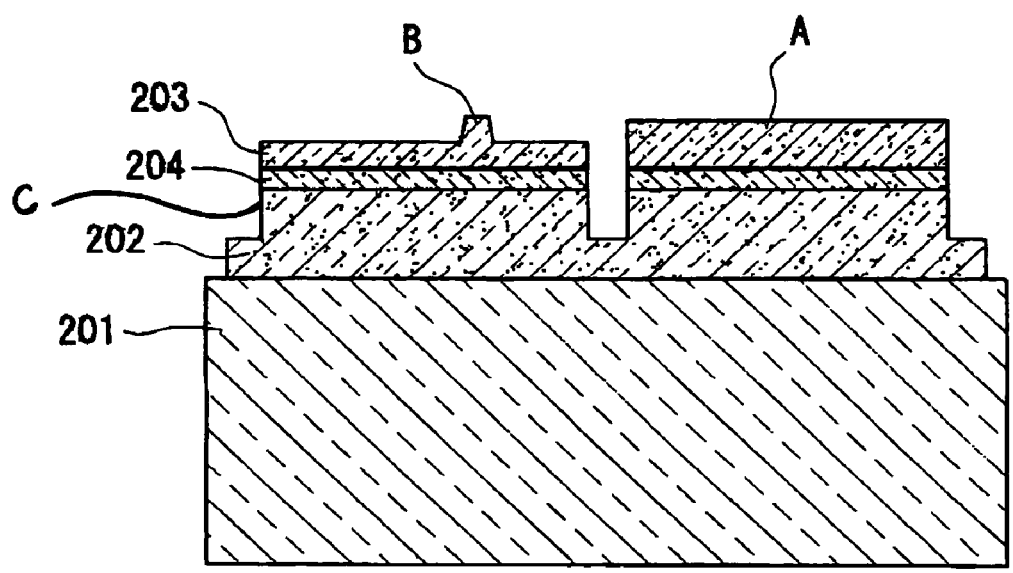
FIG. 2C is a sectional view taken along lines YY' in FIG. 2A.
Figure 21A:
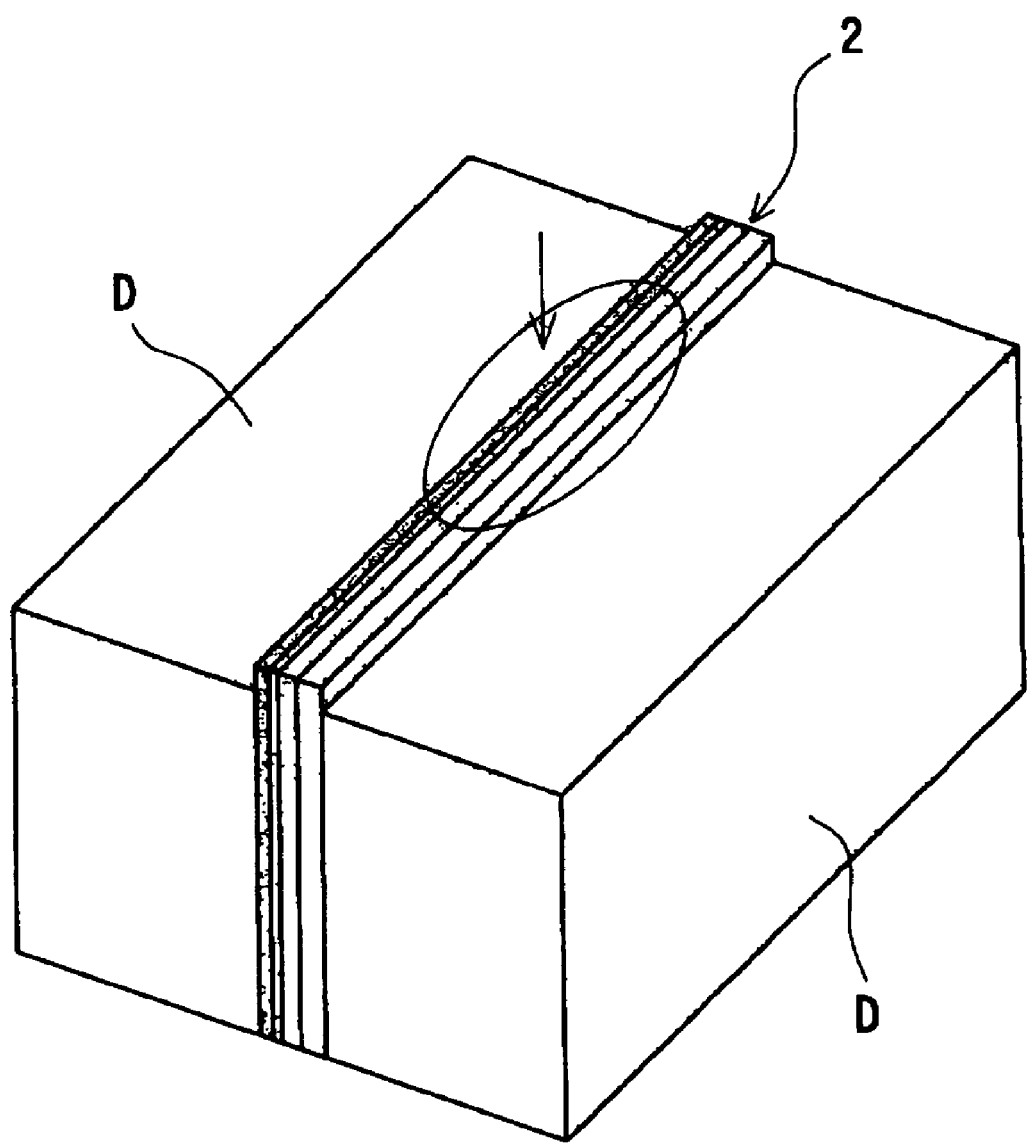
FIG. 21A is a perspective view explanatory of a process of forming an end face protective film on a laser bar.
Figure 21B:
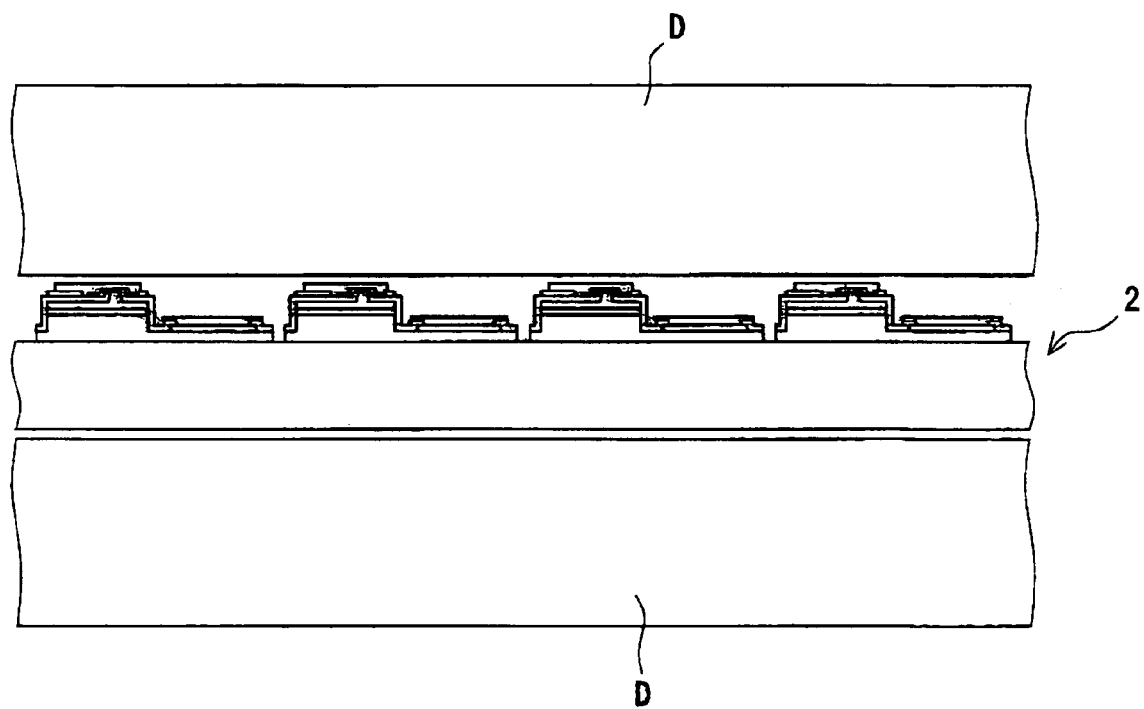
FIG. 21B is a schematic perspective view explanatory of a process of forming the end face protective film on the laser bar.
Figure 22:
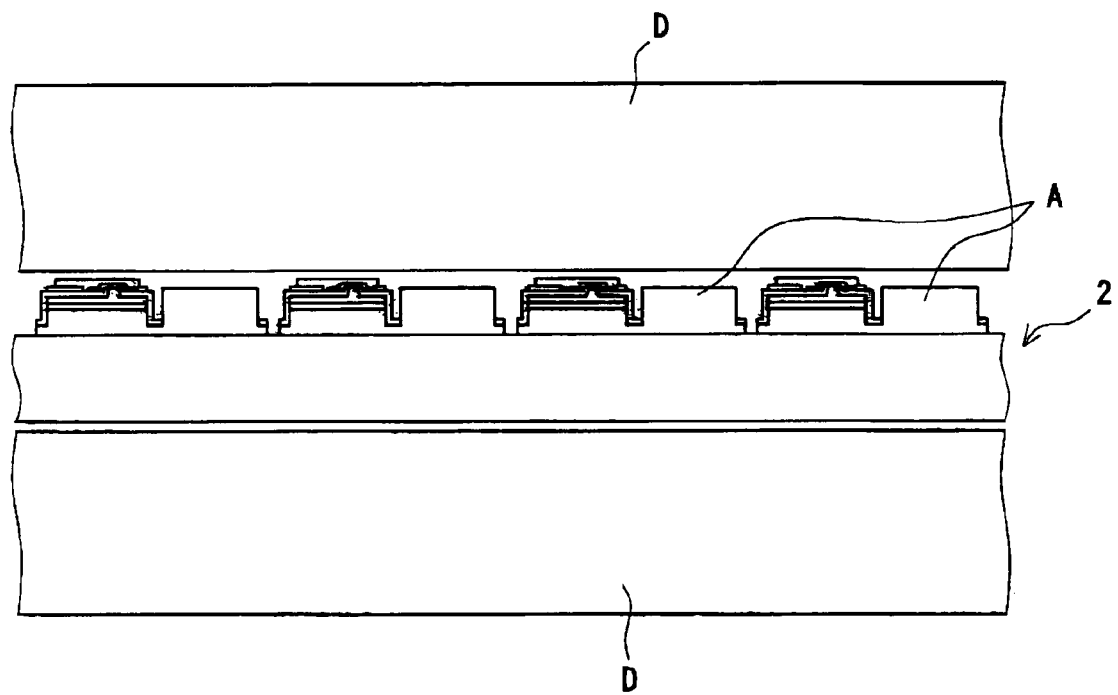
FIG. 22 is a perspective view explanatory of a process of forming the end face protective film on laser bar.

This embodiment is an example of forming the n-side protruding portion A on the n-type semiconductor layer. FIGS. 2A through 2C schematically show the semiconductor laser device according to this embodiment. FIG. 2B is a sectional view taken along lines XX' of FIG. 2A, and FIG. 2C is a sectional view taken along lines YY' of FIG. 2A. This embodiment employs an insulating substrate 201 and, when the p electrode and the n electrode are formed on the same side of the substrate. Since the n-type semiconductor layer 12 is exposed by etching, the p electrode (p-side pad electrode) 206 and the n electrode (n-side pad electrode) 208 are different in the surface height as shown in FIG. 2B. As a result, a space is formed opening wide above the n electrode when forming the end face protective film as shown in FIG. 21B, thereby making it easier for the end face protective film to deposit on the n electrode. In this embodiment, in contrast, since the n-side protruding portion A is formed so as to adjoin the mesa C as shown in FIG. 2C, the n electrode is located behind the protruding portion A when forming the end face protective film as shown in FIG. 22. As a result, component of the end face protective film is blocked by the protruding portion and is suppressed from depositing on the n electrode.

Now preferred form and manufacturing method of the n-side protruding portion A will be described in detail below.

The n-side protruding portion A may be made of the same material as the mesa C, or made of a different semiconductor material. Alternatively, the n-side protruding portion may be made of an electrically conductive material or an insulating material. Method for forming the n-side protruding portion may be selected depending on the material it is made of.

The n-side protruding portion A may be constituted either from the n-type semiconductor layer only, or of the n-type semiconductor layer and the active layer. Or, alternatively, the n-side protruding portion may be constituted of the n-type semiconductor layer, the active layer and the p-type semiconductor layer. In case the n-side protruding portion A is formed by etching similarly to the mesa, dry etching, wet etching, etc. or a combination thereof may be employed. In case the n-side protruding portion A is formed from a material different from the semiconductor layer, sputtering, vapor deposition, liquid application or other process may be employed depending on the material. The n-side protruding portion may also be made of a composite material by stacking an insulating material and an electrically conductive material on the semiconductor layer, similarly to the p-side protruding portion, or made of a material completely different from the mesa. In other words, the material may be selected freely since the effect of suppressing the deposition of the component of the end face protective film can be achieved by forming the n-side protruding portion to be higher than the n electrode in the central region. Timing of forming it may also be selected freely as long as it is before forming the end face protective film.

Height of the n-side protruding portion is preferably higher than the n electrode such that deposition of the component of the end face protective film can be suppressed. In case the n-side protruding portion is formed simultaneously with the mesa C as described later, the mesa C and the n-side protruding portion A can be formed to have the same height. When the ridge is formed in the mesa, the ridge and the n-side protruding portion A are preferably the same in height.

The width of the n-side protruding portion is preferably in a range approximately from 50 to 120% of the width of the n electrode 208. A region for connecting an electrode should be secured within the surface of the n electrode 208. Obstruction of current flow by spreading end face protective film can be suppressed when the n-side protruding portion has a width about 50% of the width of the n electrode such that the end face protective film can be suppressed from depositing near the center of the n electrode.

The n-side protruding portion A is preferably provided in the vicinity of the end portion on both sides (on the extension of the n electrode 208) rather than in the vicinity of the end portion on one side of the n electrode 208, which makes it possible to prevent the component of the end face protective film from spreading onto the n electrode both at the time of forming the end face protective film on the resonator surface on the beam exit side and at the time of forming the end face protective film on the resonator surface on the monitor side.

The n-side protruding portion may also be formed to extend in a parallel direction to the longitudinal direction of the n electrode 208, as well as to be formed near the end face of the n electrode 208. In this case, the n-side protruding portion may be formed so as to surround the n electrode 208 as a whole, or only on the side parallel to the longitudinal direction of the n electrode 208. While the n-side protruding portion is preferably formed at a position as near as possible to the end of the n electrode 208 similarly to the case of the p-side protruding portion, it may be positioned at some distance from the end of the n electrode 208 as long as it is so located as is capable of blocking the spread of the end face protective film when forming the end face protective film. The n-side protruding portion may be formed either on the n-type semiconductor layer 202 only, or over the n electrode 208 and the n-type semiconductor layer 202, similarly to the case of the p-side protruding portion. It may also be formed only on the n electrode 208. In other words, there is no restriction on the forming area as long as it is capable of blocking the spread of the end face protective film to a region of interest.

In the laser element having the n electrode 208 formed on the same side as the p electrode 206 as in this embodiment, the n-side protruding portion A and the mesa C may be either separate from or continuous with each other on the n-type contact layer. In case the n-side protruding portions are formed in the vicinity of both end portions of the n electrode 208, such a configuration may be employed as one of the n-side protruding portions A is located apart from the mesa C and the other n-side protruding portion A is continuous with the mesa C.

A plurality of adjacent laser elements (chips) formed on a laser bar may have the n-side protruding portions thereof in a continuous structure. In this case, the chips are separated by dividing the n-side protruding portion. Each laser chip formed on a wafer before dividing into laser bars may have an n-side protruding portion that is continuous with the n-side protruding portion of the adjacent chip. In this case, end face of the n-side protruding portion is formed when dividing the wafer into bars.

A plurality of laser elements which are adjacent to each other in the direction of the stripe of the waveguide formed on a wafer before dividing into laser bars may have the mesa and the n-side protruding portion thereof in a continuous structure. In this case, the laser elements which are adjacent to each other in the direction of the stripe of the waveguide may have the mesa and the n-side protruding portion located in reverse positional relationship. That is, the laser elements are disposed in the direction of the stripe of the waveguide on the wafer so that right and left relationship of the mesa and the n-side protruding portion in the laser element is reversed alternately. In this case, the n-side protruding portion has a cleaved surface of the same shape as the cleaved surface of the mesa when the wafer is cleaved into bars.

Now preferred forms of components other than the n-side protruding portion will be described below.

(Mesa)

The mesa C comprises the n-type semiconductor layer 202, the active layer 204 and the p-type semiconductor layer 203, with a stripe-shaped waveguide region formed therein and a pair of resonator surfaces formed on the end faces that are substantially perpendicular to the waveguide. A structure that constitutes the stripe-shaped waveguide region (ridge or current pinching layer) is formed in the semiconductor layer, either in the n-type semiconductor layer 202 or in the p-type semiconductor layer 203. The structure that constitutes the stripe-shaped waveguide region is preferably formed in the p-type semiconductor layer 203. For example, a current pinching layer can be formed in the p-type contact layer 203 by forming a semiconductor or an oxide of insulating property with stripe-shaped opening in the p-type optical guide layer, the p-type cladding layer or the p-type contact layer. Or, alternatively, these semiconductors may also be formed in stripe with the space on the side and above the stripe filled with a layer having high resistance by regrowth. Also a ridge B may be provided on the top surface of the p-type semiconductor layer 203 (ridge waveguide type), as shown in FIG. 2A.

Current can be injected efficiently into the active layer by forming the stripe-shaped waveguide region with a width in a range from about 1 to 7 μm. The width of the mesa is preferably in a range from 50 to 150 times longer than the width of the stripe-shaped waveguide region.

The end face (that is perpendicular to the stripe-shaped waveguide region) of the mesa C becomes the resonator surface, and therefore preferably has high flatness which can be formed by cleaving or etching.

(Ridge B)

In case the stripe-shaped waveguide region is formed by providing the ridge B on the surface of the p-type semiconductor layer 203, the mesa may be formed after forming the ridge, but it is preferable to form the ridge after forming the mesa. In this case, if the resonator end surface is formed by etching, it is preferable to fill the space surrounding the mesa with a resist or the like before forming the ridge so that there is no step in the mask used in forming the ridge. This enables it to form the ridge with uniform width. Or, alternatively, after applying the material to make the ridge forming mask over the entire surface of the wafer (including the mesa and other portion), resist or the like may be applied onto the ridge forming mask except on the mesa so as to eliminate the step with the mesa, before forming the stripe-shaped opening by patterning of the mask material. Then the resist is formed for patterning of the mask material by photolithography. By reducing the height difference of the mesa with the resist or the like, the pattern can be prevented from becoming uneven such as thinning of the ridge forming mask at the end thereof. As the controllability of width of the ridge forming mask is improved, such a semiconductor laser device can be made that has uniform ridge width and high reliability with less susceptibility to COD or the like.

The length of the stripe of the n electrode is preferably in a range from approximately 50 to 100% of the length of the (n electrode) waveguide region (resonator length).

(Variation)

FIG. 6A through FIG. 16B show variations of this embodiment (where only the n-side protruding portion is provided). Explanation of the constitution in FIG. 6A through FIG. 16B is similar to that in FIGS. 5A and 5B.

Figure 6A:
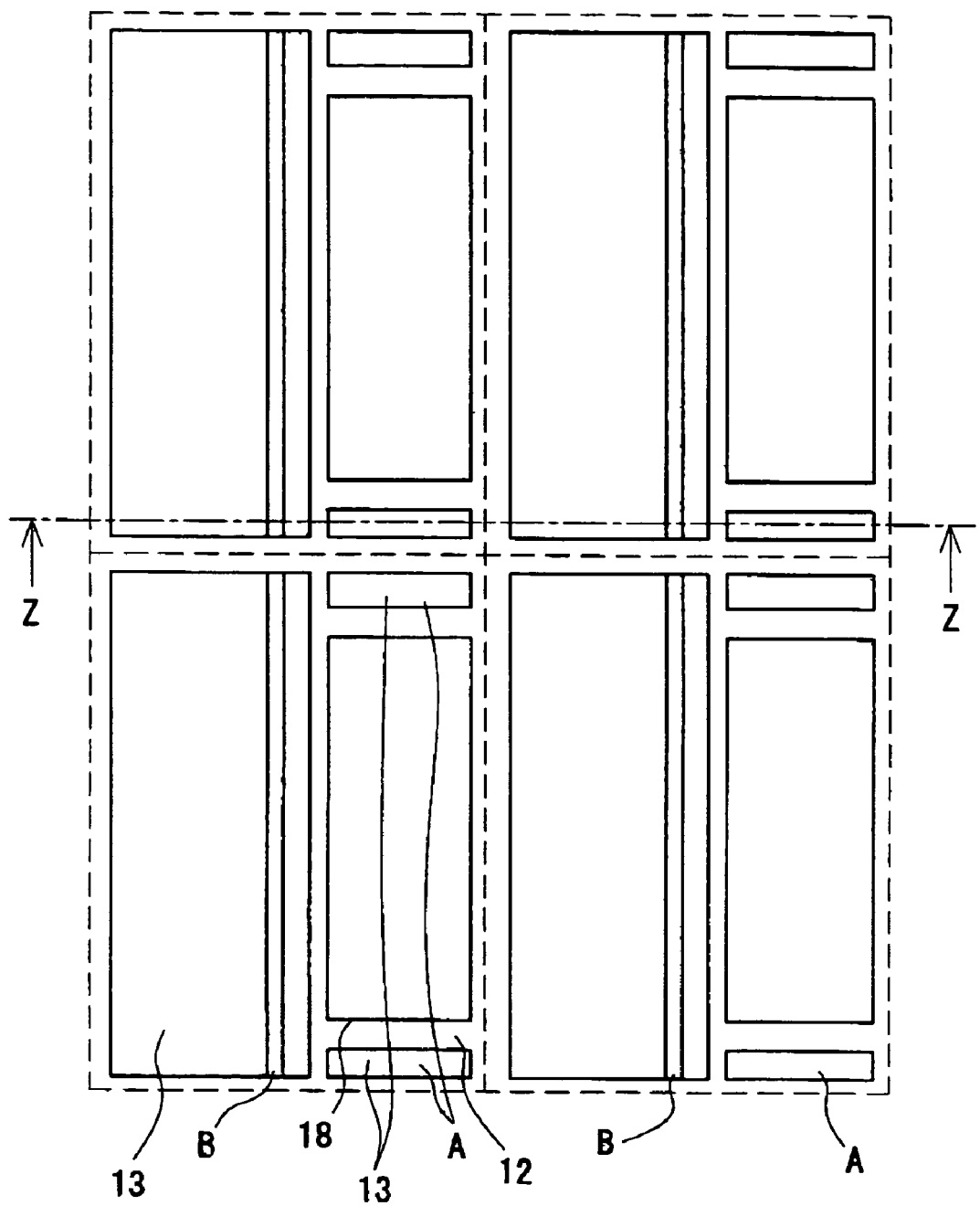
FIG. 6A is a schematic diagram explanatory of a variation of the method of manufacturing semiconductor laser device according to the second embodiment of the present invention.
Figure 6B:
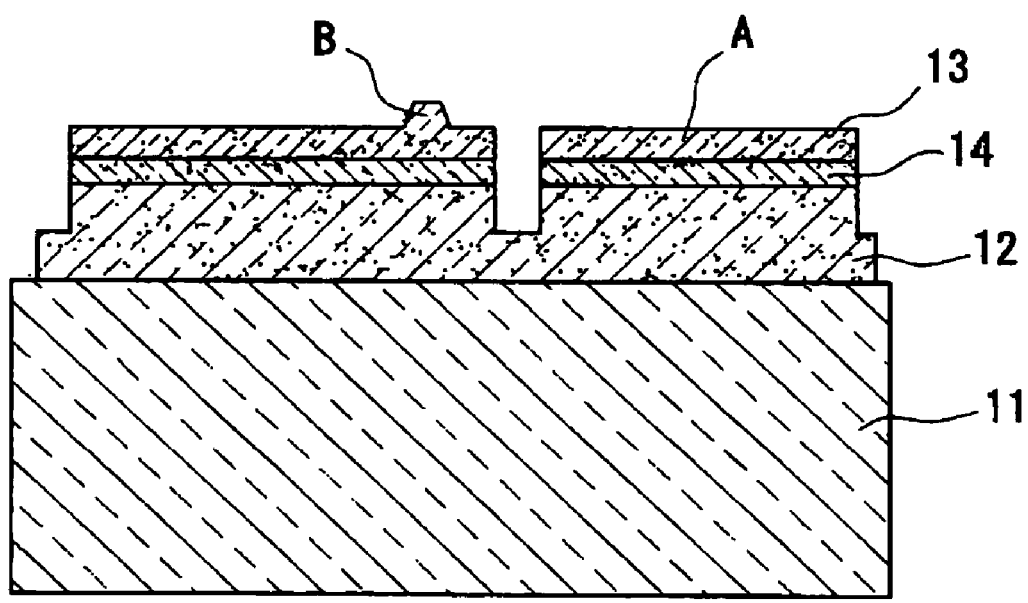
FIG. 6B is a sectional view taken along lines ZZ' in FIG. 6A.

FIGS. 6A and 6B show a case where the end face is formed by etching, not by cleaving, since the end face of the mesa is located apart from the dividing position. The end face of the n-side protruding portion may be located apart from the dividing position. In FIG. 6B, the mesa and the n-side protruding portion A are formed on the same n-type semiconductor layer 12, but are separated from each other. Such a configuration can be formed by etching the protruding portion simultaneously as the mesa is etched.

Figure 7A:
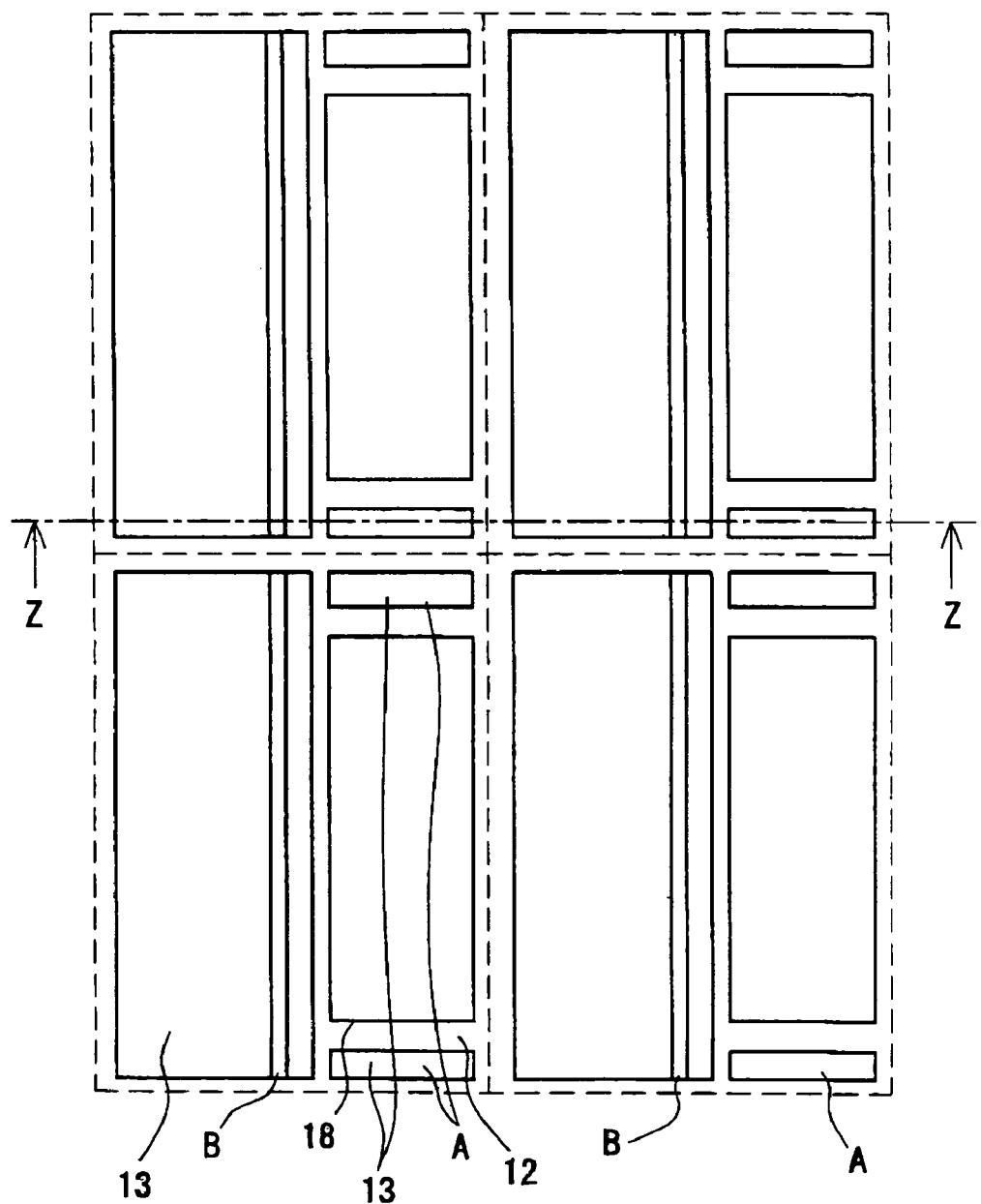
FIG. 7A is a schematic diagram explanatory of another variation of the manufacturing method.
Figure 7B:
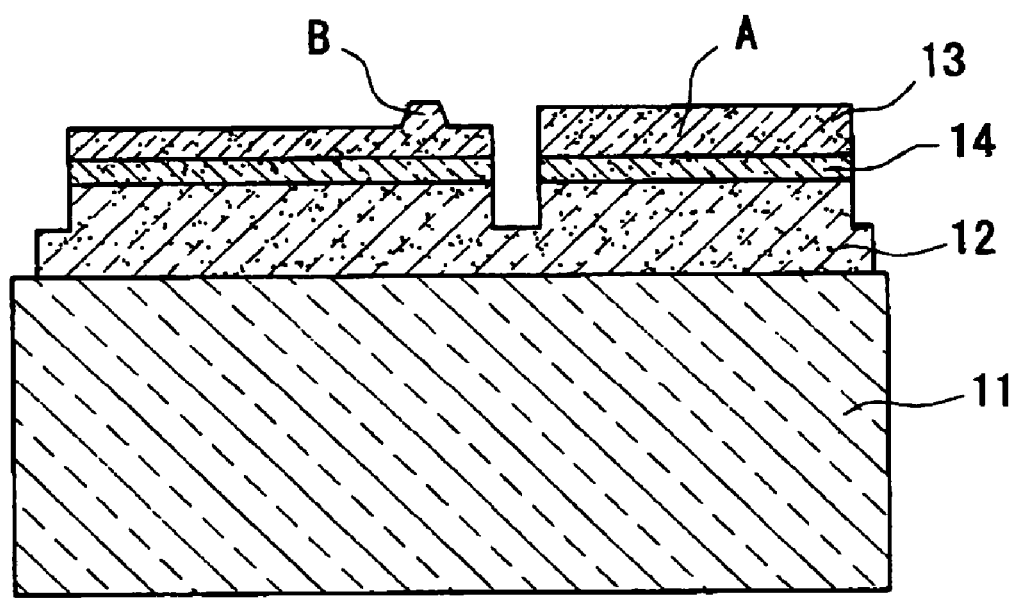
FIG. 7B is a sectional view taken along lines ZZ' in FIG. 7A.
Figure 8A:
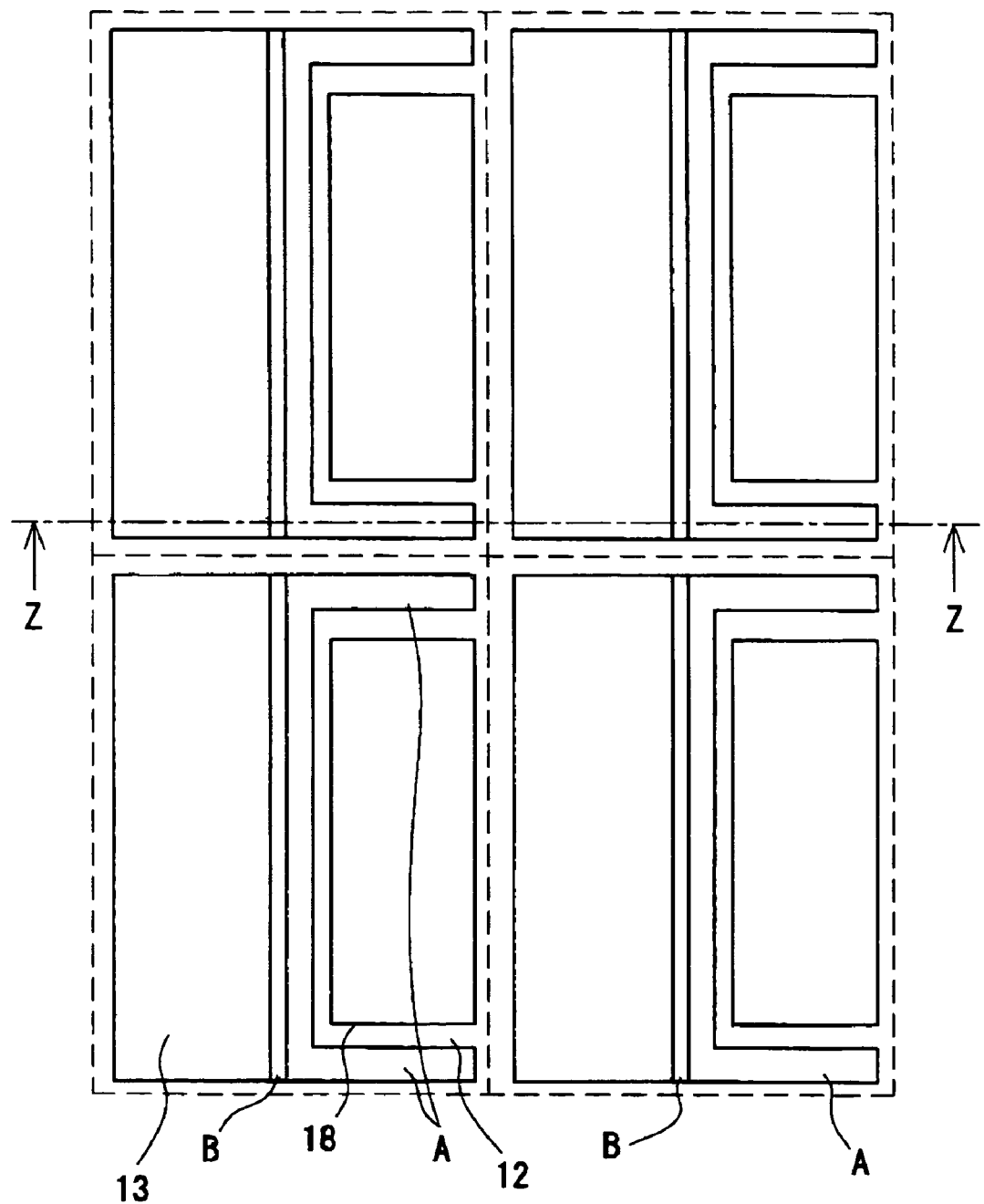
FIG. 8A is a schematic diagram explanatory of another variation of the manufacturing method.
Figure 8B:
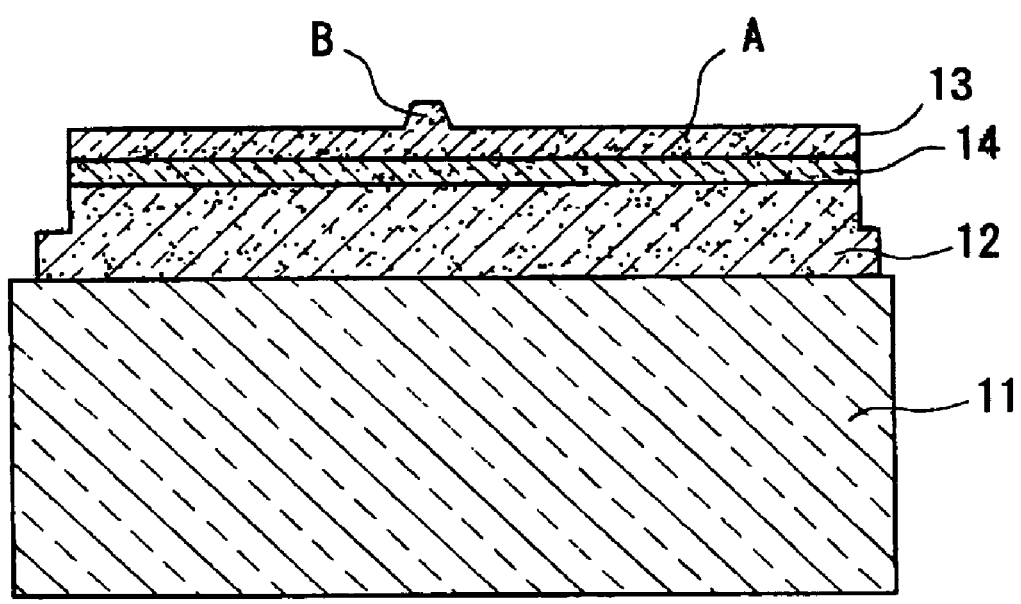
FIG. 8B is a sectional view taken along lines ZZ' in FIG. 8A.
Figure 9A:
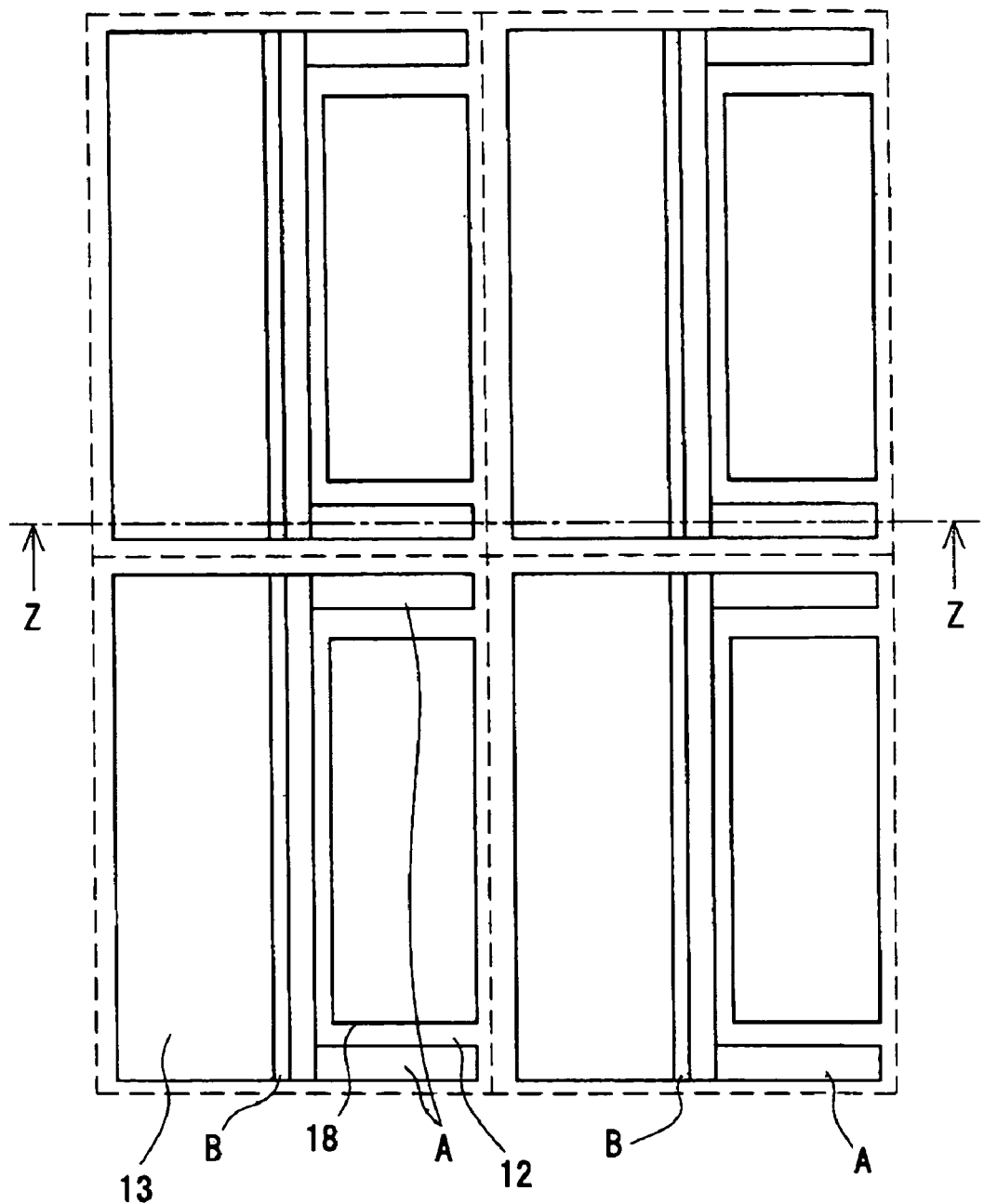
FIG. 9A is a schematic diagram explanatory of another variation of the manufacturing method.
Figure 9B:
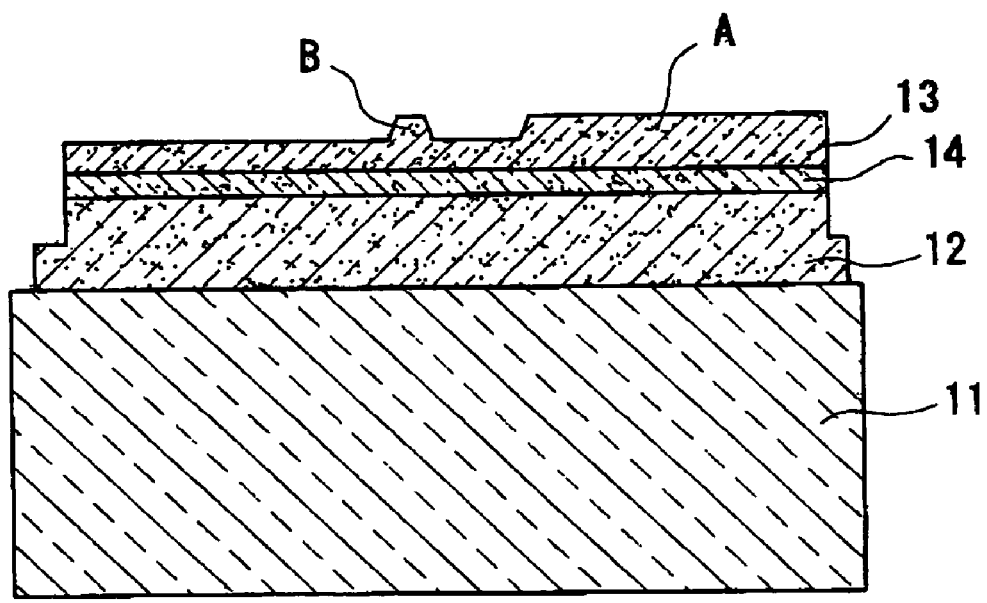
FIG. 9B is a sectional view taken along lines ZZ' in FIG. 9A.

FIGS. 7A and 7B also show the end face of the mesa and the end face of the protruding portion A both formed by etching, similarly to those shown in FIGS. 6A and 6B. What is different from that shown in FIGS. 6A and 6B is that the n-side protruding portion A has the same height as that of the ridge B, as shown in FIG. 7B. In FIGS. 6A and 6B, the n-side protruding portion A has substantially the same height as that of the mesa, and is lower than the ridge B. The n-side protruding portion A is made lower than the ridge B by etching out the height of the ridge when the ridge B is formed. In the example shown in FIGS. 7A and 7B, in contrast, the n-side protruding portion is also masked when forming the ridge, and is formed to the same height as the ridge.

FIGS. 8A and 8B, FIGS. 9A and 9B show examples where the mesa and the n-side protruding portion are formed in a continuous structure. In this case, a process similar to those shown in FIG. 5A and FIG. 7A can be employed except for using the mask pattern for the formation of the n-side protruding portion having a structure continuous with the mesa. Forming the mesa and the n-side protruding portion in a continuous structure enables it to prevent the component of the end face protective film from depositing on the n electrode more efficiently.

Figure 10A:
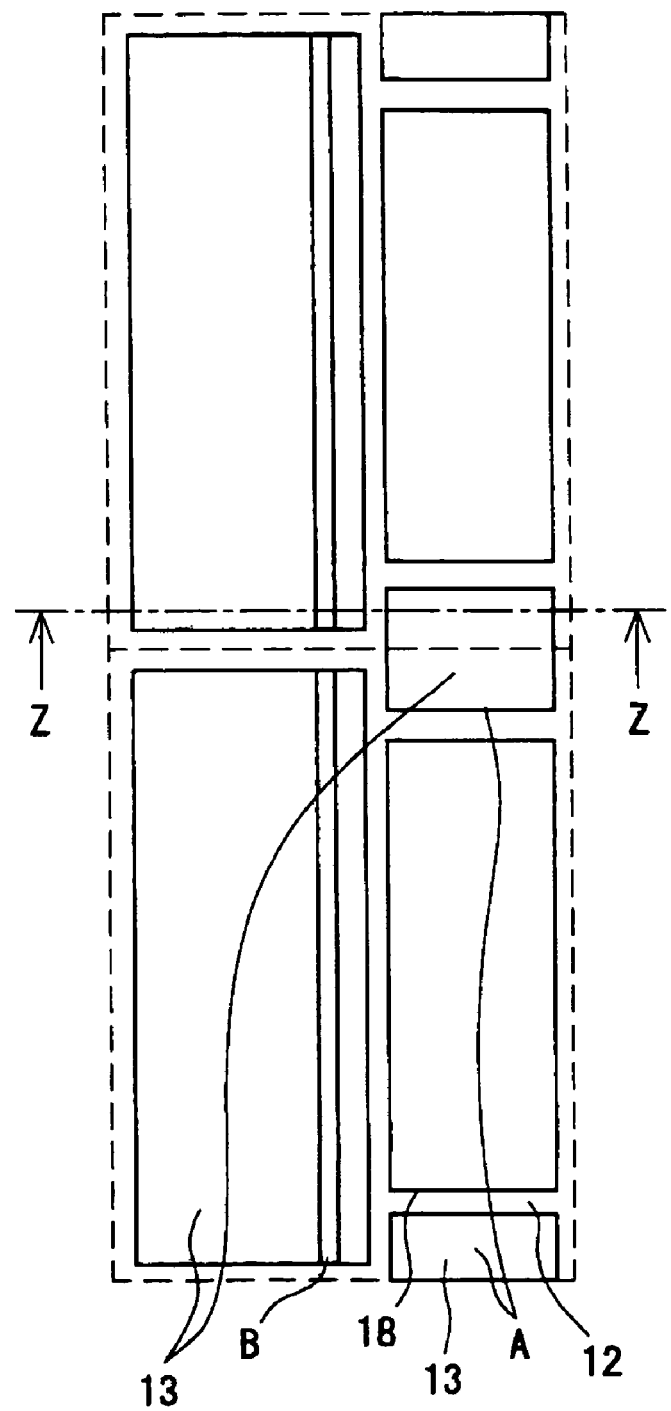
FIG. 10A is a schematic diagram explanatory of another variation of the manufacturing method.
Figure 10B:
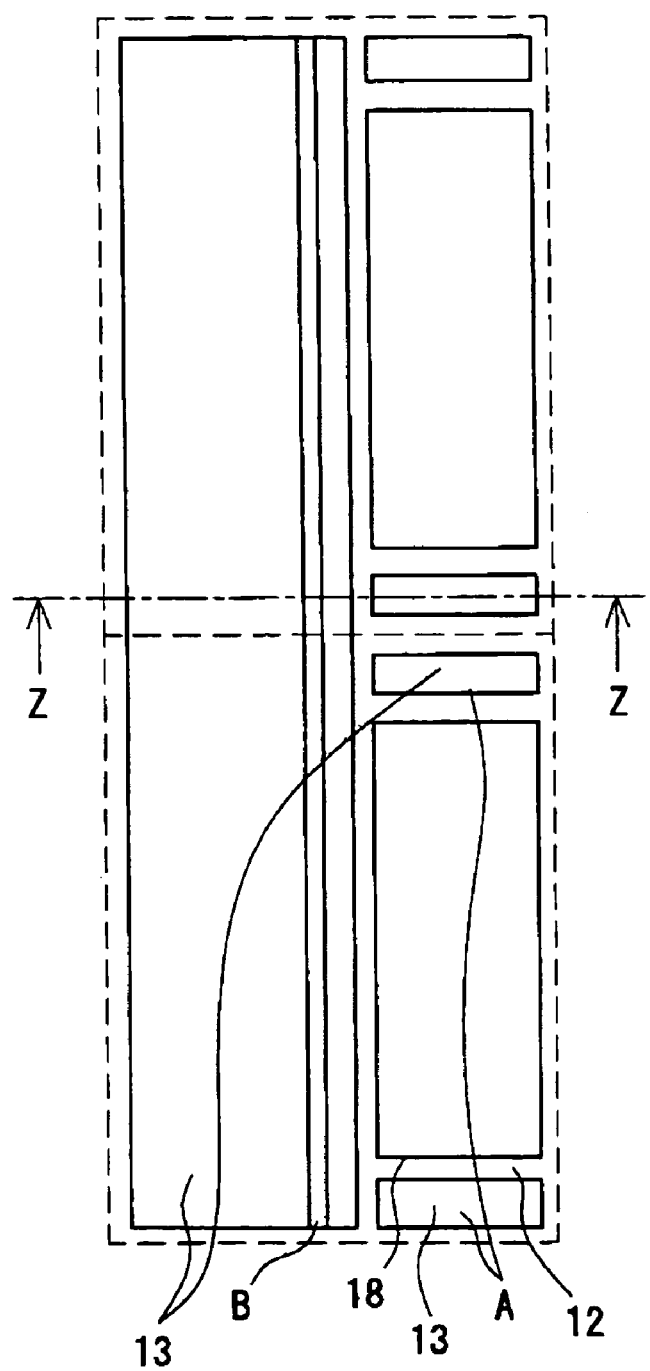
FIG. 10B is a schematic diagram explanatory of another variation of the manufacturing method.
Figure 10C:
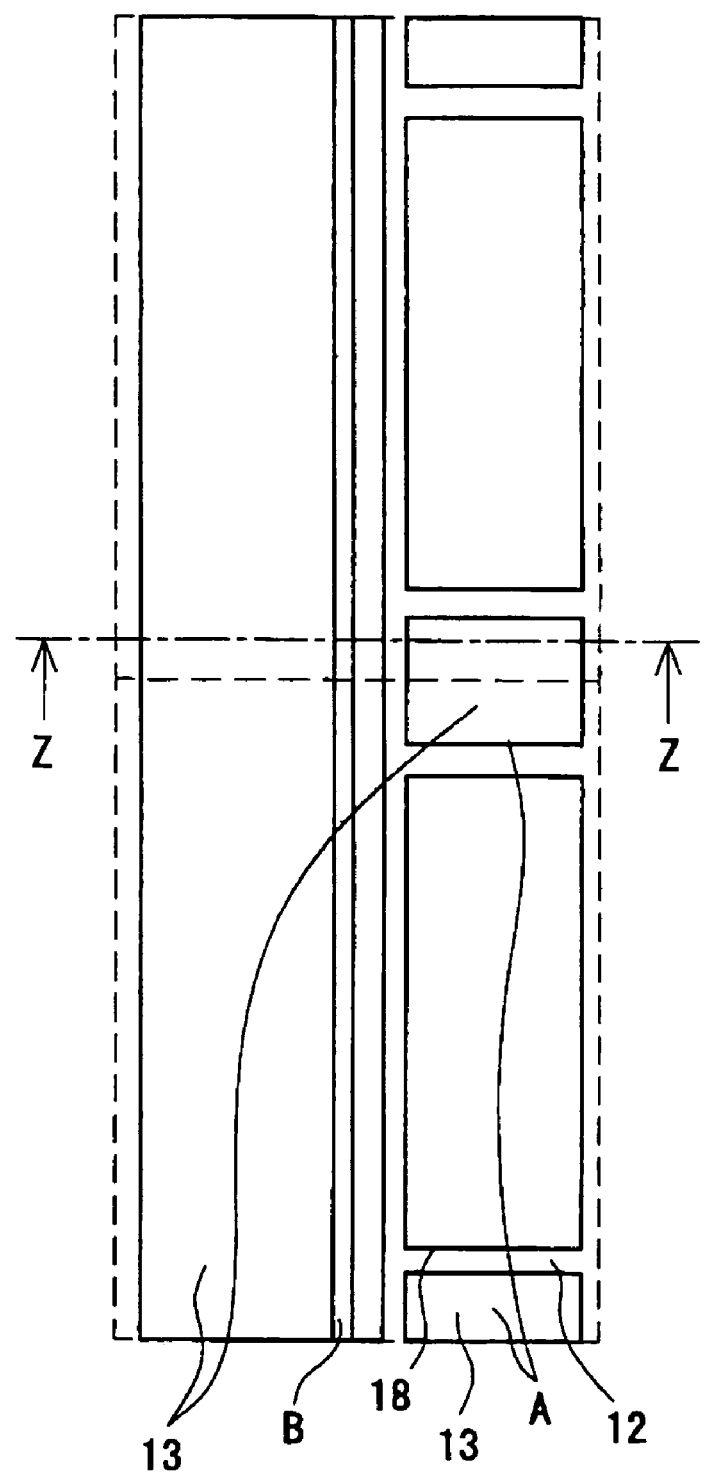
FIG. 10C is a schematic diagram explanatory of another variation of the manufacturing method.

FIGS. 10A through 10C show examples where the end face of the n-side protruding portion corresponds with the line along which the elements are divided (the end face is formed by cleaving), and the end face of the mesa is located apart from the line along which the elements are divided (the end face is formed by etching), or vice versa. FIG. 10A shows an example where the end face of the mesa is located apart from the element dividing line and provides the resonator surface formed by etching. In FIG. 10A, the n-side protruding portion A is formed so as to extend continuously over adjacent two elements in the direction of stripe of the waveguide. Two protruding portions may be combined to form a block, with each protruding portion left to remain on each chip when divided. This is applicable when it is difficult to control the position of the n-side protruding portion apart from the end face due to the precision of etching. While the end face of the mesa functions as the resonator surface of the laser and is therefore required to be flat, the n-side protruding portion does not contribute to the optical property and the cleaved end face thereof is therefore not required to be flat. Therefore, the elements may not be necessarily divided at the center of the protruding portion, and one of the divided protruding portions may be larger than the other, or the two halves may be different in shape. This holds true with patterns other than that shown in FIG. 10A, and the n-side protruding portion is not required to be precise in the uniformity of the shape, uniformity of length and flatness of the surface.

FIG. 10B shows an example where only the mesa corresponds to the line of dividing the elements. The end face of the mesa makes the resonator surface of laser. In the case of nitride semiconductor, M plane, A plane, R plane, etc. may be used as the cleaved surface. Particularly good cleavage surface can be obtained by cleaving along the M plane. While the n-side protruding portion is formed by etching in the example of FIG. 10B, it can also be formed by cleaving similarly to the mesa, since the n-side protruding portion is formed along the extension line of the end face of the mesa. Both the mesa and the protruding portion are formed by cleaving at the same time in the example of FIG. 10C. The protruding portion can be provided efficiently by cleaving the protruding portion at the same time the resonator surface is formed by cleaving.

Figure 10D:
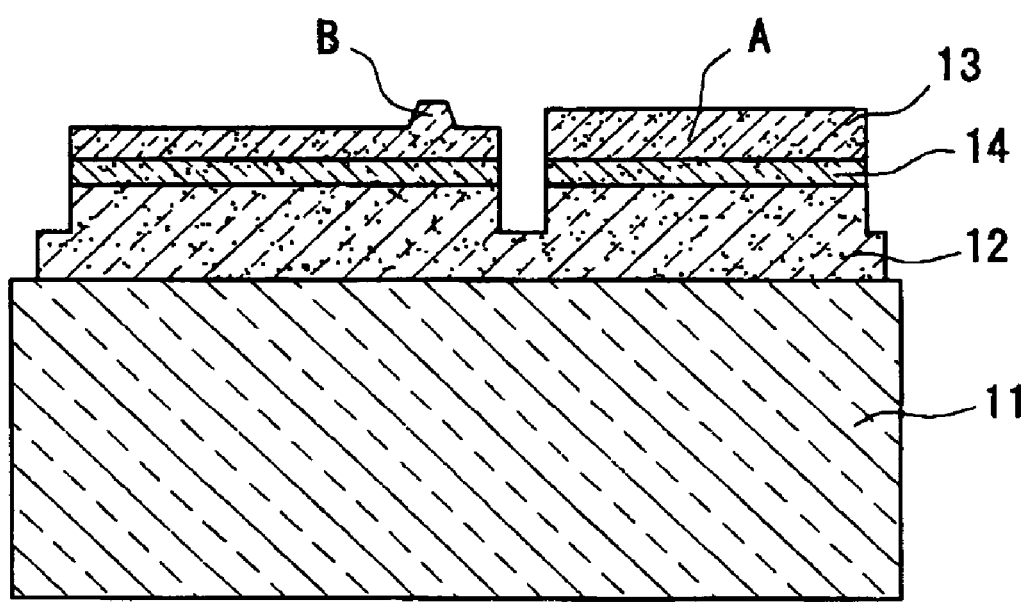
FIG. 10D is a sectional view taken along lines ZZ' in FIG. 10A, B, C.

Section along line ZZ' in the vicinity of the end portion in FIGS. 10A through 10C is as shown in FIG. 10D. The mesa and the n-side protruding portion are formed on the same n-type semiconductor layer 12 as shown in FIG. 10D, but are apart from each other in the portion located above consisting of the active layer 14 and the p-type semiconductor layer 13.

Figure 11A:
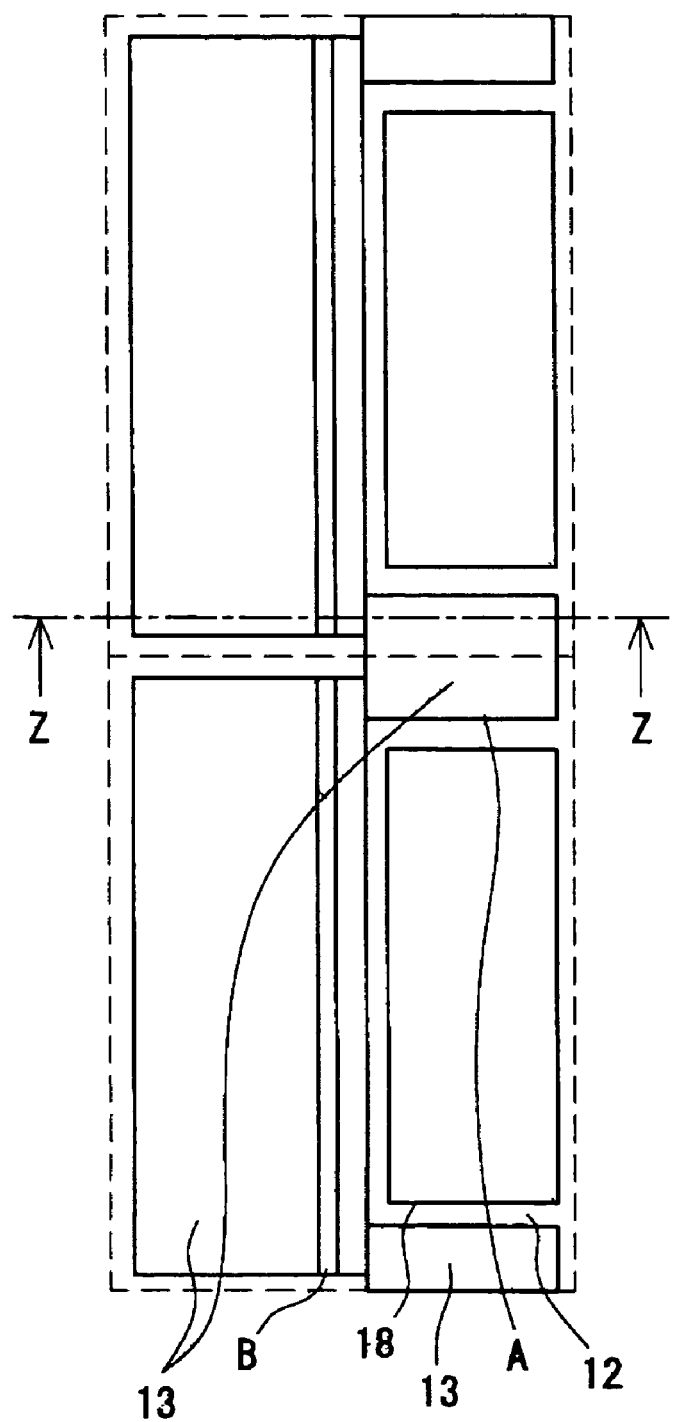
FIG. 11A is a schematic diagram explanatory of another variation of the manufacturing method.
Figure 11B:
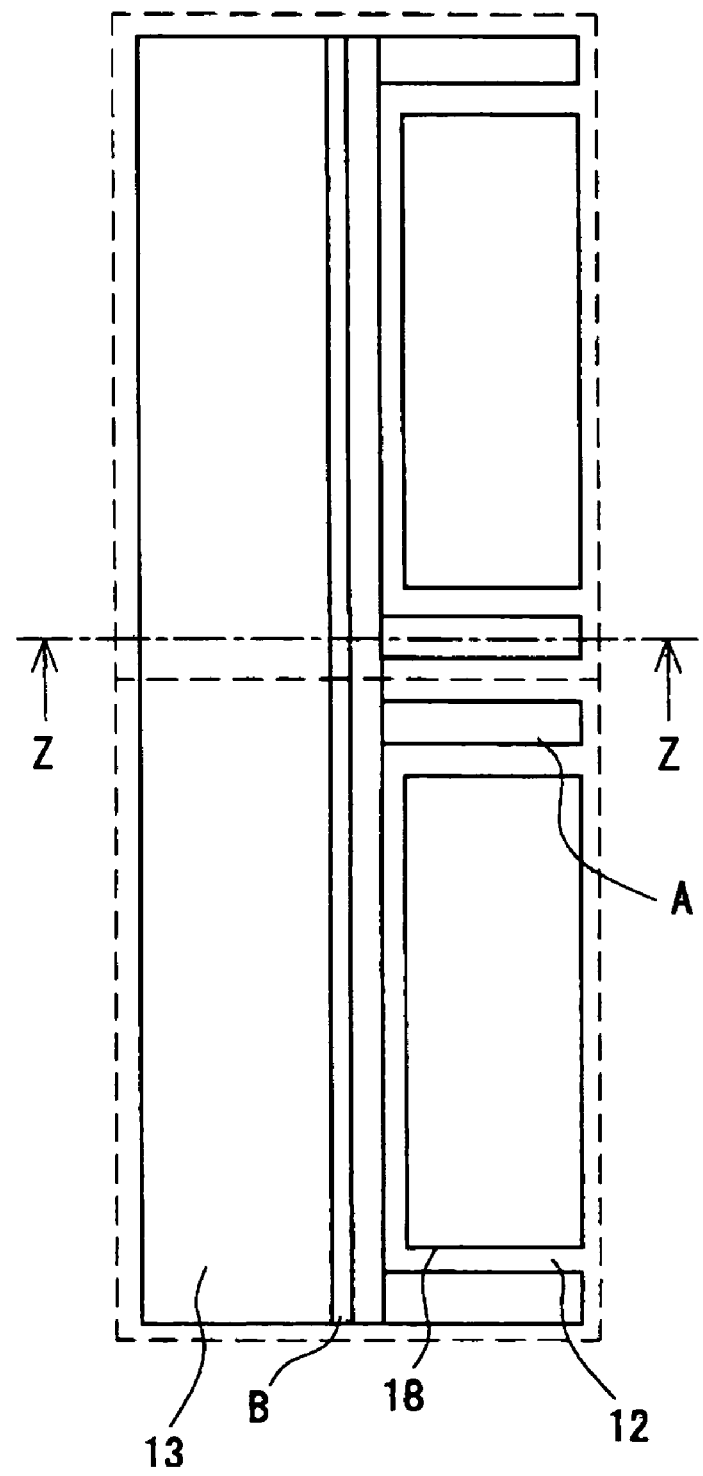
FIG. 11B is a schematic diagram explanatory of another variation of the manufacturing method.
Figure 11C:
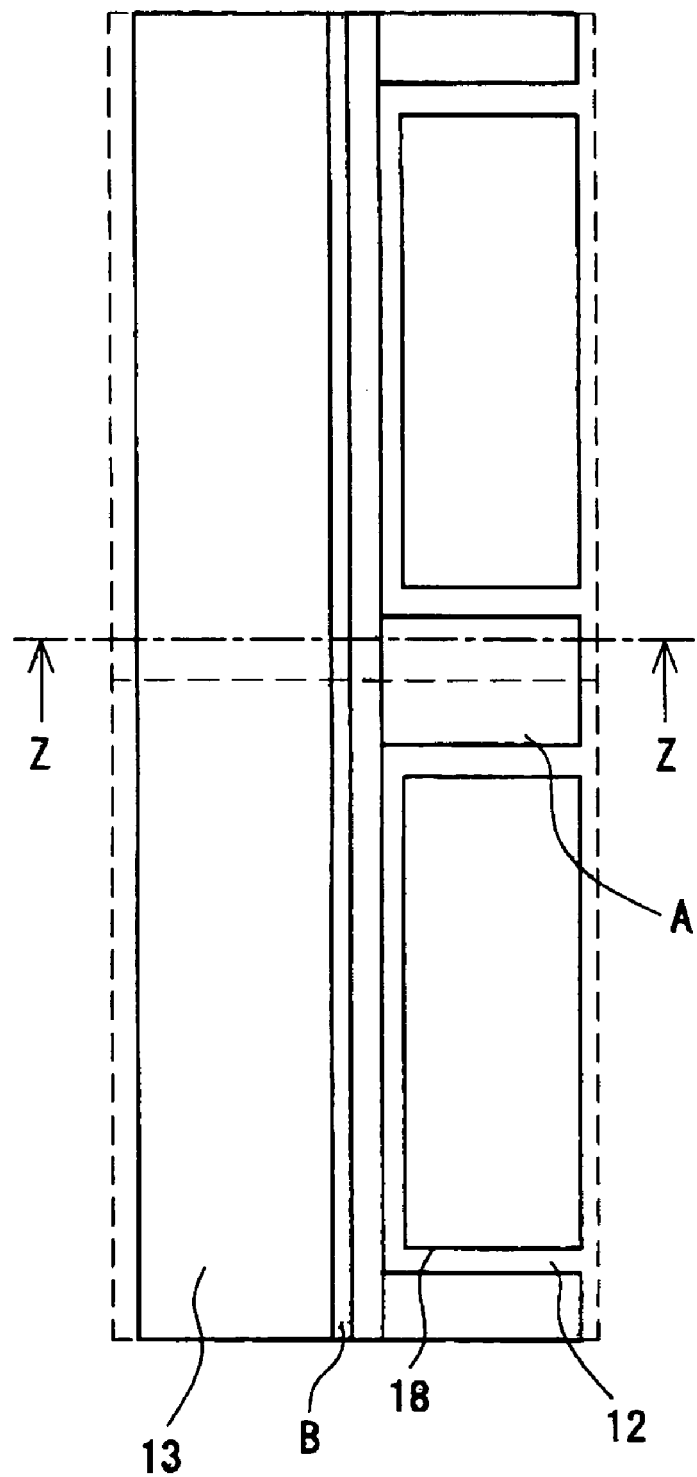
FIG. 11C is a schematic diagram explanatory of another variation of the manufacturing method.
Figure 11D:
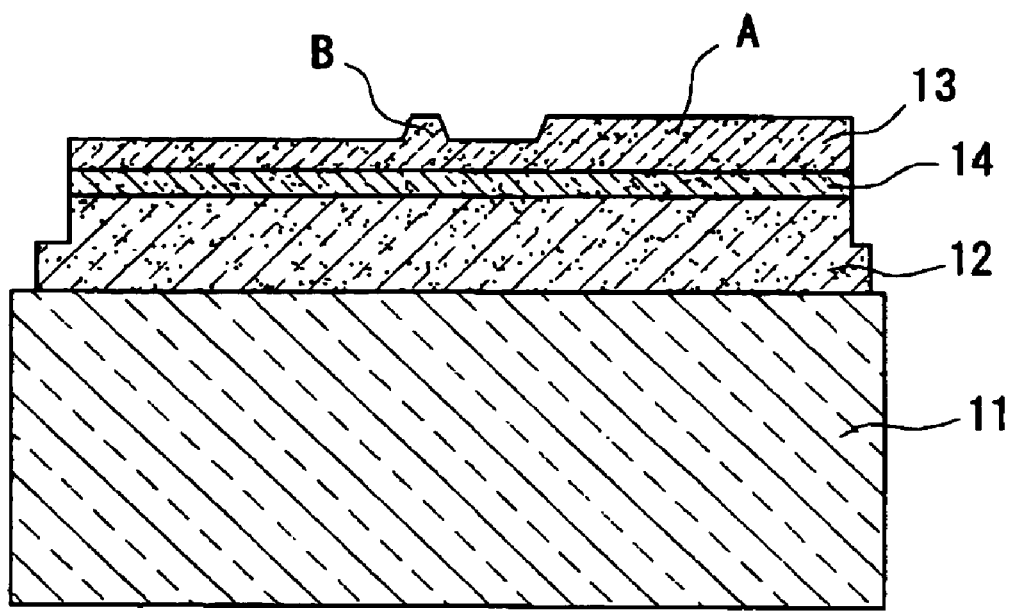
FIG. 11D is a sectional view taken along lines ZZ' in FIG. 11A, B, C.

FIGS. 11A through 11C show examples where the mesa and the n-side protruding portion are formed in a continuous structure in combination of the mesa and the n-side protruding portion shown in FIGS. 10A through 10C. Similarly to the case shown in FIGS. 10A through 10C, section along line ZZ' in the vicinity of the dividing position is as shown in FIG. 11D. By forming the mesa and the n-side protruding portion in a continuous structure, clearance in which the component of the end face protective film infiltrates can be made further smaller.

Figure 4:
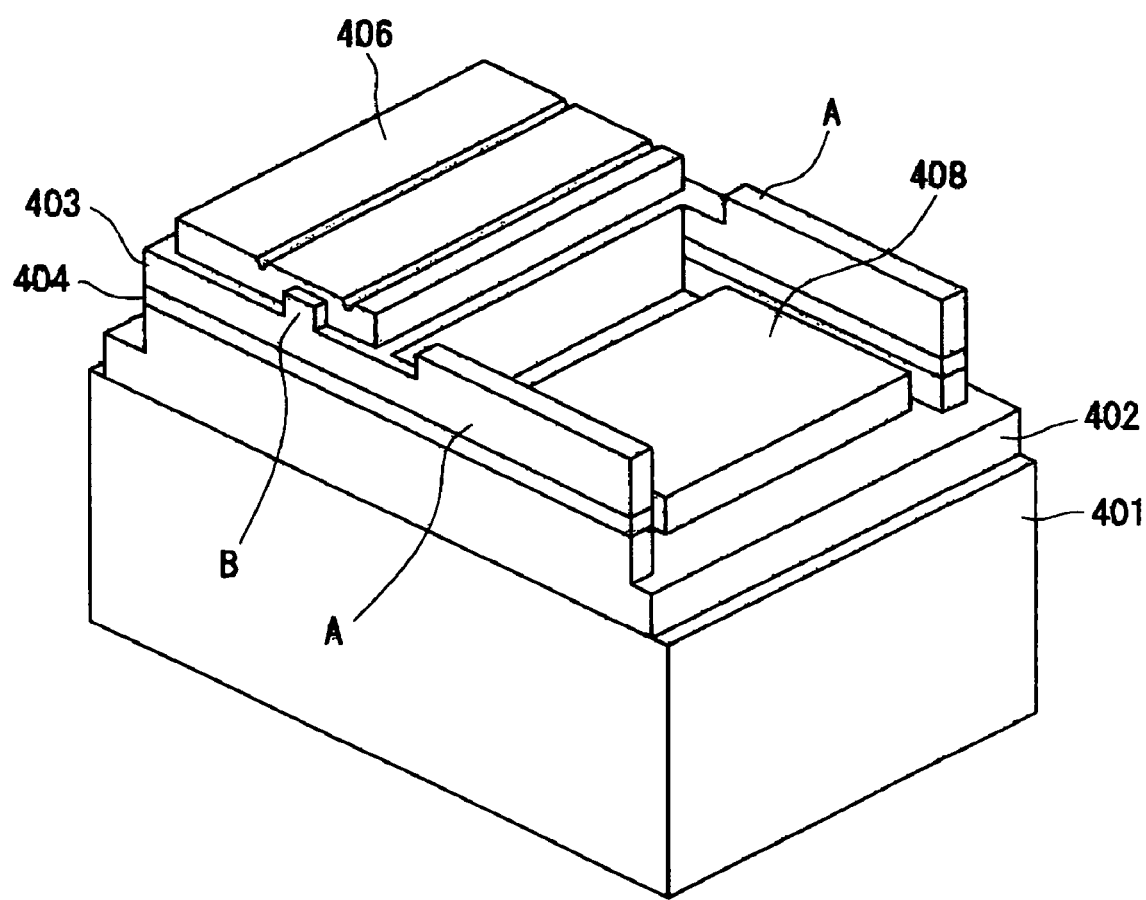
FIG. 4A is a schematic perspective view of a semiconductor laser device according to a fourth embodiment of the present invention.

FIG. 5A through FIG. 10D show cases of forming both the mesa (end face of the resonator) and the n-side protruding portion by etching, which may also be formed by cleaving. The n-side protruding portion and the mesa may be either apart from each other or formed in a continuous structure as shown in FIG. 4.

In case the resonator surface is formed by cleaving, the ridge and the mesa may be extended into the adjacent element in the direction of stripe in the state of wafer, so as to make the protruding portion of the adjacent element from the extended portion. Thus the ridge can be formed with uniform width. While the ridge can be formed by etching, excessive etching tends to occur at the end portion of the ridge thus making it difficult to form the ridge with uniform width. With such a constitution as described above, in contrast, it is made possible to cut off the end portion of the ridge, where it is difficult to control the width, by cleaving when separating the chips, and use the end portion that has been cut off as the protruding portion of the adjacent element. As a result, the ridge having uniform width can be formed on the mesa. For example, the forms shown in FIG. 12A through FIG. 14D can be employed. By employing such patterns, it is made possible to use a part of the ridge, that is formed by etching, as the protruding portion so as to suppress the deposition of the component of the end face protective film on the n electrode. This constitution also stabilizes the optical property.

In case the ridge is formed after forming the mesa, in particular, width of the end portion of the ridge may become uneven due to the step that corresponds to the height of the mesa. However, the ridge can be formed with stable width by using the ridge in the region where width is unstable as the protruding portion of the adjacent element, and cleaving at a position away from the end portion having unstable width.

There may be a case where it is difficult to form the ridge continuously, depending on the property of the semiconductor layer. It cannot be avoided that the mask has a junction, depending on the wafer size and the exposure apparatus used in photolithography. The protruding portion used in preventing the component of the end face protective film from spreading onto the n electrode can be utilized more effectively by taking the fact described above into consideration when forming the protruding portion.

FIG. 12A through FIG. 14D show patterns where the n-side protruding portion prior to division into bars constitutes a part of the mesa. That is, the mesa of one element extends into the adjacent element in the direction of stripe of the waveguide so as to constitute the n-side protruding portion of the adjacent element. The mesa and the n-side protruding portion are separated when the wafer is divided into bars. This variation is intended not only for suppressing the deposition of the component of the end face protective film on the n electrode, but also in consideration of the ridge forming process to be described later and the cleavage of the resonator surface. In either case, the forming process can be carried out easily by adjusting the mask pattern used in forming the mesa.

Figure 12A:
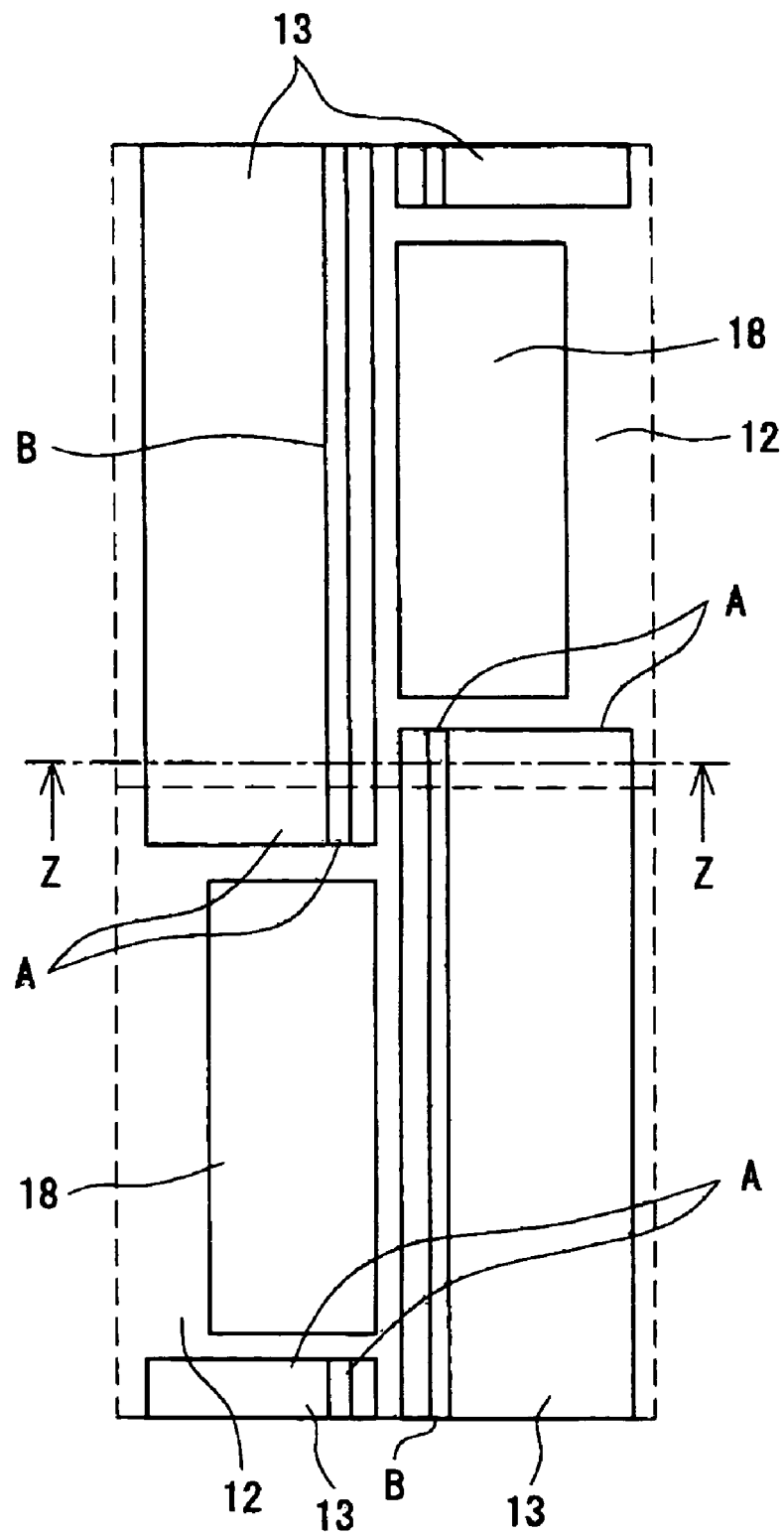
FIG. 12A is a schematic diagram explanatory of another variation of the manufacturing method.

FIG. 12A shows such a pattern as a plurality of mesas longer than the desired resonator length are formed in a staggered arrangement in the direction of stripe, while the end portions of the mesa of the elements that adjoin in the direction of stripe are disposed in such a pattern as overlap at the dividing position. By dividing the wafer into bars at positions in the vicinity of the end portions of the mesas so as to obtain the desired resonator length, the semiconductor laser devices having sectional areas of the shape shown in FIG. 12C are obtained. The n-side protruding portion A has the same structure as the mesa, but does not receive current injection. The ridge will be described later.

Figure 12B:
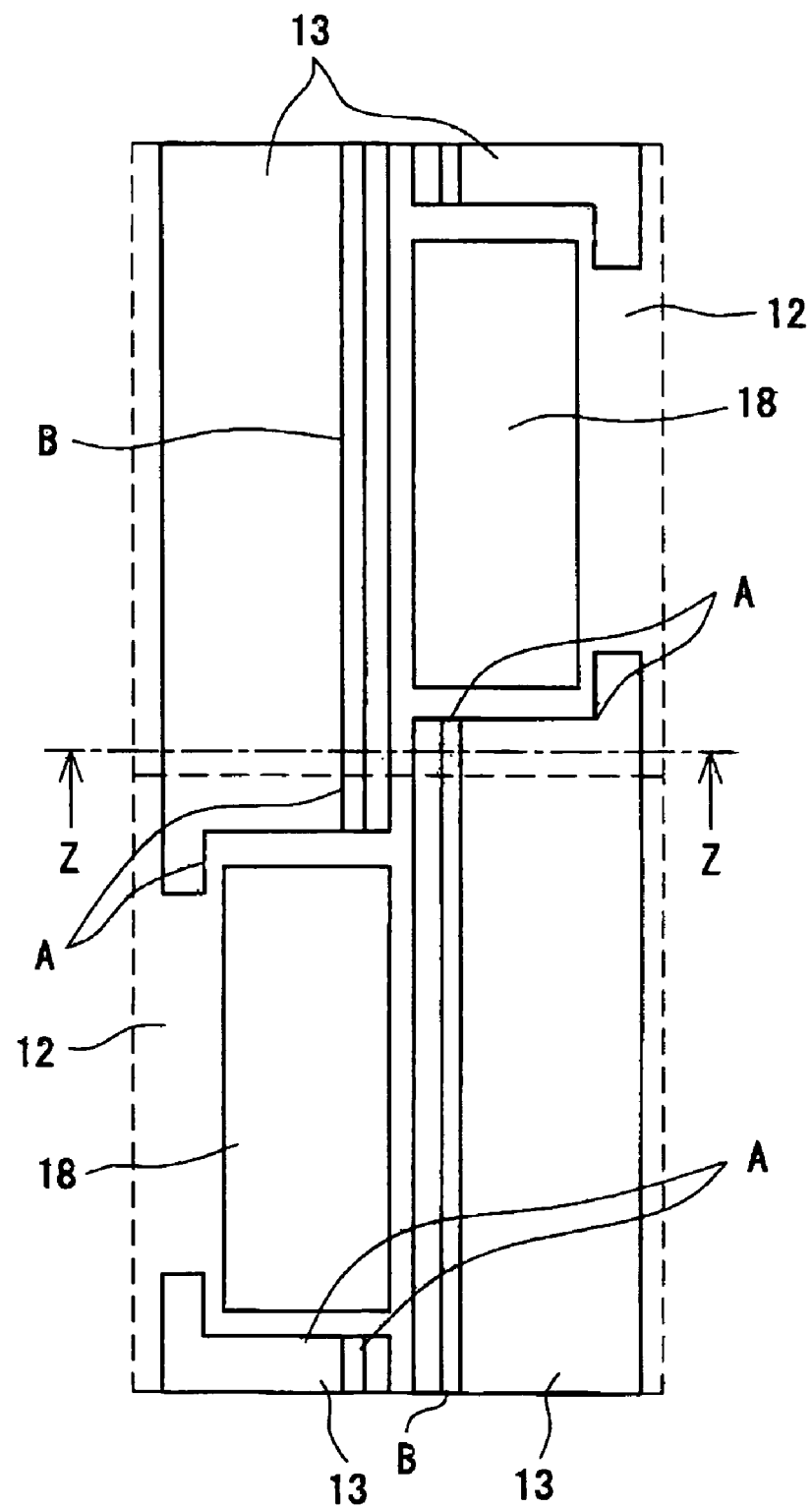
FIG. 12B is a schematic diagram explanatory of another variation of the manufacturing method.
Figure 12C:
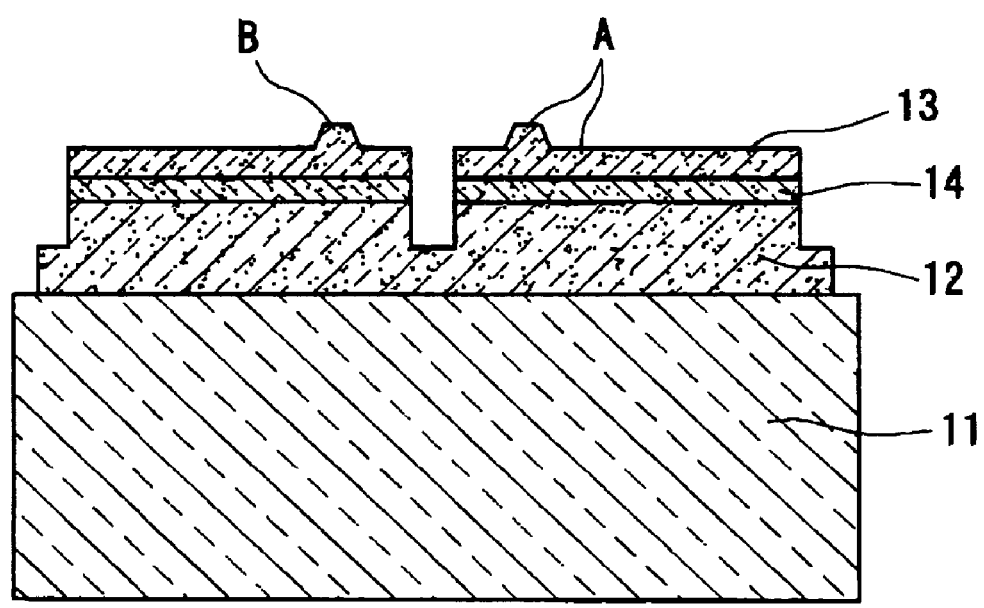
FIG. 12C is a sectional view taken along lines ZZ' in FIG. 12A, B.

FIG. 12B shows a variation where the n-side protruding portion A shown in FIG. 12A is formed so as to extend to the side face of the n electrode 18. This configuration prevents the component of the end face protective film from infiltrating sideways.

Figure 13A:
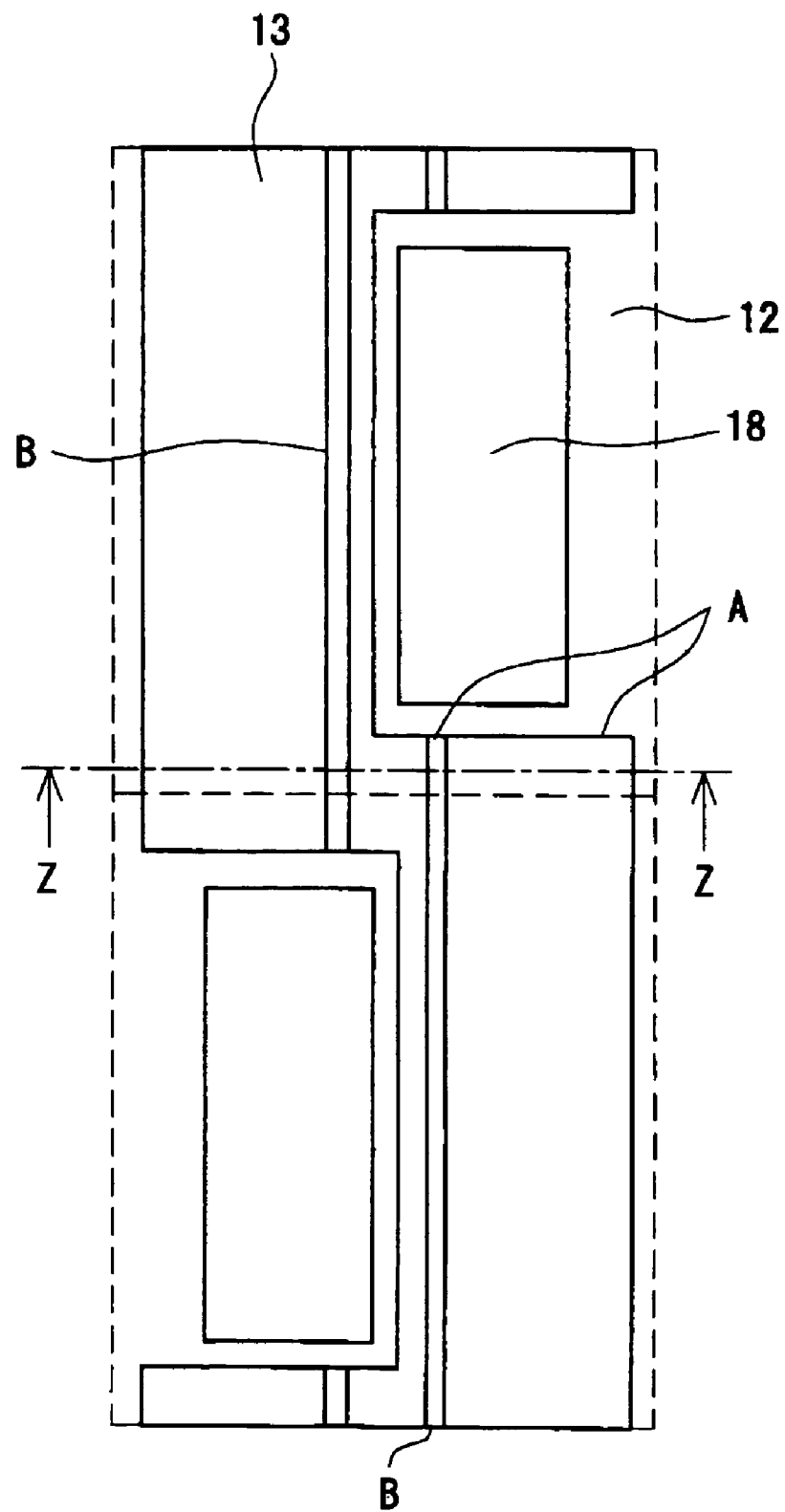
FIG. 13A is a schematic diagram explanatory of another variation of the manufacturing method.
Figure 13B:
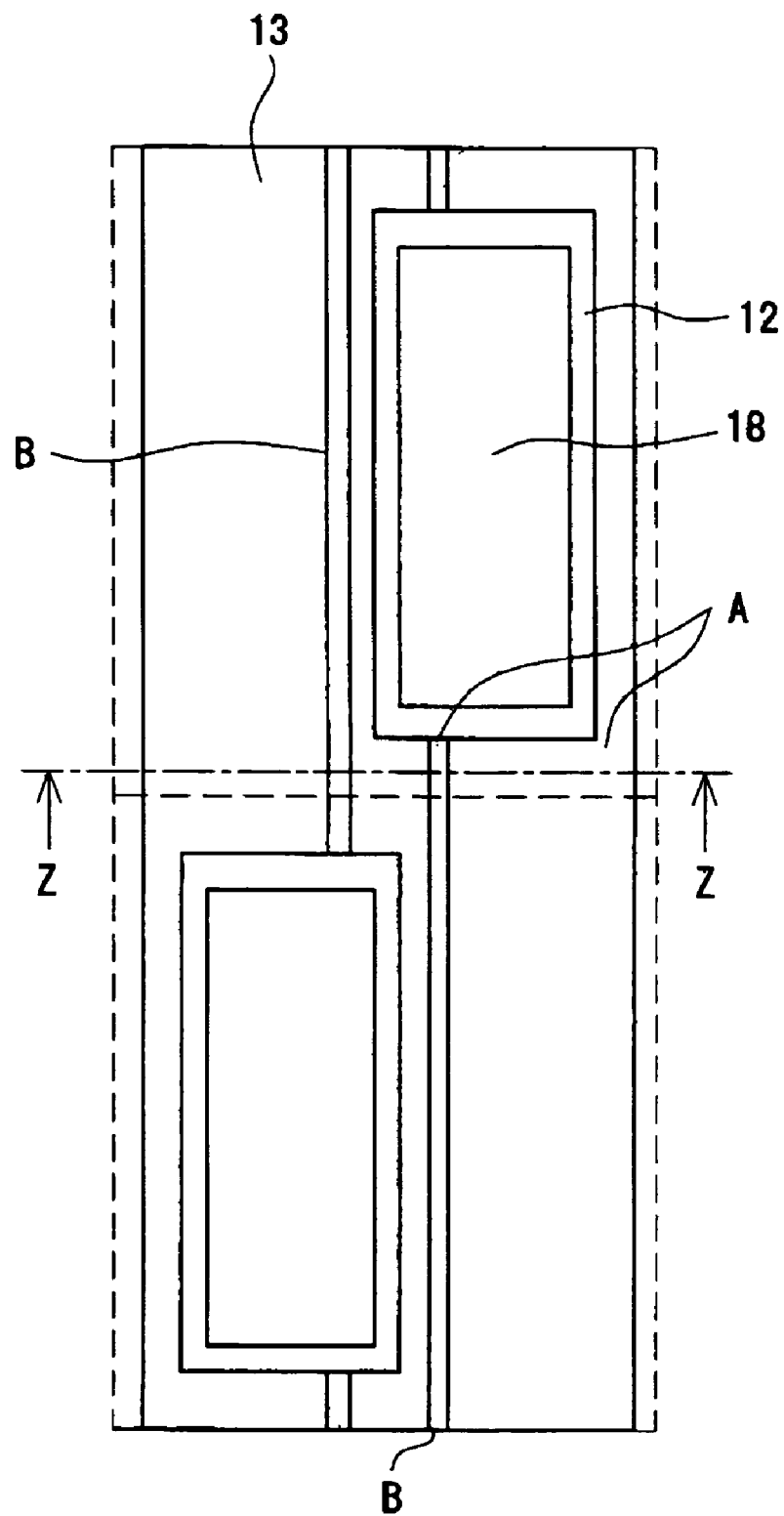
FIG. 13B is a schematic diagram explanatory of another variation of the manufacturing method.
Figure 13C:
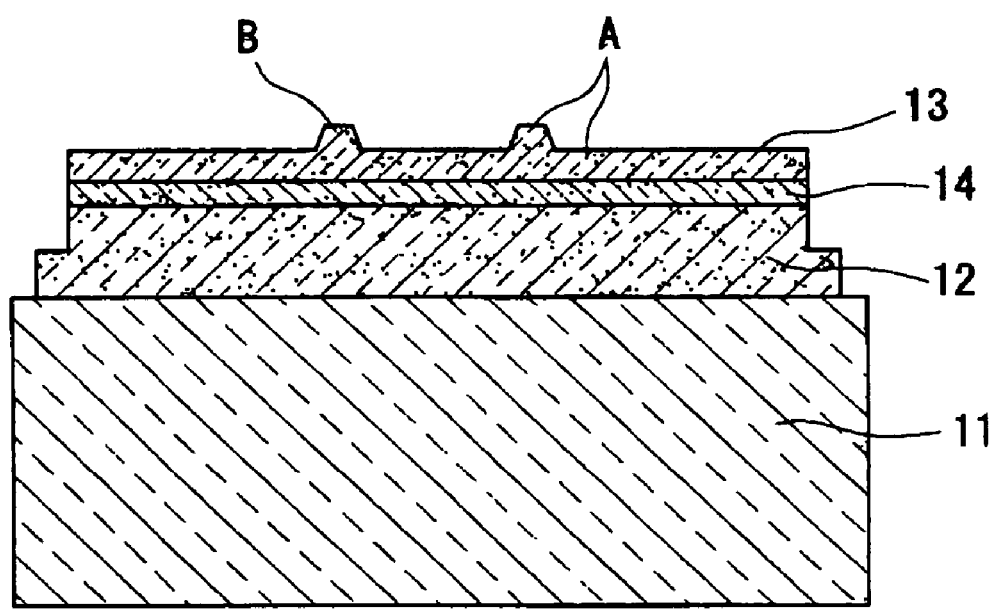
FIG. 13C is a sectional view taken along lines ZZ' in FIG. 13A, B.

FIGS. 13A through 13C show variation where the mesa of FIGS. 12A through 12C and the n-side protruding portion are formed in the same element so as to continue in the lateral direction, with the sectional view shown in FIG. 13C. In FIG. 13B, the n-side protruding portion of FIG. 12B is provided to extend further in the direction of stripe, so as to surround the entire periphery of the n electrode 18. This configuration enables it to suppress the deposition of the component of the end face protective film on the n electrode 18 more effectively.

Figure 14A:
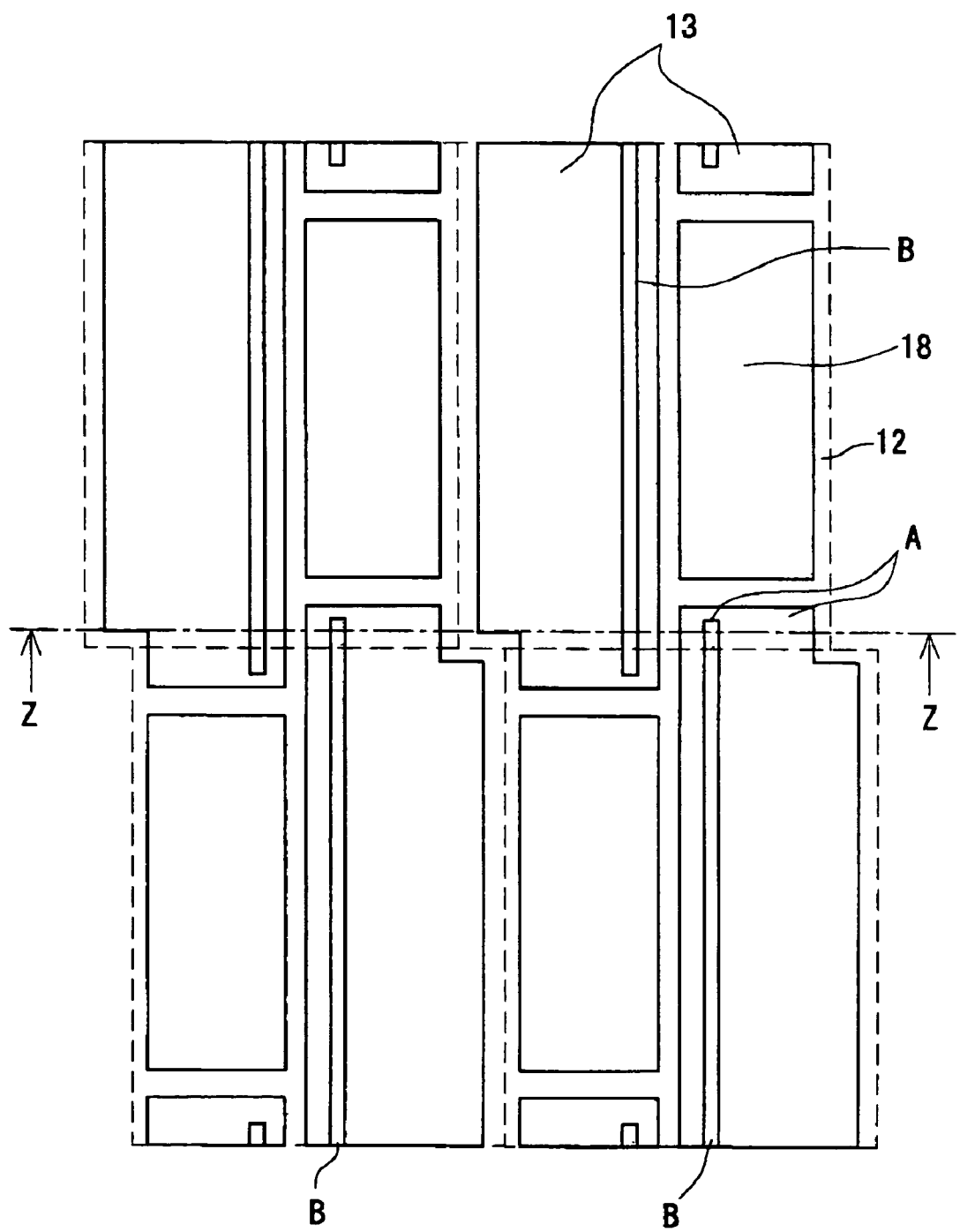
FIG. 14A is a schematic diagram explanatory of another variation of the manufacturing method.
Figure 14B:
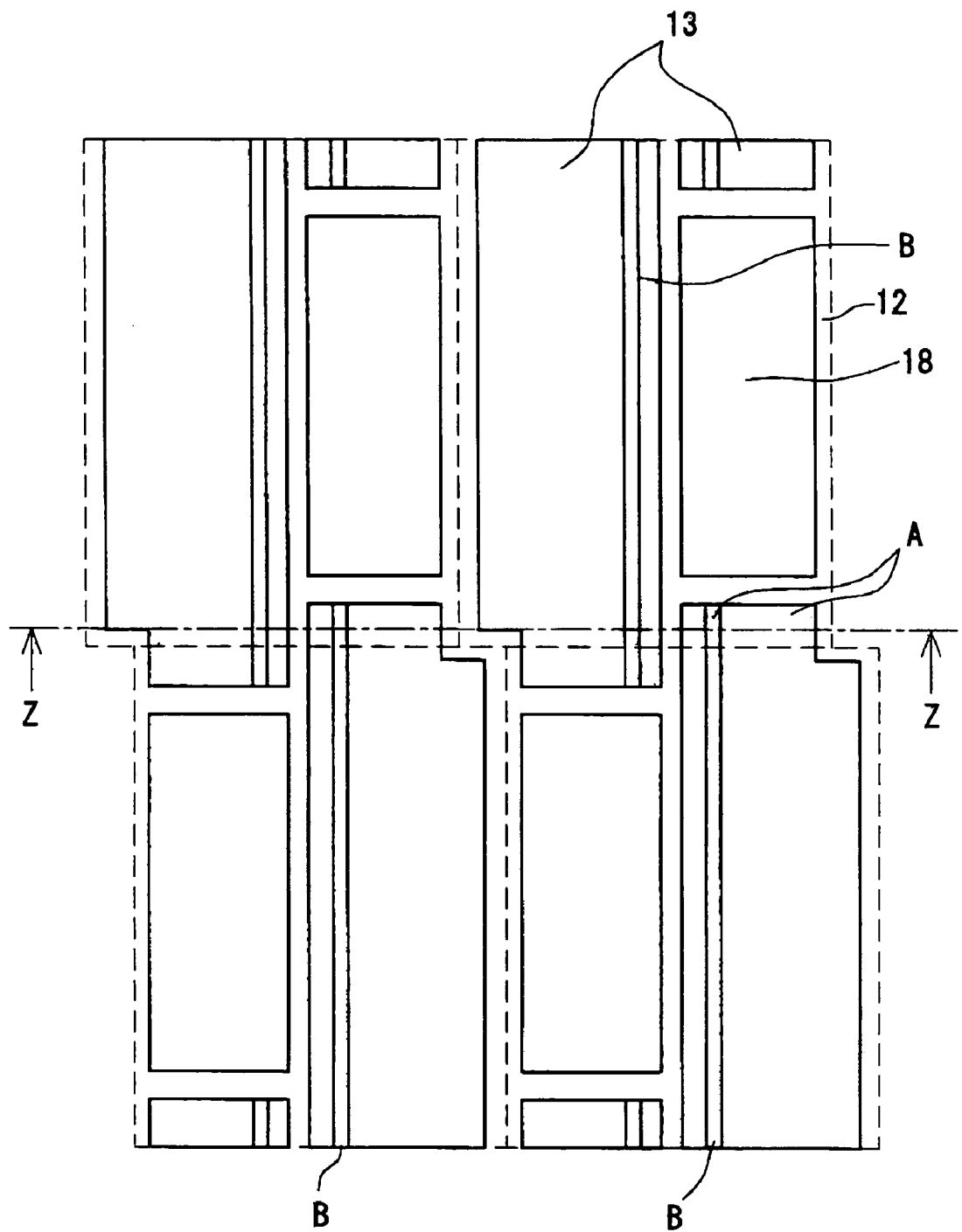
FIG. 14B is a schematic diagram explanatory of another variation of the manufacturing method.
Figure 14C:
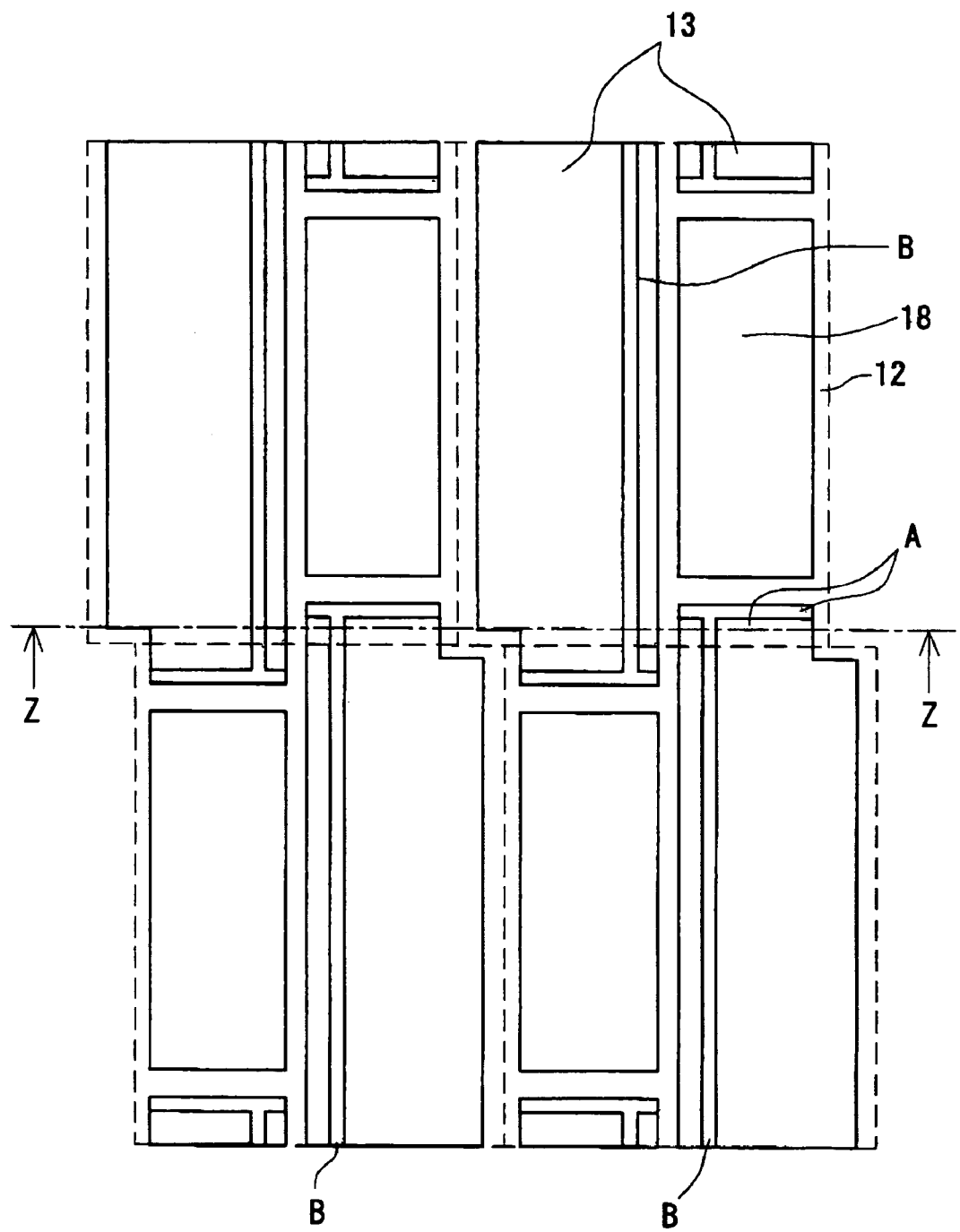
FIG. 14C is a schematic diagram explanatory of another variation of the manufacturing method.

FIGS. 14A through 14C show further variation of FIGS. 12A and 13A, where the mesa is made narrower at the dividing position than in other regions. As shown in FIG. 14C, the chip made in this way has the n-side protruding portion A of the same structure as the mesa with smaller width than that of the mesa. By forming in such a pattern, it is made possible to make the element size (width) smaller so that a larger number of chips can be made from one wafer. It is also made easier to divide into chips since the semiconductor has a smaller width at the position of dividing into bars (cleaving position).

Figure 15A:
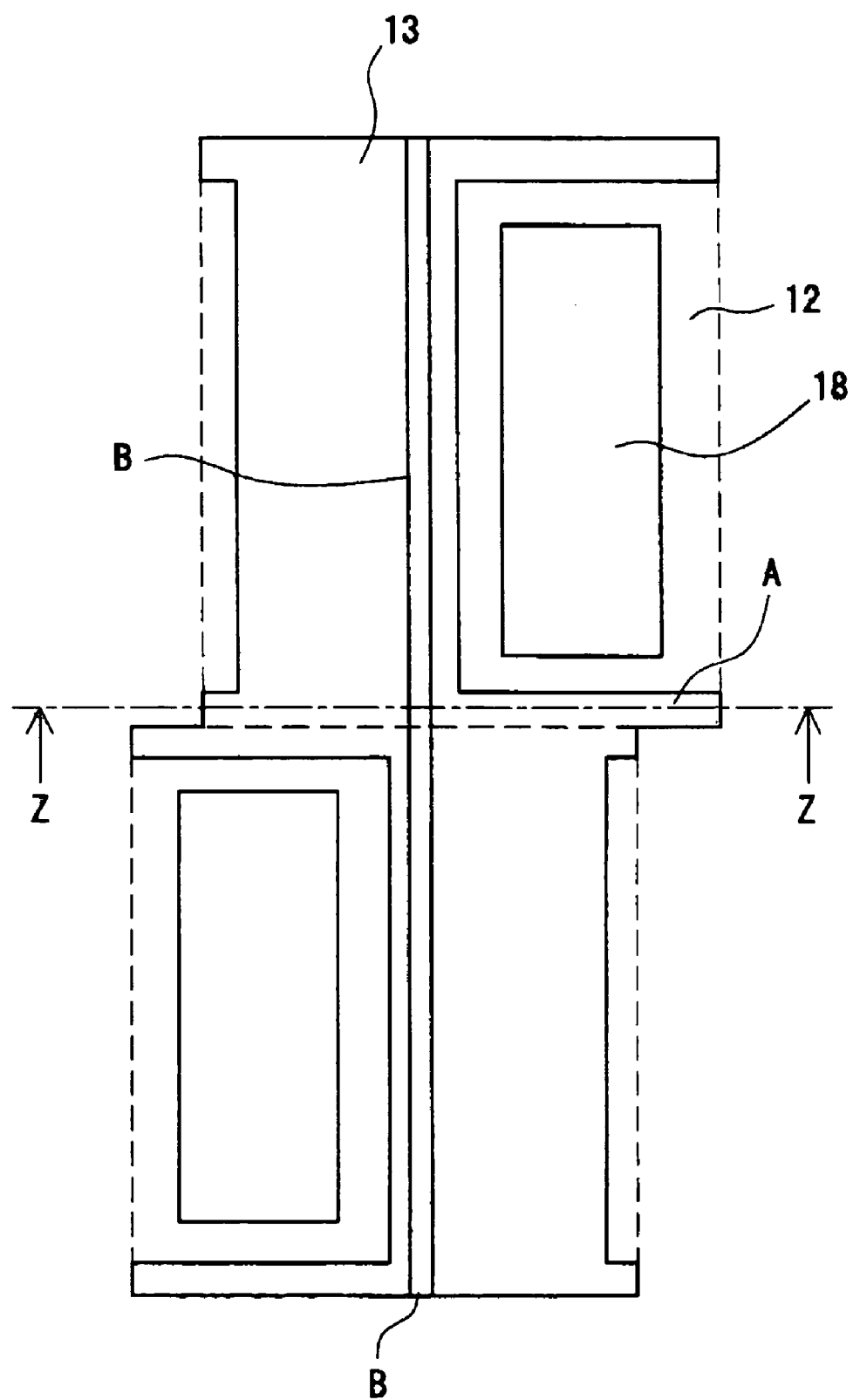
FIG. 15A is a schematic diagram explanatory of another variation of the manufacturing method.
Figure 15B:
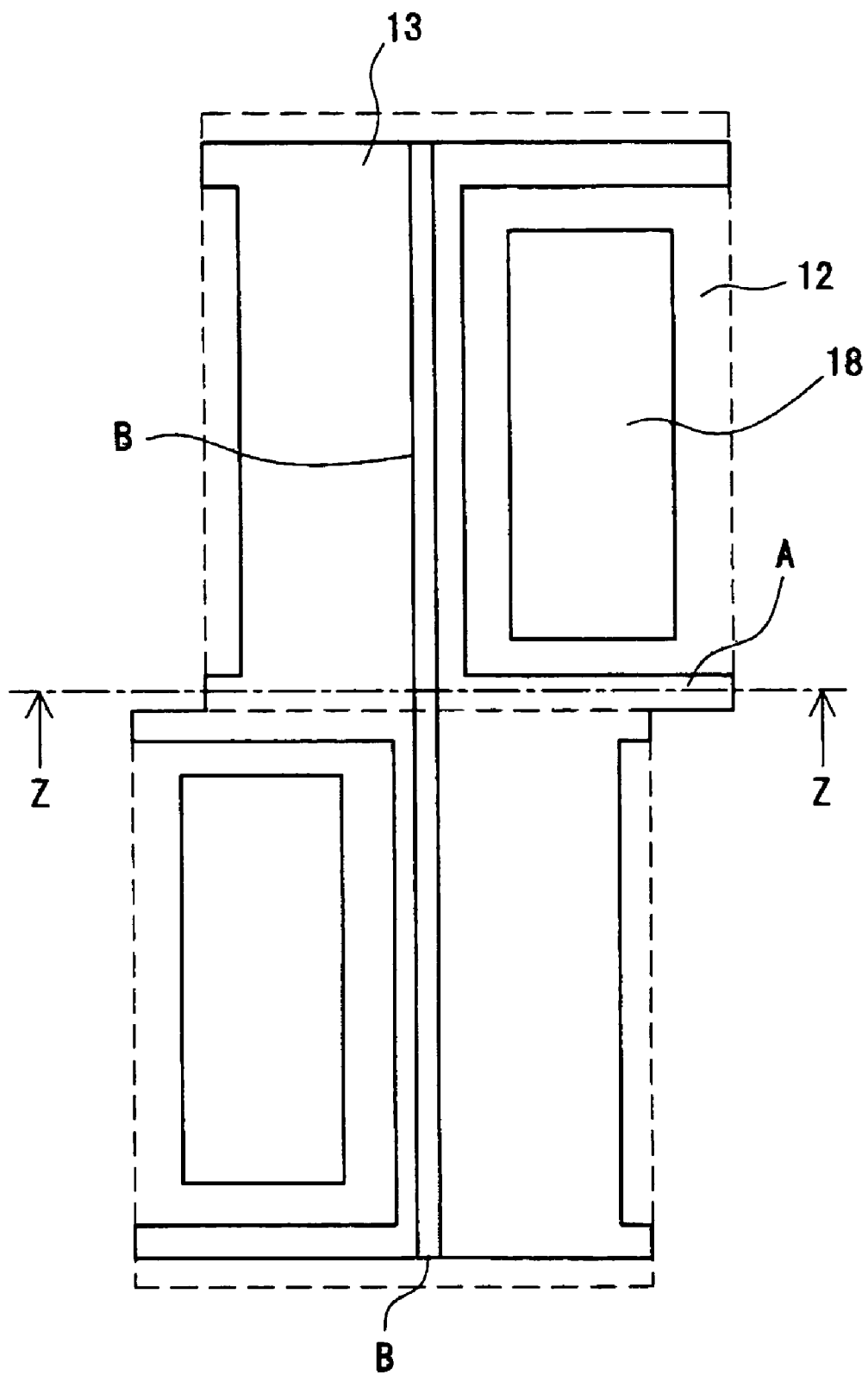
FIG. 15B is a schematic diagram explanatory of another variation of the manufacturing method.
Figure 15C:
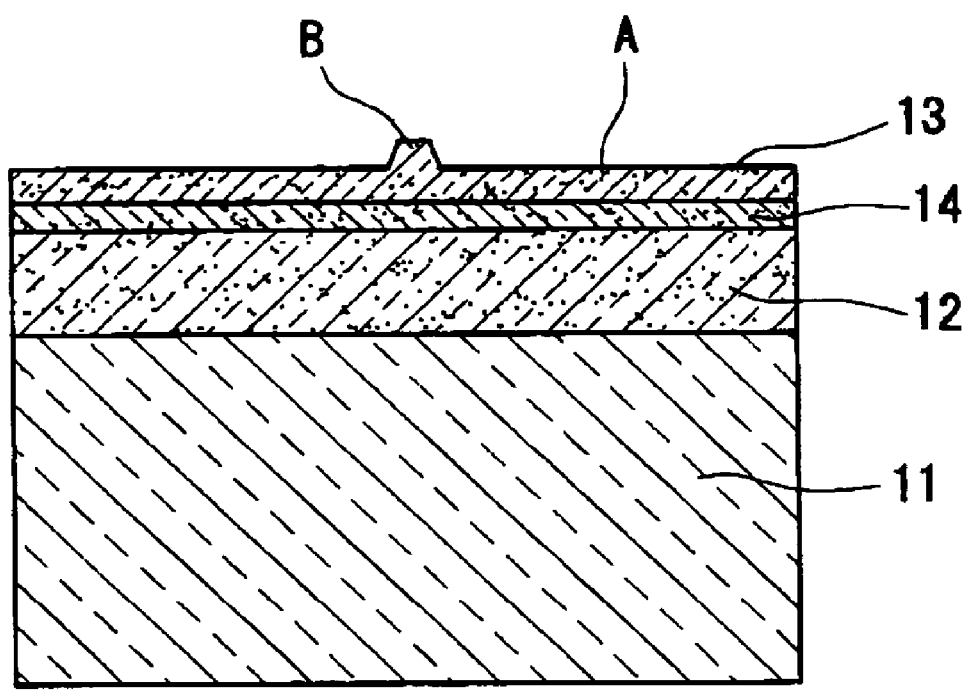
FIG. 15C is a sectional view taken along lines ZZ' in FIG. 15A, B.
Figure 16A:
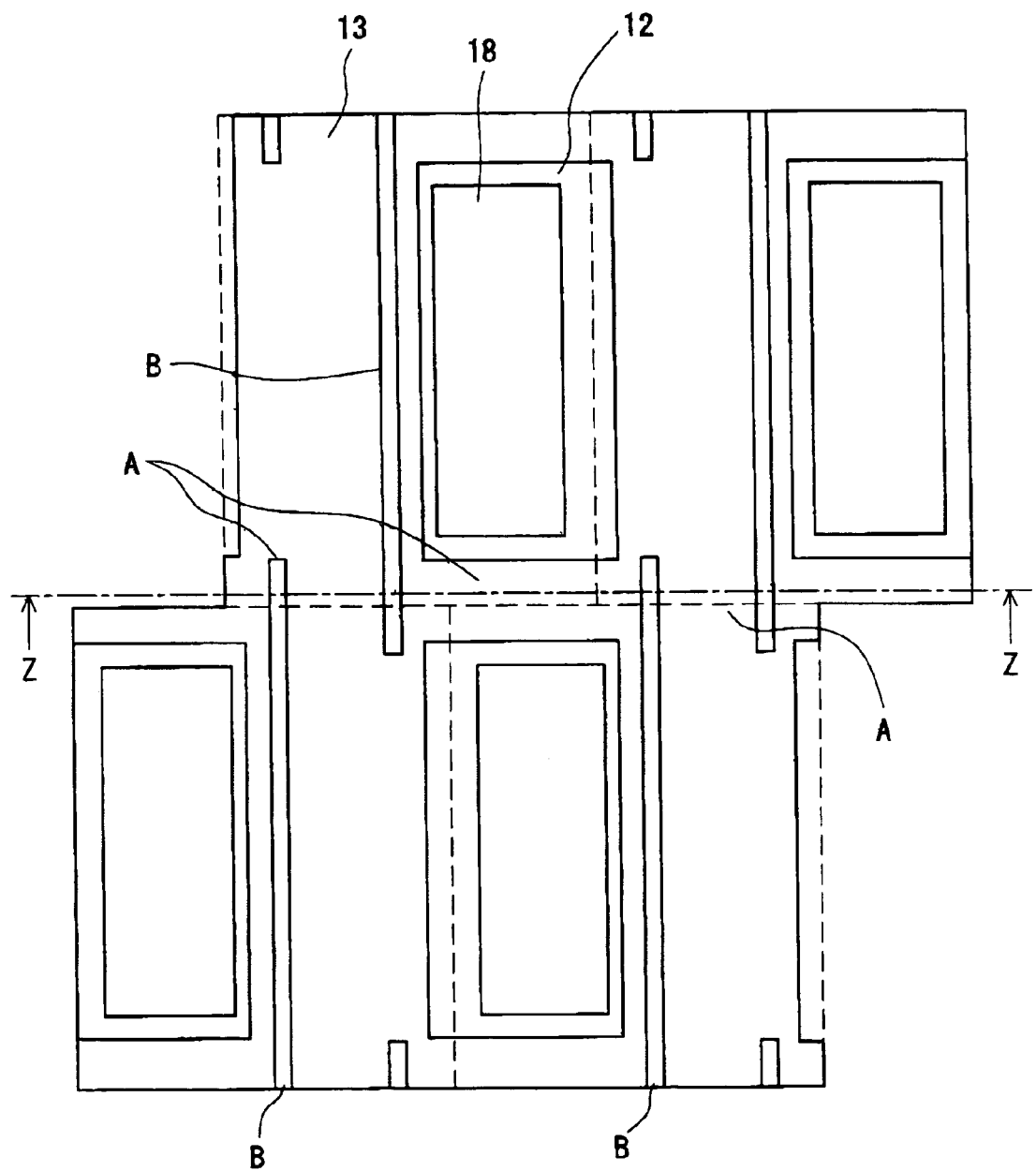
FIG. 16A is a schematic diagram explanatory of another variation of the manufacturing method.
Figure 16B:
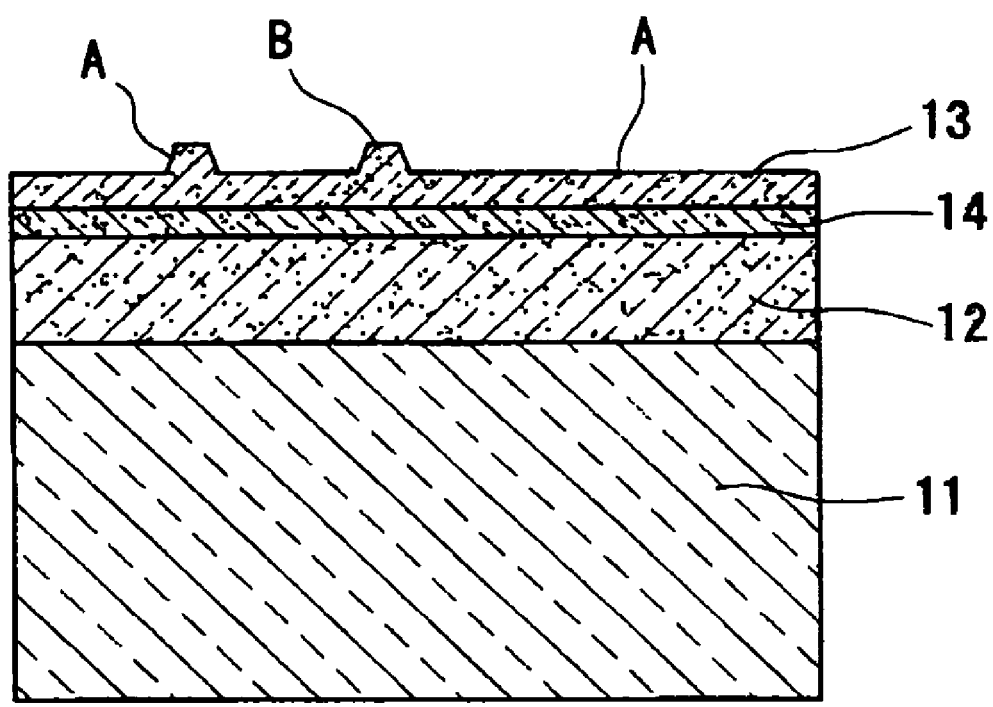
FIG. 16B is a sectional view taken along lines ZZ' in FIG. 16A.
Figure 17A:
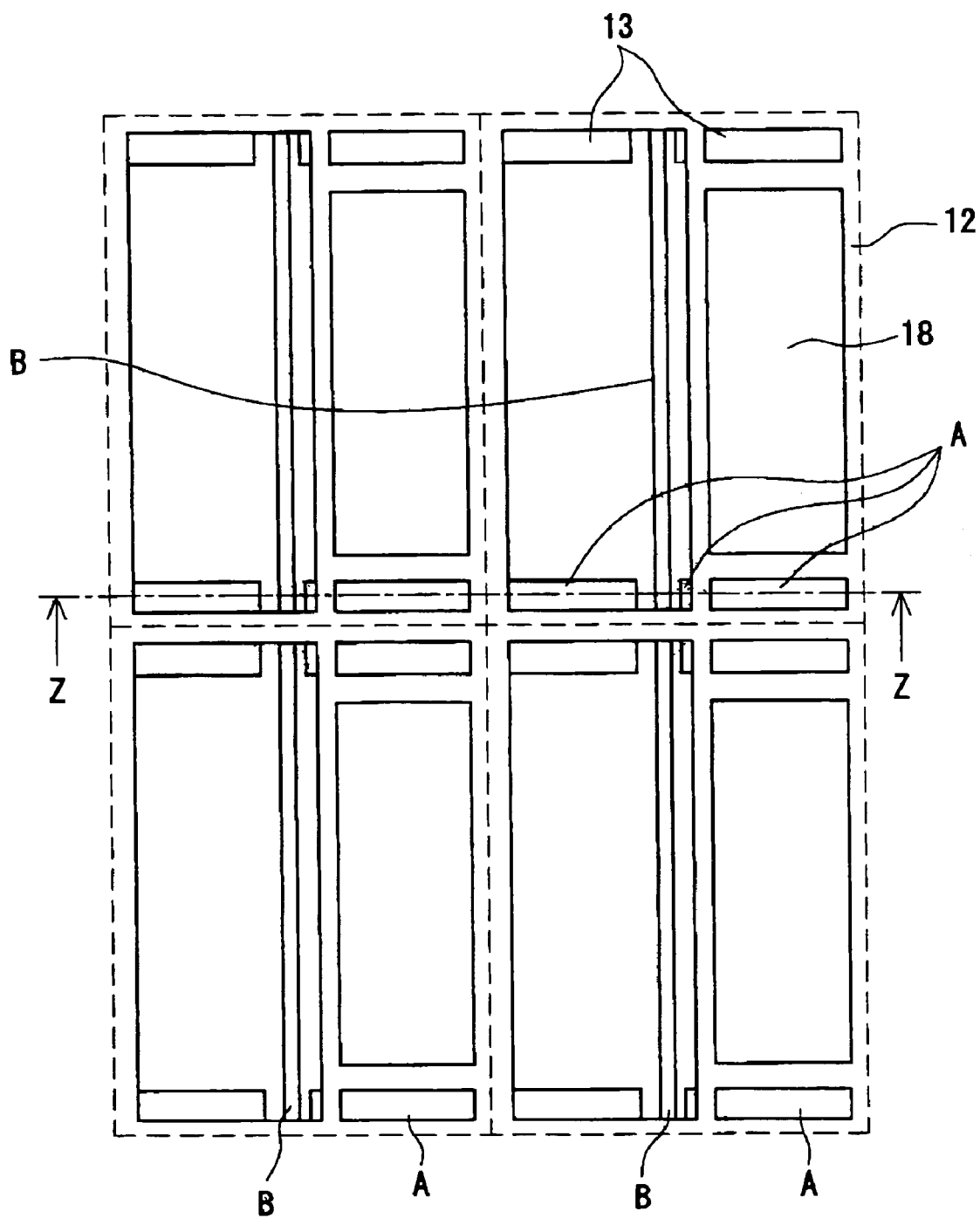
FIG. 17A is a schematic diagram explanatory of another variation of the manufacturing method.
Figure 17B:
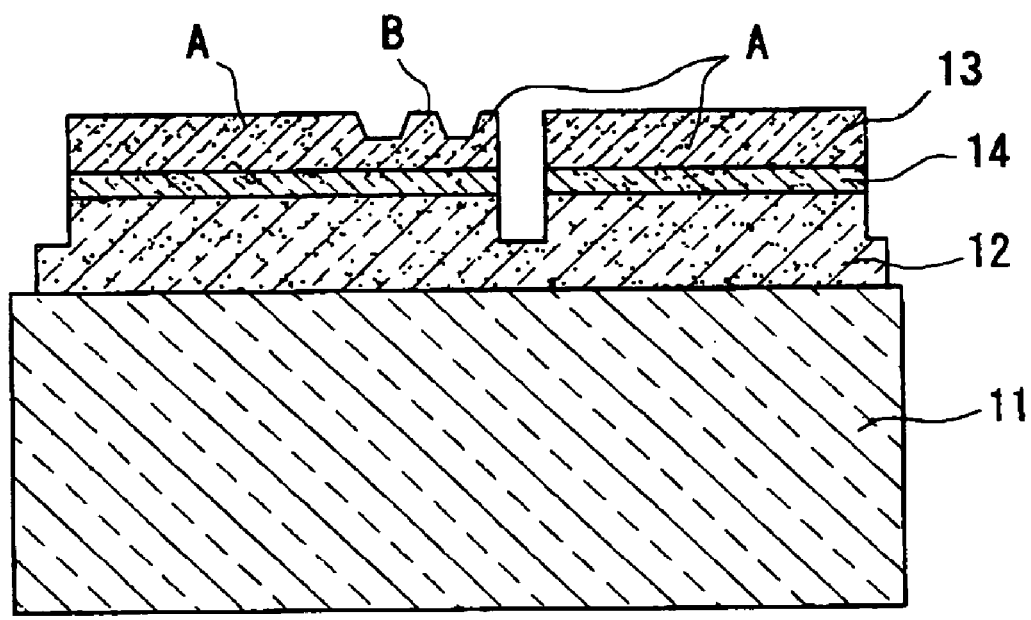
FIG. 17B is a sectional view taken along lines ZZ' in FIG. 17A.
Figure 18A:
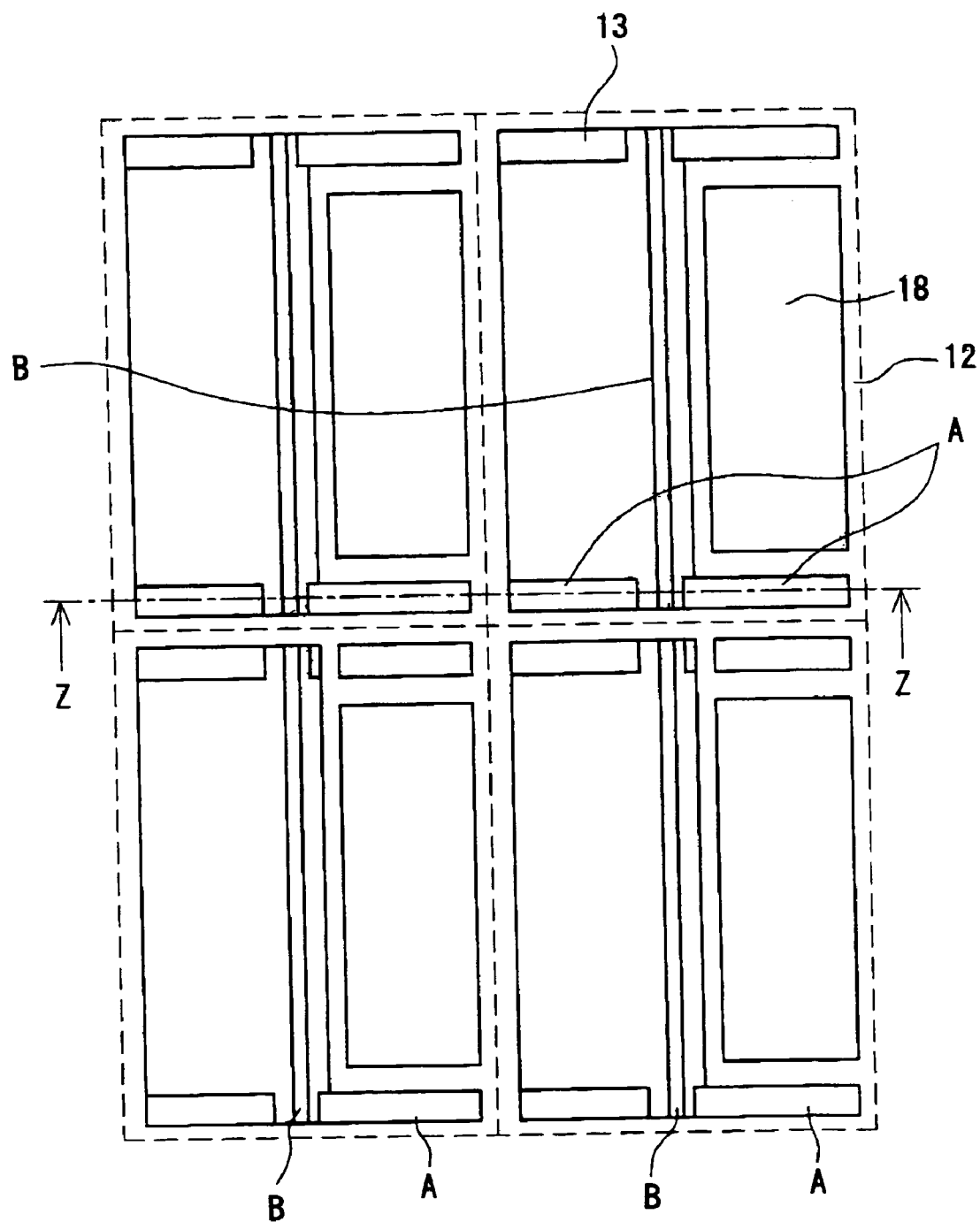
FIG. 18A is a schematic diagram explanatory of another variation of the manufacturing method.
Figure 18B:
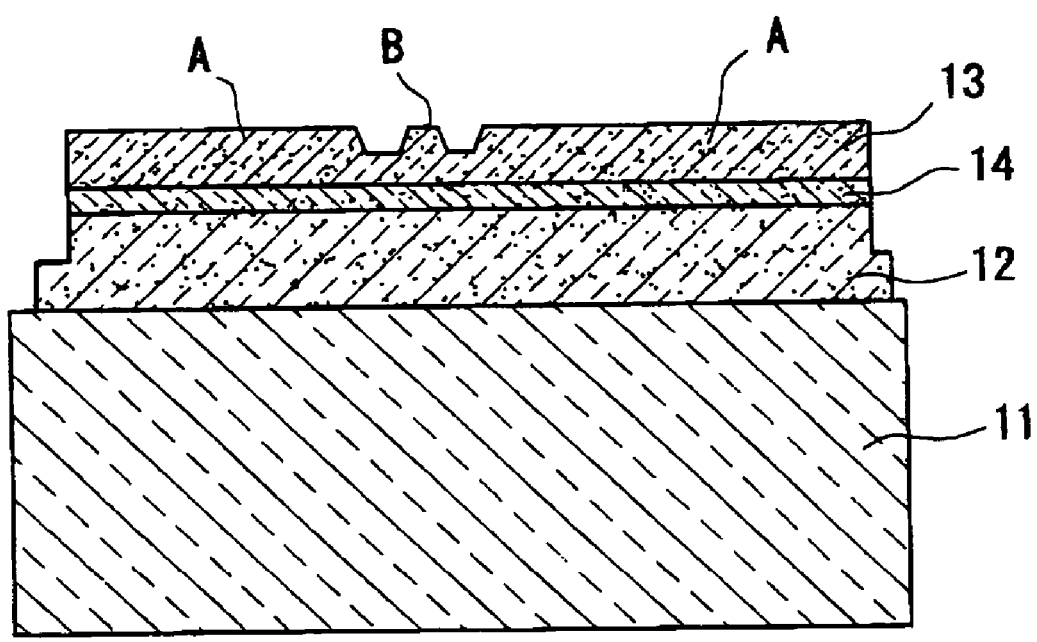
FIG. 18B is a sectional view taken along lines ZZ' in FIG. 18A.
Figure 19A:
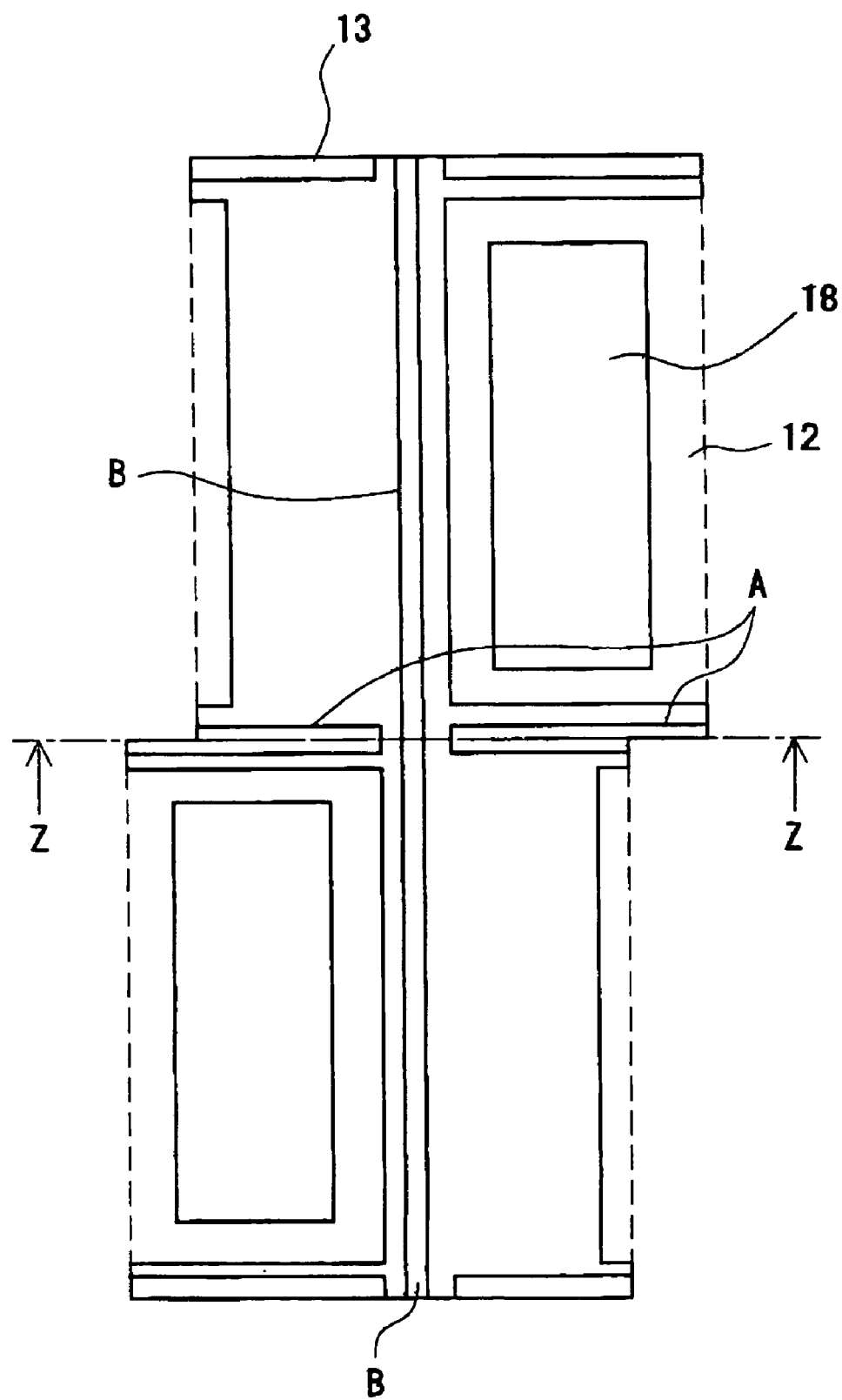
FIG. 19A is a schematic diagram explanatory of another variation of the manufacturing method.
Figure 19B:
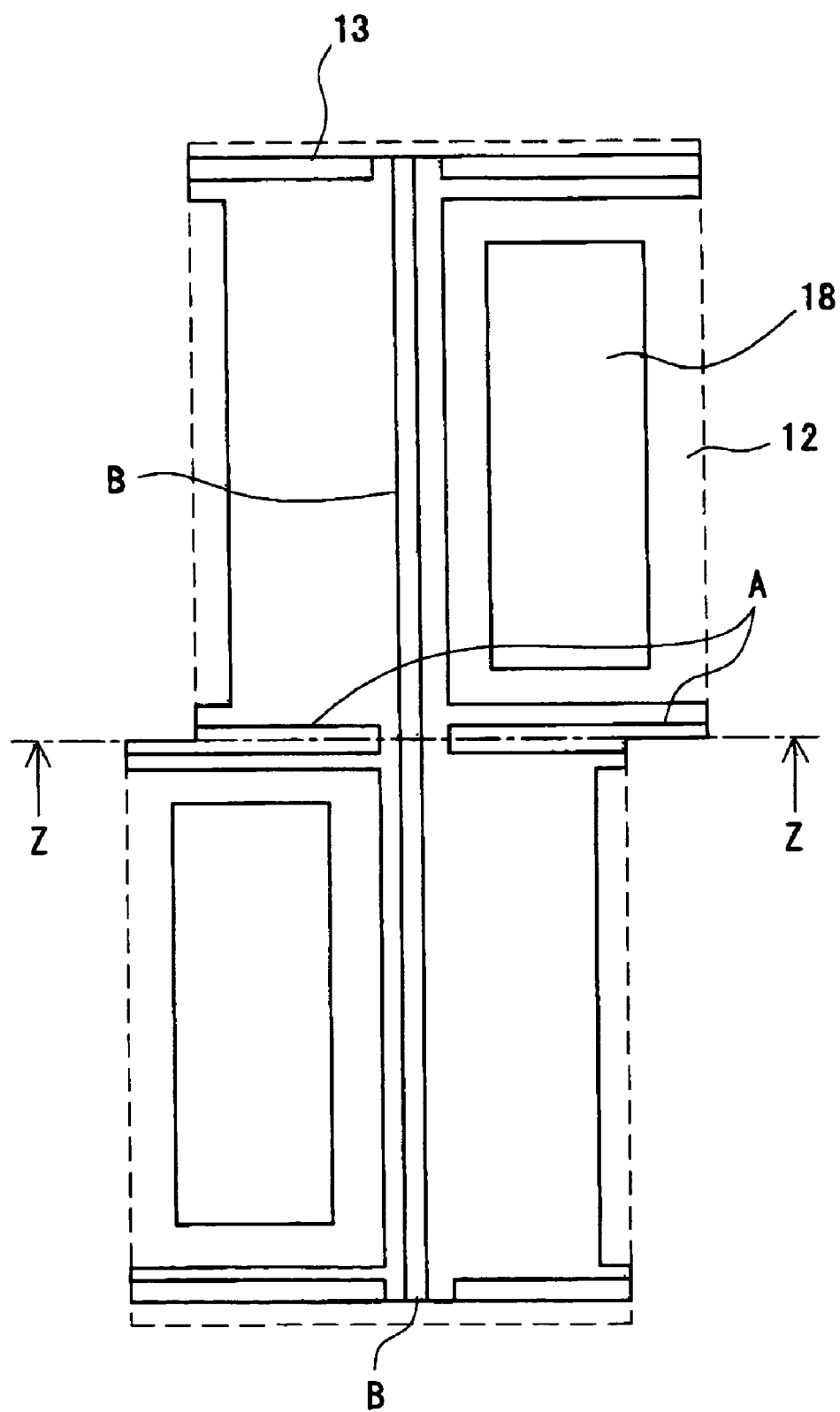
FIG. 19B is a schematic diagram explanatory of another variation of the manufacturing method.
Figure 19C:
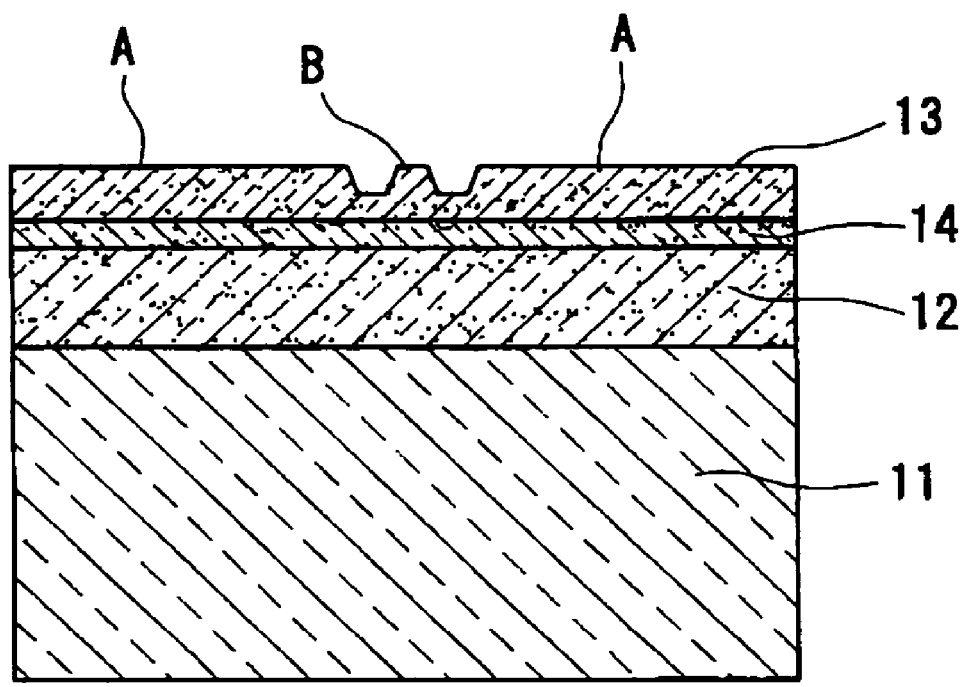
FIG. 19C is a sectional view taken along lines ZZ' in FIG. 19A, B.
Figure 20A:
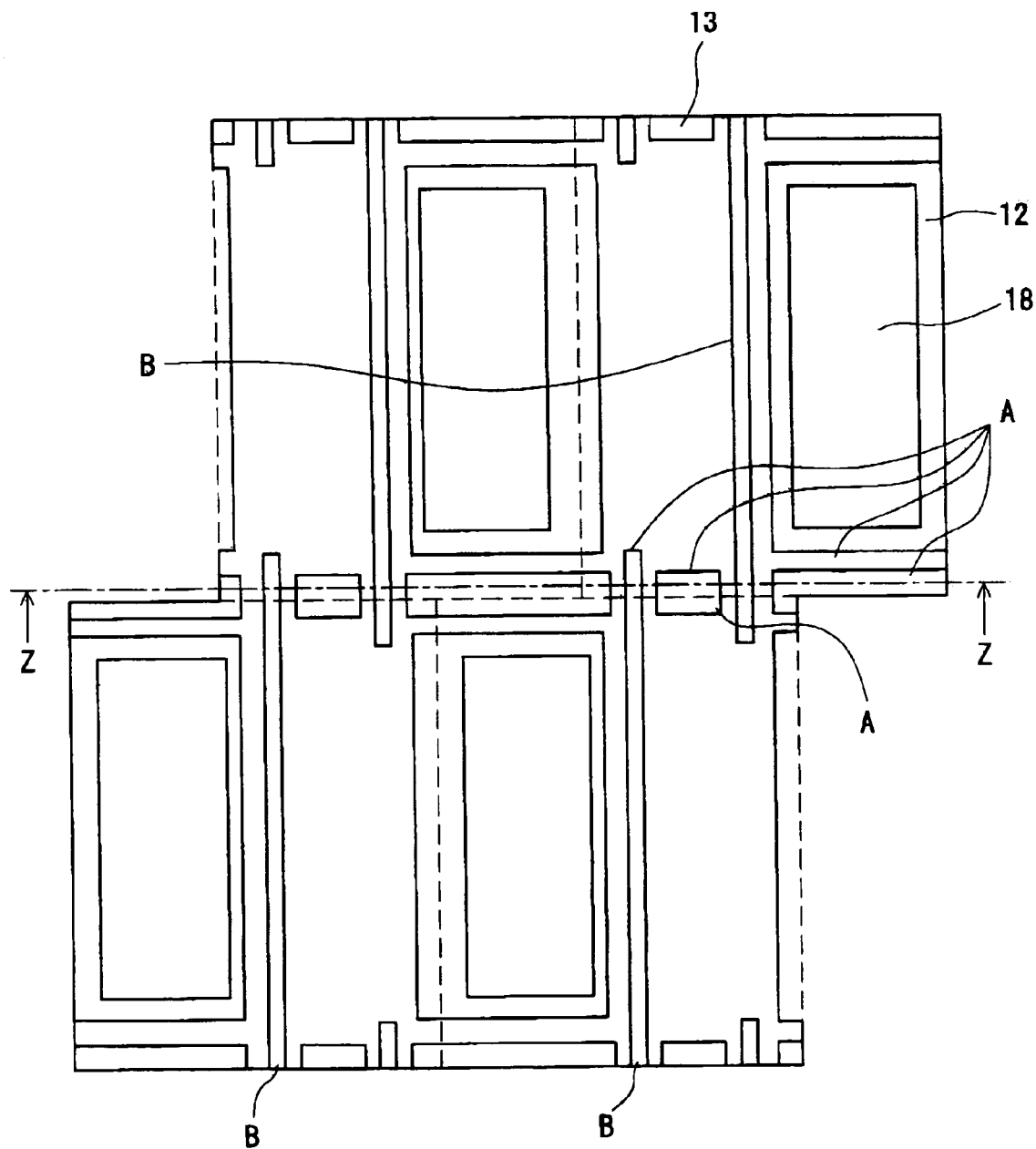
FIG. 20A is a schematic diagram explanatory of another variation of the manufacturing method.
Figure 20B:
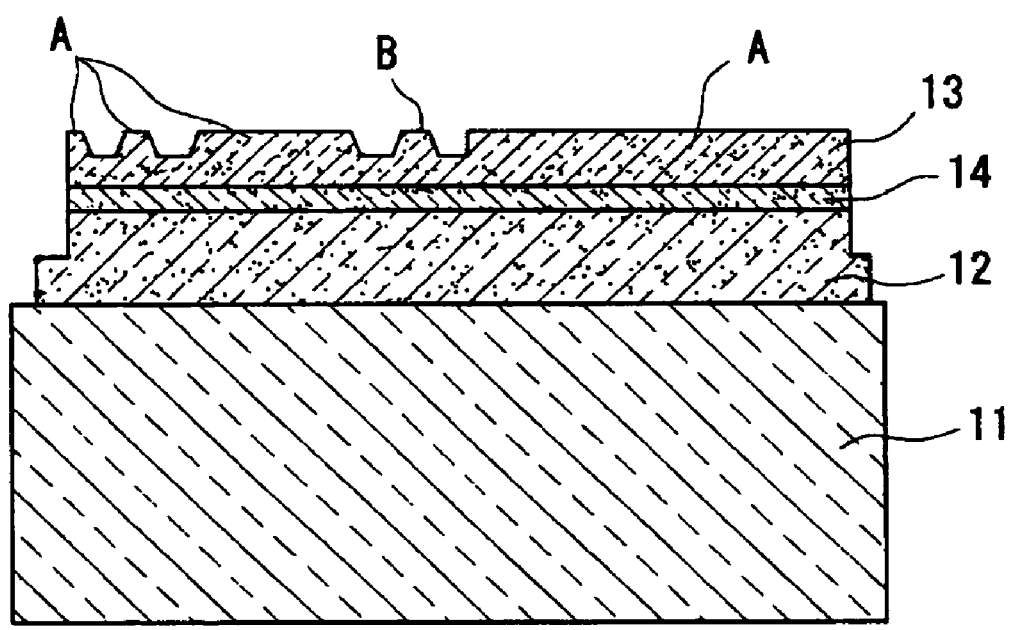
FIG. 20B is a sectional view taken along lines ZZ' in FIG. 20A.

FIGS. 15A through 15C show an example where the cleavage surfaces created by dividing into bars are used as the resonator surfaces. It is different from that shown in FIG. 11C in that the elements that are adjacent to each other in the direction of stripe have the n electrodes at different positions. Thus although the element divided into individual chip has the same configuration, the optimum pattern can be selected by taking other factors into consideration. This holds true also in the case where the ridges are not continuous as shown in FIGS. 16A and 16B.

While FIG. 15A shows a case where both the end faces of the mesa on the light extracting side and the reflector side correspond with the dividing positions, namely formed by cleaving, FIG. 15B shows a case where one end face (dividing position near line ZZ') is formed by cleaving but the other end face is formed by etching. Thus it is not necessary to form both end faces of the resonator by the same method, cleaving or etching, and optimum combination of the end face forming methods may be selected depending on the target property and the process.

Embodiment 3

Figure 3A:
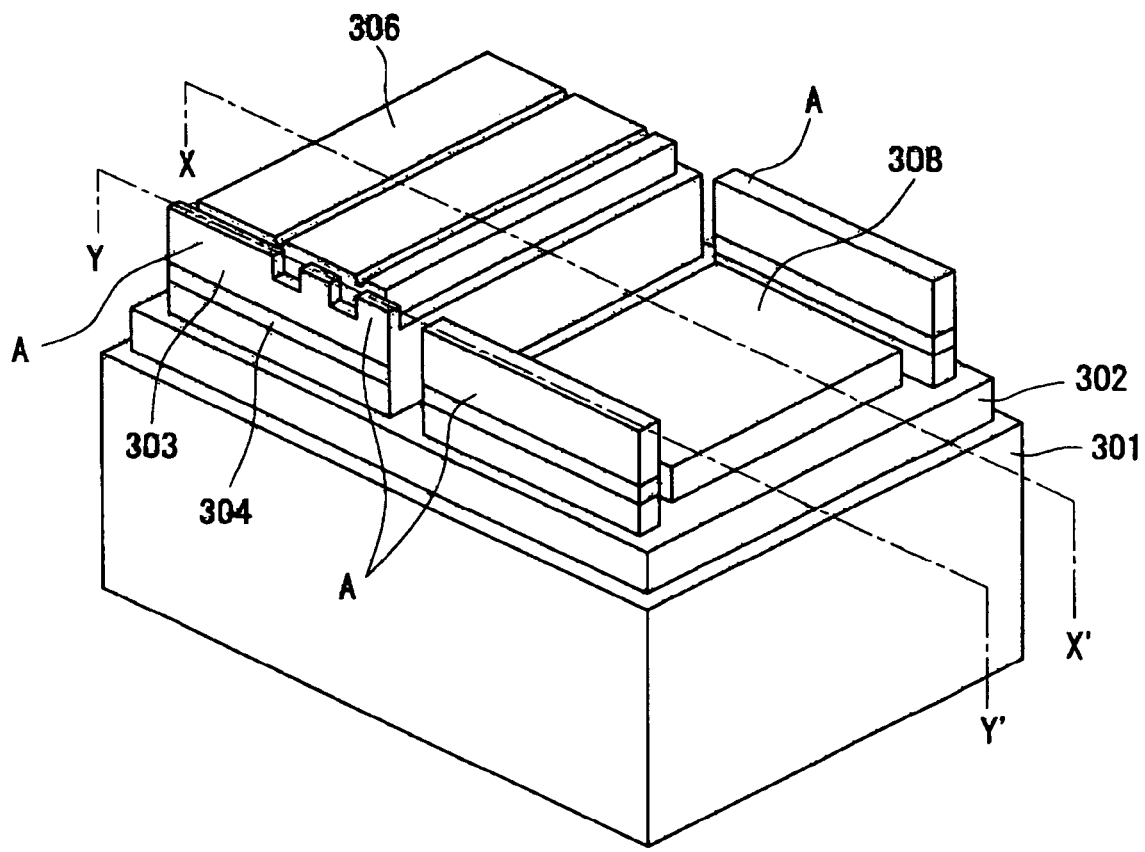
FIG. 3A is a schematic perspective view of a semiconductor laser device according to a third embodiment of the present invention.
Figure 3B:
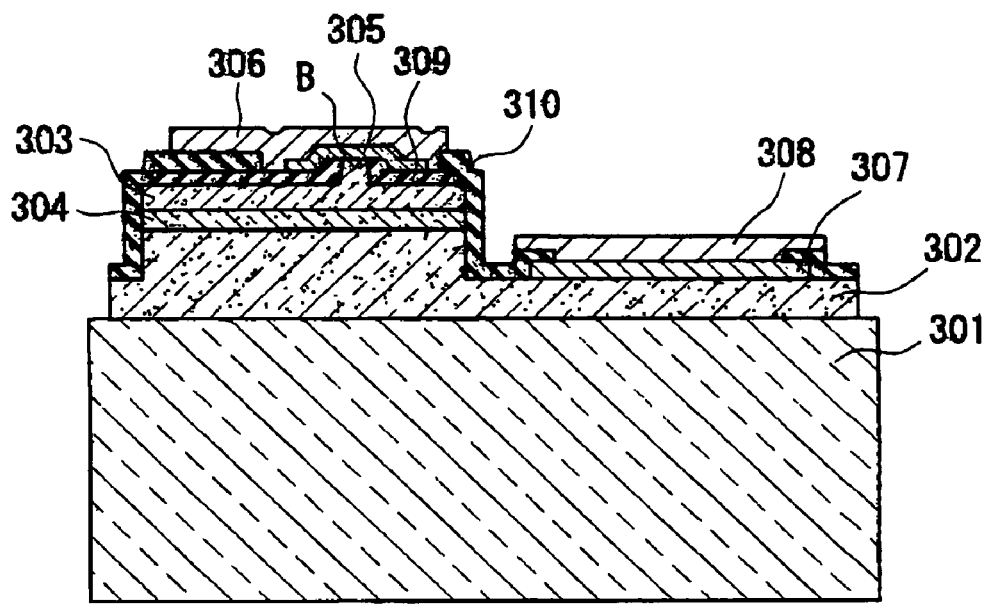
FIG. 3B is a sectional view taken along lines XX' in FIG. 3A.
Figure 3C:
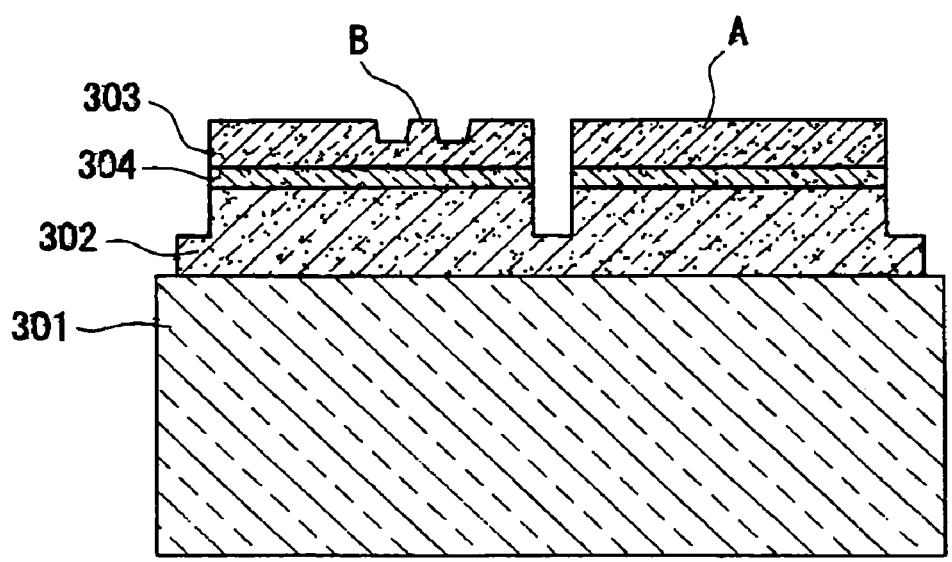
FIG. 3C is a sectional view taken along lines YY' in FIG. 3A.

This embodiment is an example where both the p-side protruding portion and the n-side protruding portion are formed. FIGS. 3A through 3C are schematic diagrams showing a form of the semiconductor laser device obtained according to the method of the present invention. FIG. 3B is a sectional view taken along lines XX' of FIG. 3A, and FIG. 3B is a sectional view taken along lines YY' of FIG. 3A. The protruding portions of p side and n side are provided as shown in FIG. 3A. By providing the protruding portions of p side and n side, it is made possible to suppress the component of the end face protective film from depositing on the p electrode and the n electrode.

(P-Side Protruding Portion and N-Side Protruding Portion)

In order to suppress the component of the end face protective film from depositing on the electrodes, it is preferable to provide the protruding portions on both p side and n side as in this embodiment. If the protruding portion is to be provided on only one side, it is preferable to provide the n-side protruding portion. This is because, in case the n electrode and the p electrode are formed on the same surface, formation of the mesa creates a wide space above the n electrode allowing the component of the end face protective film to enter the space above the n electrode.

In case both the p-side protruding portion and the n-side protruding portion are provided, it is preferable that the total thickness of the substrate, the semiconductor layer and the protruding portion are the same between n-side and p-side. Accordingly, the n-type and p-type protruding portions per se may not necessarily have the same thickness. For example, when the p-side protruding portion and the n-side protruding portion are at the same height as the ridge, the p-side protruding portion has a thickness comparable to that of the ridge while the n-side protruding portion has a thickness comparable to that of the mesa and ridge. Preferable height (thickness) can be selected for each portion. Undesirable spreading of the component of the end face protective film can be efficiently suppressed by providing the p-side protruding portion and the n-side protruding portion continuously thereby eliminating the clearance between the protruding portions.

FIG. 17A through FIG. 20B show examples where both the n-side protruding portion and the p-side protruding portion are formed. Representation in these figures is similar to that in FIGS. 5A through 16C. In FIG. 17A through FIG. 20C, the n-side protruding portion and the p-side protruding portion sometimes continue with each other, and are therefore not distinguished in the figures. These constitutions are the variations shown in FIG. 6A thorough FIG. 16B where only the n-side protruding portion is formed, combined with the examples shown in FIG. 5A where only the p-side protruding portion is formed. By providing the protruding portions of p side and n side, it is made possible to suppress the component of the end face protective film from depositing on the electrodes more effectively.

While the first through third embodiments provide principally the p-side and n-side protruding portion made of the same semiconductor as that of the mesa and formed similarly by etching, the protruding portion may also be formed by other process such as sputtering or vapor deposition. When the protruding portion is formed from an insulating material, there may exist a region where the p electrode and the n electrode overlap each other. For example, after forming the n electrode, the region required to flow current to the central portion of the surface of the n electrode (bonding region) may be masked and the protruding portion may be formed by depositing an insulating material or the like by sputtering on other area. In this case, the protruding portion is formed not only in the portion A shown in the figure but over a wider area. In this configuration, too, undesirable spreading of the component of the end face protective film can be suppressed. When an electrically conductive material or a semiconductor material is used, too, the protruding portion can be formed similarly by isolating it from the n electrode and the p electrode by means of an insulating material.

The present invention is not limited to the patterns illustrated, but provide similar effects with a pattern that combines these.

EXAMPLE 1

The semiconductor laser device made by using a nitride semiconductor will now be described below as an example. An example of laser element is shown in FIGS. 2A and 2B. The ridge B is formed on the nitride semiconductor comprising the n-type nitride semiconductor layer 202, the active layer 204 and the p-type nitride semiconductor layer 203 stacked on the substrate 201. As shown in FIG. 2b, a first insulating layer 209 is formed on the p-type nitride semiconductor layer extending from the side face of the ridge to both sides of the ridge, and the p-side ohmic electrode 205 that makes contact with the p-type semiconductor layer on the ridge is formed thereon. Similarly the n-side ohmic electrode 207 that makes contact with the n-type semiconductor layer is formed. A second insulating film 210 is formed between both ohmic electrodes. The second insulating film has an opening over both ohmic electrodes, while the p-side pad electrode 206 and the n-side pad electrode 208 are provided so as to make contact through the opening. The resonator surface formed by etching has the end face protective film formed thereon. The present invention is not limited to the structure described above, but can employ various layer structures, and can be embodied not only in the laser device structure of examples to be described later but also in various laser structures. The nitride semiconductor used in the invention may be GaN, AlN, InN or the like, mixed crystals formed from the former in the form of III-V group nitride semiconductor, or these materials including B, P, etc. The nitride semiconductor can be grown by any method known in the prior art such as MOVPE, MOCVD (metal organic chemical vapor phase epitaxy), HVPE (halide vapor phase epitaxy), MBE (molecular beam vapor phase epitaxy).

(Substrate)

A sapphire substrate having principal plane in C plane is used. However, the substrate is not limited to this, and various substrates may be used such as a sapphire substrate having principal plane in R plane or A plane, SiC substrate, Si substrate, spinel substrate or GaN substrate.

(Base Layer)

An undoped GaN layer is grown at a temperature of 1050° C. to a thickness of 2.5 µm, and a protective film is formed from $SiO_2$ to a thickness of 0.27 µm. The $SiO_2$ protective film has stripe-shaped opening (non-masking region) formed by etching. The protective film formed with the stripe having width of 1.8 µm and lying in a direction substantially perpendicular to the orientation flat surface, with the areas of the protective film and the opening being set in proportions of 6:14. Then an undoped GaN layer is grown to a thickness of 15 µm. The GaN layer formed over the opening grows laterally on the $SiO_2$ layer, so that the GaN eventually joins over $SiO_2$.

(Buffer Layer)

With the temperature set to 500° C., trimethyl gallium (TMG) and ammonia ($NH_3$) are used to grow the buffer layer made of Si-doped $Al_{0.02}Ga_{0.98}N$ to a thickness of 1 µm.

(N-Type Contact Layer)

Then the n-type contact layer made of Si-doped n-$Al_{0.02}Ga_{0.98}N$ is grown to a thickness of 3.5 µm at a temperature of 1050° C. using TMG, ammonia gas as the stock material and silane gas as impurity. The thickness of the n-type contact layer may be in a range from 1 to 30 µm.

(Crack Preventing Layer)

With the temperature set to 800° C., TMG, TMI (trimethyl indium) and ammonia are used to grow the crack preventing layer made of Si-doped n-$In_{0.05}Ga_{0.95}N$ to a thickness of 0.15 µm. The crack preventing layer may be omitted.

(N-Type Cladding Layer)

Then with the temperature set to 1050° C., TMA (trimethyl aluminum), TMG and ammonia are used to grow layer A made of undoped $Al_{0.05}Ga_{0.95}N$ and layer B made of Si-doped GaN, both to thickness of 50 Å. This process is repeated 110 times so as to form the n-type cladding layer of multiple layer structure (super lattice) with total thickness of 1.1 µm where layer A and layer B are stacked one on another alternately. A sufficient difference in refractive index for the cladding layer to function can be provided when the proportion of Al in the mixed crystal of undoped AlGaN is in a range from 0.02 to 0.3.

The n-type cladding layer may also comprise a single layer formed from $Al_{0.03}Ga_{0.97}N$ doped with Si with a concentration from $1 \times 10^{18}$ $cm^{-3}$ to $1 \times 10^{19}$ $cm^{-3}$, to a thickness of 2 µm.

(N-Type Optical Guide Layer)

Then at the same temperature and using TMG and ammonia as the stock material gases, the n-type optical guide layer made of undoped GaN is grown to a thickness of 0.15 µm. This layer may also be doped with an n-type impurity.

(Active Layer)

With the temperature set to 800° C., TMI (trimethyl indium), TMG and ammonia are used as the stock material and silane gas is used as the impurity gas to grow the barrier layer made of Si-doped n-$In_{0.02}Ga_{0.98}N$ to a thickness of 140 Å. The supply of silane gas is stopped and a well layer made of undoped $In_{0.1}Ga_{0.9}N$ is grown to a thickness of 70 Å. This operation is repeated twice, followed by the growth of barrier layer made of Si-doped n-$In_{0.02}Ga_{0.98}N$ to a thickness of 140 Å, thereby forming the active layer of multiple quantum well structure (MQW) to total thickness of 560 Å.

(P-Type Electron Confinement Layer)

At the same temperature, the p-type electron confinement layer made of Mg-doped $Al_{0.25}Ga_{0.75}N$ is grown in $N_2$ atmosphere to a thickness of 30 Å. Then the p-type electron confinement layer made of Mg-doped $Al_{0.25}Ga_{0.75}N$ is grown in $H_2$ atmosphere to a thickness of 70 Å.

(P-Type Optical Guide Layer)

Then with the temperature set to 1050° C., TMG and ammonia are used as the stock material gases to grow the p-type optical guide layer made of undoped GaN to a thickness of 0.15 µm. While the p-type optical guide layer is grown undoped, it may also be doped with Mg.

(P-Type Cladding Layer)

Then layer A made of undoped $Al_{0.08}Ga_{0.92}N$ is grown to a thickness of 80 Å, and layer B made of Mg-doped GaN is grown thereon to thickness of 80 Å. This process is repeated 28 times so as to form the p-type cladding layer of multiple layer structure (super lattice) with total thickness of 0.45 μm where layer A and layer B are stacked one on another alternately. In case the p-type cladding layer has such a super lattice structure as at least one of the component layers is nitride semiconductor layer that includes Al and both layers are nitride semiconductor layers that have different levels of band gap energy, crystallinity can be improved by doping one of the layers with higher concentration of the impurity in the so-called modified doping, although both layers may be doped similarly.

(P-Type Contact Layer)

Last, at a temperature of 1050° C., the p-type contact layer made of Mg-doped GaN is formed to a thickness of 150 Å on the p-type cladding layer. The p-type contact layer may have a composition of p-type $In_xAl_yGa_{1-x-y}N$ ($x \geq 0$, $y \geq 0$, $x+y \leq 1$), and it is preferably made of GaN doped with Mg which enables it to obtain best ohmic contact with the p electrode. After the reaction, the wafer is annealed at 700° C. in nitrogen atmosphere in the reaction vessel, so as to further decrease the resistivity of the p-type layers.

(Formation of First $SiO_2$ Mask)

The wafer having the layers up to the p-type contact layer formed thereon is taken out of the reaction vessel, and $SiO_2$ mask is formed so as to cover substantially the entire surface of the uppermost p-type contact layer. The $SiO_2$ mask is formed to a thickness of about 0.55 μm by using a CVD apparatus. A resist mask is formed to a thickness of about 2.7 μm over the entire surface of the $SiO_2$ mask. A positive resist is used to expose the region interposed between the positions where the resonator end surfaces are to be formed (etching areas), which is then developed to form an opening. In this cases the first $SiO_2$ mask to be exposed in the opening of the resist pattern. The opening of the resist pattern has width of about 25 μm. By forming the opening that is the etching region not only at the positions where the resonator end surfaces are to be formed, but also in the region where the n-side electrode is formed, which enables it to expose the n-type semiconductor layer at the same time by etching for the formation of the resonator surface. It is also made possible to form the n-side protruding portion without providing additional process by forming such an opening as the n-side protruding portion is formed in the region near the resonator surface as shown in FIG. 6A at the same time. Then $CF_4$ gas is used as etchant to dry etch the first $SiO_2$ mask that is exposed through the opening of the resist pattern until the surface of the p-type semiconductor layer is exposed. Then the resist is removed by using a releasing agent.

(Formation of Resonator Surface (Formation of Mesa), Formation of N-Side Protruding Portion and Exposure of N-Type Contact Layer)

Then the first $SiO_2$ mask formed as described above is used for dry etching of the nitride semiconductor layer by RIE (reaction ion etching). $Cl_2$ gas is used as the etching gas. Etching is carried out to such a depth as at least the end face of the active layer is exposed, preferably to such a depth as the end face of the n-type guide layer is exposed, until the n-type contact layer is exposed at the bottom. In case the mask is configured to have an opening also in the exposure surface of the n-type contact layer, etching can be carried out till the surface of the n-type contact layer is exposed. By etching in this way, the mesa is formed on the n-type contact layer having end face of the light emitting region including the active layer and side face substantially parallel to the ridge which is to be formed later. The end face of the light emitting layer substantially perpendicular to the ridge becomes the resonator surface for laser beam. The n-side protruding portion having substantially the same height as the mesa is formed in the end region of the n-type contact layer in the vicinity of the resonator surface. Then the first $SiO_2$ mask is removed by using hydrofluoric acid.

(Formation of Second $SiO_2$ Mask)

Then a mask is formed from Si oxide (mainly $SiO_2$) over substantially the entire surface of the uppermost p-type contact layer to a thickness of 0.55 μm by using a CVD apparatus, in order to form the stripe-shaped ridge. The entire wafer including the $SiO_2$ mask is covered with a resist to form a mask. A positive resist is used to expose the striped region corresponding to the ridge on the p-type contact layer and the region other than the striped region over the exposed surface of the n-type contact layer (etching areas), which is then developed. This causes the second $SiO_2$ mask to be exposed on the ridge and the region that extends from the ridge other than the striped region. Then $CF_4$ gas is used as etchant to dry etch the second $SiO_2$ mask in a region other than the striped resist pattern until the surface of the p-type semiconductor layer is exposed. Then the resist is removed by using a releasing agent.

(Formation of Ridge)

Then the second $SiO_2$ mask formed as described above is used for dry etching of the nitride semiconductor layer by RIE (reaction ion etching). $Cl_2$ gas is used as the etching gas. Etching is carried out to such a depth that does not reach the active layer over the p-type contact layer, and more preferably to a mid position of the p-type guide layer. Over the n-type contact layer, etching is carried out to a depth comparative to the ridge. This causes the stripe-shaped ridge about 1.8 μm in width to be formed on the p-type semiconductor layer of the mesa, and a striped protrusion to be formed on the n-type contact layer located between the mesa and the resonator surface. At this time, the n-side protruding portion is etched by the amount corresponding to the ridge height (depth of etching) since it is not covered by the second $SiO_2$ mask. Therefore the n-side protruding portion having substantially the same height as the surface of the p-type semiconductor layer on both sides is formed. The n-side protruding portion having substantially the same height as the ridge is formed when the second $SiO_2$ mask is formed also on the n-side protruding portion.

(First Insulating Film)

With the first $SiO_2$ mask having been formed, a first insulating film made of $ZrO_2$ is formed on the p-type semiconductor layer. The first insulating film may be formed over the entire surface of the semiconductor layer to mask the n-side first electrode forming surface. An area without the insulating film may also be secured in order to make it easier to divide later.

After forming the first insulating film, the wafer is subjected to heat treatment at about 600° C. In case a material other than $SiO_2$ is used as the first insulating film, the insulating material can be stabilized by applying heat treatment at a temperature of 300° C. or higher, preferably 400° C. or higher and not higher than the decomposition temperature (about 1200° C.) of the nitride semiconductor. In case the device is processed by using the $SiO_2$ mask in a process after forming the first insulating film, the $SiO_2$ mask can be made less soluble to a mask dissolving material used in removing the $SiO_2$ mask later. The heat treatment process for the first insulating film may be omitted depending on the material used to form the first insulating film and the process, or carried out in a process different from that of this example such as is conducted simultaneously with the heat treatment of the ohmic electrode. After the heat treatment, the $SiO_2$ mask formed on the ridge stripe is removed by immersing in a buffered liquid (hydrofluoric acid), thereby removing $ZrO_2$ from the surface of the p-type contact layer (and the n-type contact layer) along with $SiO_2$ by lift-off process. Thus the p-type semiconductor layer on top of the ridge is exposed, so that the ridge is covered on the side face thereof by the first insulating film made of $ZrO_2$.

(Ohmic Electrode)

Then the p-side ohmic electrode is formed by sputtering on the ridge surface located on the p-type contact layer and the first insulating film. The first electrode of p-side has a constitution of Ni/Au/Pt (100 Å/1500 Å/1500 Å). The first electrode of p-side may also have a constitution of Ni/Au (100 Å/1500 Å). The n-side ohmic electrode is formed also on the n-type contact layer. The n-side ohmic electrode has a constitution of Ti/Al (200 Å/8000 Å), and is formed in a stripe parallel and having similar length to the ridge. After forming these electrodes, heat treatment is conducted at 600° C. in oxygen/nitrogen mixed gas atmosphere. The heat treatment is applied for the purpose of improving the ohmic contact with the semiconductor layer, and may be omitted depending on the material used to make the electrode.

The p-side ohmic electrode provided on the p-type nitride semiconductor layer is preferably made of a material that has high ohmic contact and high bonding property with the p-type nitride semiconductor layer, such as Ni, Co, Fe, Cr, Al, Cu, Au, W, Mo, Ta, Ag, Pt, Pd, Rh, Ir, Ru, Os, or oxide or nitride of such element, or ITO, which can be used in a single layer, in alloy or in multiple-layer film. Preferably, at least one element selected from among Ni, Co, Fe, Cu, Au and Al, or oxide or nitride thereof is used. The n-side ohmic electrode provided on the n-type nitride semiconductor layer is made of a material that has high ohmic contact and high bonding property with the n-type nitride semiconductor layer, such as Ni, Co, Fe, Ti, Cu, Au, W, Zr, Mo, Ta, Al, Ag, Pt, Pd, Rh, Ir, Ru, Os or the like, which can be used in a single layer, in alloy or in multiple-layer film. Preferably, a multiple layer structure consisting of Ti and Al stacked successively is employed. Total thickness of the ohmic electrode is preferably in a range approximately from 100 to 30000 Å, more preferably from 3000 to 15000 Å, and most preferably from 5000 to 10000 Å. When the thickness is in this range, the electrode having low contact resistance can be formed.

(Second Insulating Film)

Then a resist film that covers the entire surface of the p-side ohmic electrode over the ridge and part of the n-side ohmic electrode is formed. Then the second insulating film made of $SiO_2$ is formed over substantially the entire surface and is lifted off so that the second insulating film where the entire surface of the p-side ohmic electrode and part of the n-side ohmic electrode are exposed. The second insulating film and the p-side ohmic electrode are separated from each other, with the first insulating film exposed therebetween. The second insulating film may be left blank in the stripe-shaped region about 10 μm in width around the dividing position without forming the first and second insulating films and the electrode in this region, for the convenience of the dividing operation to be done later.

The second insulating film is provided so as to cover the entire surface except for the regions above the p-side and p-side ohmic electrode. Preferable material is an oxide that includes at least one element selected from among a group consisting of Si, Ti, V, Zr, Nb, Hf, Ta and Al, or at least one kind selected from among SiN, BN, SiC, AlN and AlGaN. Among these, single layer film or multiple layer film made of $SiO_2$, $Al_2O_3$, $ZrO_2$, or $TiO_2$ is particularly preferable.

The second insulating film may also be formed so as to continue with the reflecting surface side (monitor side) and used as a mirror. In this case, it is preferably formed in multiple layer structure in consideration of the difference in refractive index from the resonator surface on the light extracting side.

(Pad Electrode)

Then the p-side pad electrode is formed to cover the p-side ohmic electrode, preferably to cover the second insulating film as well. The p-side pad electrode is formed in the constitution of Pt/Ti/Pt/Au (1000 Å/50 Å/1000 Å/6000 Å) stacked in this order. The n-side pad electrode has a constitution of Ni/Ti/Au (1000 Å/1000 Å/8000 Å) stacked in this order from the bottom. The pad electrode makes contact with the p-side ohmic electrode and the n-side ohmic electrode via the second insulating film.

The p-side pad electrode may be made of a material such as Ni, Co, Fe, Ti, Cu, Au, W, Zr, Mo, Ta, Ag, Pt, Pd, Rh, Ir, Ru, Os, or oxide or nitride of such element, which can be used in a single layer, in alloy or in multiple-layer film. The uppermost layer is used in connection with wire or the like and is therefore preferably made of Au. In order to prevent Au from diffusing, it is preferable to provide a base layer made of a material having relatively high melting point that can function as a diffusion preventing layer. The n-side pad electrode may be made of a material such as Ni, Co, Fe, Ti, Cu, Au, W, Zr, Mo, Ta, Al, Ag, Pt, Pd, Rh, Ir, Ru, Os, which can be used in a single layer, in alloy or in multiple-layer film. Preferably, the material is used in multiple-layer film and the uppermost layer is used in connection with wire or the like and is therefore preferably made of Au. In order to prevent Au from diffusing, it is preferable to provide a base layer made of a material having relatively high melting point that can function as a diffusion preventing layer. The total thickness of the pad electrode is preferably in a range from 3000 to 20000 Å, and more preferably from 7000 to 13000 Å. Instead of providing the ohmic electrode and the pad electrode in separate processes as described above, the n-side electrode that serves for both functions may be provided.

(Substrate Exposure Process)

After forming the pad electrode as described above, the resist film is formed except for the exposed surface of the n-type contact layer. Then an $SiO_2$ protective film is formed over the entire surface of the wafer, and a resist film is formed on the $SiO_2$ protective film. The resist film is formed so that the resonator surfaces on the light extracting side and the reflector side are exposed.

With the resist, $SiO_2$ and resist being formed one on another in this order, this film is used to in etching to expose the substrate. Since the exposed portion of $SiO_2$ is etched, the $SiO_2$ protective film is removed from the front surfaces of the resonator on the light extracting side and the reflector side, so that the resist film is exposed. Distance of protrusion from the resonator surfaces on the light extracting side and the reflector side is preferably in a range from 2 to 3 μm. On the reflector side, distance of protrusion from the resonator surface may be in a range from 5 to 8 µm. Then the multiple layer film consisting of the resist, the SiO$_2$ protective film and the resist is removed, thereby forming the protective film on the side face of the semiconductor that is parallel to the ridge.

(Formation of Mirror on Light Extracting Side and Reflector Side)

After forming the resonator surface on the light extracting side and the reflector side as described above, a resist film is formed so that the end faces including the resonator surfaces are exposed. Then the substrate is polished to make the thickness to about 100 µm, and a scribing line is drawn on the back surface of the substrate opposite to the exposed surface of the substrate, so as to break the substrate along the line perpendicular to the ridge stripe into thereby dividing into bars. The end face protective film (mirror) is formed on the resonator surface on the light extracting side. As the mirror, a dielectric protective film made of Nb$_2$O$_5$ (400 Å) is formed. Al$_2$O$_3$ may also be used as the mirror on the light extracting side. Then a mirror is formed also on the resonator surface on the reflector side. The mirror is formed from dielectric protective film consisting of ZrO$_2$ (440 Å) and 6 pairs of (SiO$_2$ (670 Å)/ZrO$_2$ (440 Å). Alternatively, a dielectric protective film consisting of ZrO$_2$ and 2 pairs of (SiO$_2$/ZrO$_2$) or a dielectric protective film consisting of ZrO$_2$ and 2 pairs of (SiO$_2$/TiO$_2$) may also be used.

The end face protective film provided on the resonator surface may be made of an electrically conductive material, an insulating material or a semiconductor material, depending on the purpose. Specifically, electrically conductive material such as Si, Mg, Al, Hf, Nb, Zr, Sc, Ta, Ga, Zn, Y, B or Ti, insulating or electrically conductive compound of these elements such as oxide, nitride fluoride or the like may be used. These materials may be used individually, in a combination in the form of a compound or in a multiple-layer film. Preferable material is one that is based on Si, Mg, Al, Hf, Zr, Y or Ga. As a semiconductor material, AlN, AlGaN, BN or the like may be used.

Then the mask is removed so as to obtain a wafer where the substrate is exposed. Last, the wafer is divided along a ling parallel to the ridge stripe thereby to obtain the semiconductor laser devices of the present invention. The semiconductor laser device of the present invention obtained as described above has the ridge formed with substantially uniform width over the entire length of the resonator, and is capable of oscillating continuously with threshold current density of 2.0 kA/cm$^2$ and high output power of 60 mW to emit light of 405 nm at the room temperature. In addition, since almost no component of the end face protective film is deposited on the n electrode, wire is less likely to come off during wire bonding, thus providing the semiconductor laser device of high reliability.

EXAMPLE 2

In Example 2, the mesa and the p-side protruding portion are formed in such a configuration as shown in FIG. 1A. The n electrode can be formed on the surface of the substrate opposite to that of the p electrode since an electrically conductive substrate, for example GaN, is used. When the second protective film and the p electrode are formed also on the p-side protruding portion that is provided on both sides of the ridge, the protruding portion can have a height difference corresponding to one half of the height of the ridge with respect to the central region of the p electrode. Other processes are carried out substantially similarly to Example 1, so as to obtain the semiconductor laser device of the present invention. The semiconductor laser device thus obtained has the cleavage surface lying in M plane of the gallium nitride and the resonator surface of satisfactory flatness. Almost no component of the end face protective film is deposited on the p electrode, and wire is less likely to come off. The semiconductor laser device can also be manufactured with high yield, and is capable of oscillating continuously with threshold current density of 2.0 kA/cm$^2$ and high output power of 60 mW to emit light of 405 nm in wavelength at the room temperature.

EXAMPLE 3

In Example 3, the mesa, the p-side protruding portion and the n-side protruding portion are formed in such a configuration as shown in FIG. 3A. In this case, the n-side and p-side protruding portion of substantially the same height can be formed by using the second SiO$_2$ mask having the pattern shown in FIG. 17A when forming the ridge. When the second protective film and the p electrode are formed also on the p-side protruding portion, the protruding portion can have a height difference corresponding to the height of the ridge with respect to the central region of the p electrode. Other processes are carried out substantially similarly to Example 1, so as to obtain the semiconductor laser device of the present invention. The semiconductor laser device thus obtained has almost no component of the end face protective film deposited on the n electrode and the p electrode, and wire is less likely to come off. The semiconductor laser device can also be manufactured with high yield, and is capable of oscillating continuously with threshold current density of 2.0 kA/cm$^2$ and high output power of 60 mW to emit light of 405 nm in wavelength at the room temperature.

EXAMPLE 4

In Example 4, the mesa and the n-side protruding portion are formed in such a configuration as shown in FIG. 4. The second SiO$_2$ mask having the pattern shown in FIG. 11C is used when forming the ridge. In Example 4, the processes are carried out substantially similarly to Example, except for forming the resonator surface by cleaving instead of etching, so as to obtain the semiconductor laser device of the present invention. The semiconductor laser device thus obtained has the cleavage surface in M plane of the gallium nitride, and has the resonator surface of satisfactory flatness. Also almost no component of the end face protective film deposited is on the n electrode, and wire is less likely to come off. The semiconductor laser device can also be manufactured with high yield, and is capable of oscillating continuously with threshold current density of 2.0 kA/cm$^2$ and high output power of 80 mW to emit light of 405 nm in wavelength at the room temperature.

EXAMPLE 5

Figure 14D:
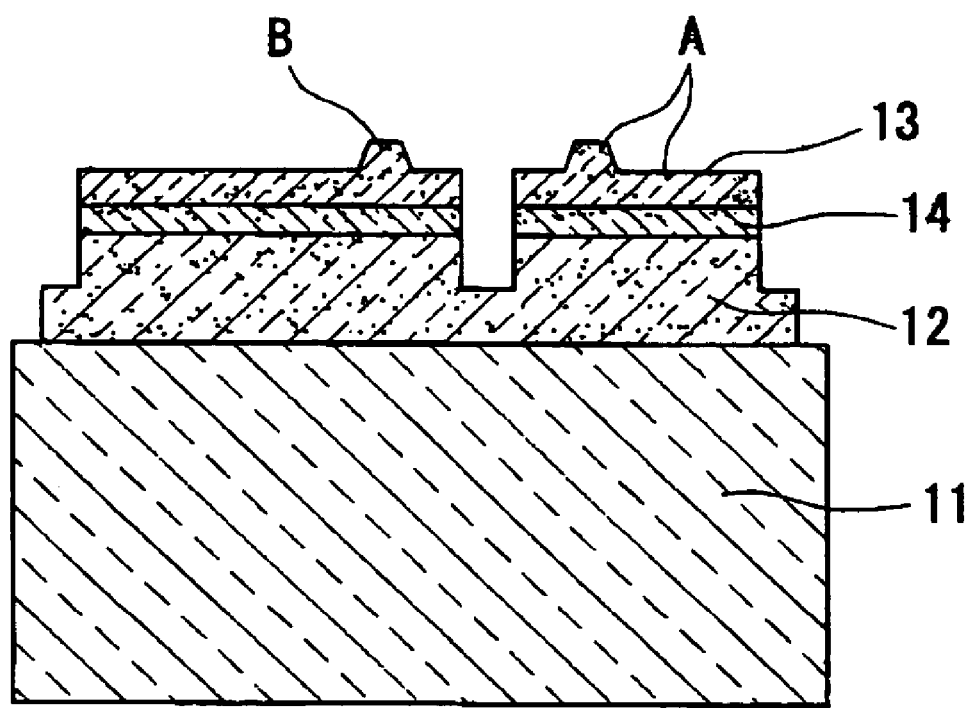
FIG. 14D is a sectional view taken along lines ZZ' in FIG. 14A, B, C.

In Example 5, the pattern shown in FIG. 14B is used. In this case, the mesa including the ridge is set longer than the target resonator surface. That is, the mesa and the ridge are formed beyond the chip dividing line and the wafer is cleaved in the region that includes the ridge, so that a part of the mesa forms the n-side protruding portion. The mesa and the n-side protruding portion that are formed integrally on the wafer are separated by cleaving so as to form the two members simultaneously by forming the mesas in a staggering arrangement. Section along line ZZ' of the semiconductor laser device obtained in this way is shown in FIG. 14D. While the sectional view shows the ridge formed also on the n-side protruding portion, the ridge located on the n-side protruding portion does not have the function of waveguide and functions simply as the protruding portion. In Example 5, the sapphire substrate may be removed before laser bars. In this case, the n-type semiconductor layer may be similar to that of Example 1, but is preferably made thicker so that the n-type semiconductor layer having such a thickness that ensures sufficient mechanical strength after removing the sapphire substrate is formed below the n-type contact layer. It is particularly preferable to grow the n-type contact layer by a method that involves lateral growth to form a thick film, since it makes a semiconductor layer that has enough mechanical strength and less dislocation. The semiconductor laser device of the present invention obtained as described above has almost no component of the end face protective film deposited on the n electrode, wherein wire is less likely to come off. The semiconductor laser device can also be manufactured with high yield, and is capable of oscillating continuously with threshold current density of 2.0 kA/cm$^2$ and high output power of 100 mW to emit light of 405 nm in wavelength at the room temperature.

The present invention can be utilized in any devices that employ laser devices, such as CD player, MD player, video game players, DVD players, trunk lines and optical communications systems including telephone network and underwater communications cables, laser surgical knives, medical laser equipment, laser massagers, laser beam printer, display, measuring instruments, laser leveling instrument, laser ranging instrument, laser speed gun, laser thermometer and other optical sensing instruments, and electrical power transmission by laser.

What is claimed is:

1. A semiconductor laser device comprising:
   semiconductor layers including an n-type semiconductor layer, an active layer and a p-type semiconductor layer, said semiconductor layers having a stripe-shaped waveguide region formed therein;
   end face protective film formed on the end face of said semiconductor layers that are substantially perpendicular to said waveguide region; and
   a p electrode formed on said p-type semiconductor layer, said p electrode being formed at least above said waveguide;
   wherein a p-side protruding portion is formed in the vicinity of the end portion of said p electrode, and said p-side protruding portion is higher than the central region of said p electrode.

2. The semiconductor laser device according to claim 1, wherein said waveguide region is formed by providing a ridge of substantially stripe shape on said p-type semiconductor layer, and said p electrode is provided continuously from the top of said ridge to the side face of the ridge and the surfaces on both sides of the ridge, while said p-side protruding portion is higher than the p electrode provided on the surfaces on both sides of said ridge.

3. A semiconductor laser device comprising:
   semiconductor layers including an n-type semiconductor layer, an active layer and a p-type semiconductor layer, said semiconductor layers having a stripe-shaped waveguide region formed therein by forming a ridge on said p-type semiconductor layer;
   end face protective film formed on the end face of said semiconductor layers that are substantially perpendicular to said waveguide region; and
   a p electrode formed on said p-type semiconductor layer, said p electrode being formed at least above said waveguide,
   wherein a p-side protruding portion including said p-type semiconductor layer is formed in the vicinity of the end portion of said p electrode, and said p-side protruding portion has substantially the same height as said ridge.

4. A semiconductor laser device comprising:
   semiconductor layers including an n-type semiconductor layer, an active layer and a p-type semiconductor layer, said semiconductor layers having a stripe-shaped waveguide region formed therein by forming a ridge on said p-type semiconductor layer;
   end face protective film formed on the end face of said semiconductor layers that are substantially perpendicular to said waveguide region, and
   a p electrode formed on said p-type semiconductor layer, said p electrode being formed at least above said waveguide,
   wherein a p-side protruding portion including said p-type semiconductor layer is formed in the vicinity of the end face of said p-type semiconductor layer, and said p-side protruding portion has substantially the same height as said ridge or is higher than the central region of said p electrode.

* * * * *